United States Patent
Miyazaki et al.

(10) Patent No.: US 12,489,356 B2
(45) Date of Patent: Dec. 2, 2025

(54) POWER CONVERSION DEVICE WITH CURRENT-AUXILIARY CIRCUIT

(71) Applicant: KYOSAN ELECTRIC MFG. CO., LTD., Yokohama (JP)

(72) Inventors: Koichi Miyazaki, Yokohama (JP); Hiroshi Kunitama, Yokohama (JP)

(73) Assignee: KYOSAN ELECTRIC MFG. CO., LTD., Yokohama (JP)

( * ) Notice: Subject to any disclaimer, the term of this patent is extended or adjusted under 35 U.S.C. 154(b) by 132 days.

(21) Appl. No.: 18/280,894

(22) PCT Filed: Feb. 28, 2022

(86) PCT No.: PCT/JP2022/008211
§ 371 (c)(1),
(2) Date: Sep. 7, 2023

(87) PCT Pub. No.: WO2022/190925
PCT Pub. Date: Sep. 15, 2022

(65) Prior Publication Data
US 2024/0146174 A1    May 2, 2024

(30) Foreign Application Priority Data
Mar. 11, 2021   (JP) .................................. 2021-039387

(51) Int. Cl.
*H02M 7/537* (2006.01)
*H02M 1/00* (2007.01)
*H03F 3/217* (2006.01)

(52) U.S. Cl.
CPC ......... *H02M 1/0058* (2021.05); *H02M 7/537* (2013.01); *H03F 3/217* (2013.01)

(58) Field of Classification Search
CPC .. H02M 1/0043; H02M 1/0077; H02M 7/493; H02M 7/49; H03F 3/217; H03F 3/2173
See application file for complete search history.

(56) References Cited

U.S. PATENT DOCUMENTS

| | | | | | |
|---|---|---|---|---|---|
| 5,349,157 | A | * | 9/1994 | Blankenship | H02M 3/285 323/258 |
| 5,684,683 | A | * | 11/1997 | Divan | H02M 3/285 363/71 |

(Continued)

FOREIGN PATENT DOCUMENTS

| | | |
|---|---|---|
| CN | 111884607 A | 11/2020 |
| EP | 2 600 512 A2 | 6/2013 |

(Continued)

OTHER PUBLICATIONS

International Search Report dated May 10, 2022, issued in counterpart International Application No. PCT/JP2022/008211. (2 pages).

(Continued)

*Primary Examiner* — Sisay G Tiku
(74) *Attorney, Agent, or Firm* — WHDA, LLP

(57) ABSTRACT

A power conversion device according to the present invention comprises a plurality of class-D amplifiers disposed in parallel. An ON/OFF operation of a switching element of a lead leg and a delay leg of each class-D amplifier is carried out by a phase shift control, in which an auxiliary current is supplied to the class-D amplifier on the basis of a voltage difference between output terminals of an upper and lower class-D amplifiers. The auxiliary current supplements the electric current flowing between the drain and the source of the switching element. Generation of a displacement voltage dv/dt on the switching element, and a displacement current di/dt in modulation waves generated by the displacement voltage are prevented, thus preventing erroneous turn-on of the switching element in the OFF state of the other side of the leg.

10 Claims, 38 Drawing Sheets

(56) References Cited

U.S. PATENT DOCUMENTS

| | | | |
|---|---|---|---|
| 6,370,047 B2* | 4/2002 | Mallory | H02M 7/493 363/71 |
| 10,530,243 B2 | 1/2020 | Jimichi et al. | |
| 2015/0364984 A1* | 12/2015 | Miyauchi | H02M 7/5387 363/132 |
| 2017/0025963 A1 | 1/2017 | Otake et al. | |
| 2019/0341847 A1* | 11/2019 | Yuzurihara | H02M 1/096 |
| 2020/0304081 A1* | 9/2020 | Kiyono | H03F 3/2173 |
| 2023/0112281 A1* | 4/2023 | Yuzurihara | H03F 1/0211 330/251 |

FOREIGN PATENT DOCUMENTS

| | | |
|---|---|---|
| JP | 2016-1980 A | 1/2016 |
| JP | 2017-46536 A | 3/2017 |
| JP | 2018-182921 A | 11/2018 |
| JP | 6611954 B2 | 11/2019 |
| JP | 2020-167881 A | 10/2020 |
| JP | 2020-202644 A | 12/2020 |

OTHER PUBLICATIONS

Extended (supplementary) European Search Report dated Jan. 29, 2025, issued in counterpart EP Application No. 22766884.5.(9 pages).

Kang, J. et al., Design of phase-shifted parallel-input/series-output dual inductor-fed push-pull converter for high-power step-up applications, IECON'01: The 27th Annual Conference of the IEEE Industrial Electronics Society, vol. 2, dated Nov. 29, 2001, p. 1249-1254.(6 pages); Cited in Extended European Search Report dated Jan. 29, 2025.

* cited by examiner

POWER CONVERSION DEVICE WITH CURRENT-AUXILIARY CIRCUIT

TECHNICAL FIELD

The present invention relates to a power conversion device for adjusting an output voltage by performing phase shift control on a plurality of isolated convertors.

BACKGROUND ART

There is a known power conversion device using a plurality of isolated convertors, in which a plurality of submodules having class-D amplifiers are used as isolated converters and arranged in parallel between a DC power supply and an output part. The primary sides of the submodules are arranged in parallel with respect to the DC power supply while being connected in series with respect to the output part.

The power conversion device can handle large-current power by connecting the plurality of submodules in parallel on their primary sides and handle a high voltage by connecting the plurality of submodules in series on their secondary sides, thereby converting low-voltage DC power into high-voltage DC power (see Patent Literature 1).

FIG. 36 shows a circuit configuration example of a power conversion device 100 comprising a half bridge circuit. The power conversion device 100 includes two class-D amplifiers of an upper class-D amplifier 101a and a lower class-D amplifier 101b. The upper class-D amplifier 101a forms the half bridge with a leg 102a in which two switching elements, a switching element Q1a of the high side device and a switching element Q2a of the low side device, are connected in series and a midpoint capacitor 103a consisting of a series connection of two capacitors, capacitor C1a and capacitor C2a. The lower class-D amplifier 101b also forms the half bridge with a leg 102b in which two switching elements, a switching element Q1b of the high side device and a switching element Q2b of the low side device, are connected in series and a midpoint capacitor 103b consisting of a series connection of two capacitors, capacitor C1b and capacitor C2b.

The direct current (DC) terminals on the primary sides of the upper class-D amplifier 101a and the lower class-D amplifier 101b are connected in parallel to a DC power supply, and the DC terminals on the second sides are connected in series to the DC power supply. The DC terminal on the secondary side of the upper class-D amplifier 101a is connected to an output transformer 104a via a leakage inductance, and the DC terminal on the secondary side of the lower class-D amplifier 101b is connected to an output transformer 104b via a leakage inductance. The output transformer 104a and the output transformer 104b are connected in series such that one end of this series connection is used as an output terminal and the other end is used as a grounding terminal. In this way, the leg 102a of the upper class-D amplifier 101a and the leg 102b of the lower class-D amplifier 101b form the full bridge circuit.

In regard to a power conversion device using class-D amplifiers, phase shift control is known as a method for controlling a power value. A power conversion device to be subjected to the phase shift control includes a full bridge circuit that is formed by using two legs, each having two switching elements connected in series. In voltage control using a phase shift method, a gate phase difference $\theta$ is provided between these two legs in a gate signal that drives a switching element, and the output voltage is controlled by changing the gate phase difference $\theta$ to shift the phase.

In the phase shift control, a short delay time is provided between a turn-off of one of the switching elements and a turn-on of the other of the switching elements in each leg, and soft-switching is performed during this delay time. Energy accumulated in a leakage inductance of a transformer is released during the delay time, and thereby a current flows via a parasitic diode of the switching element to be turned on. Due to this current, a voltage related to the switching element becomes almost 0 V, so that the soft-switching of zero voltage switching (ZVS) can be implemented by turning on the switching element during the delay time.

In the power conversion device 100, for example, the phase shift control is performed between the two legs with the leg 102a of the upper class-D amplifier 101a as leading leg and the leg 102b of the lower class-D amplifier 101b as lagging leg. Under a light-load condition, the phase shift control is performed with a small gate phase difference $\theta$.

In the phase shift control performed on the class-D amplifier having the bridge structure, the soft-switching of the lagging leg is implemented by functions of the leakage inductance of the transformer and a parasitic capacitance of the switching element. In order to implement the soft-switching, the energy accumulated in the leakage inductance of the transformer needs to be large enough to charge or discharge the parasitic capacitance of the switching element. The energy accumulated in the leakage inductance is proportional to a load current. Since the gate phase difference $\theta$ is small and the load current is therefore small under the light-load condition, the energy accumulated in the leakage inductance is small. Thus, when the gate phase difference $\theta$ is small, a current generated by accumulated energy is not enough to complete the charging or discharging of the parasitic capacitance of the switching element, and thereby the implementation of the soft-switching by ZVS is difficult.

As a method for implementing the soft-switching of the lagging leg under the light-load condition, there are known methods, such as a method for increasing a leakage inductance by impairing the coupling with the transformer, and a method for providing an exciting inductance. However, a leakage flux in a high frequency causes an increase in losses in a winding, which is a factor in reducing efficiency.

CITATION LIST

Patent Literature

[Patent Literature 1] Japanese Patent Publication No.

SUMMARY OF THE INVENTION

Problems to be Solved by the Invention

In the phase shift control of the class-D amplifier having the bridge structure, there is a known problem that under the light-load condition that the gate phase difference $\theta$ is small, the small energy accumulation in the leakage inductance hinders the implementation of the soft-switching of the lagging leg.

In addition to the above problem of the soft-switching, in the case where the gate phase difference $\theta$ is small, the phase shift control of the class-D amplifier having the bridge structure has another problem that a semiconductor device of the switching element is erroneously turned on.

FIG. 37 illustrates erroneous gate turn-on. FIGS. 37(a) and 37(b) show states where a semiconductor device (switching element) on a high side turns from off to on. When the semiconductor device on the high side turns from off to on with an output capacitance being charged/discharged incompletely, hard-switching occurs in which a voltage change ΔV/Δt=dv/dt increases in a drain-to-source voltage Vds. In this case, a displacement voltage dv/dt causes the generation of a displacement current di/dt. In a leg constituting a class-D amplifier, the displacement current di/dt produced in the semiconductor device on the high side is charged into a gate-to-source capacitance Cgs between a gate and a source of a semiconductor device on a low side via a gate-to-driver capacitance Cgd between the gate and a driver. The charge of the gate-to-source capacitance Cgs increases a gate-to-source voltage Vgs, resulting in erroneous turn-on of the gate.

The gate-to-source voltage Vgs is expressed by the following Formula (1).

$$Vgs = Rg \cdot Cgs \cdot dVds/dt \cdot (1 - \exp(-t/(Rg \cdot (Cgd + Cgs)))) \quad (1)$$

In Formula (1), Rg is a gate resistance, Cgd is the gate-to-driver capacitance, Cgs is the gate-to-source capacitance, and dVds/dt is a voltage change occurring in an upper switching.

Formula (1) shows that a peak of the gate-to-source voltage Vgs due to the erroneous turn-on of the gate is under a controlling effect of three parameters, i.e., the gate resistance Rg, the gate-to-driver capacitance Cgd and the voltage change dVds/dt between the drain and the source. In particular, an RF semiconductor device used for industrial power supply and applicable to a high-frequency switching at 1 MHz or more, such as RF power VD-SiMOS, Sic-MOS or GaN-HEMT, and above all, a VD-SiMOS has a large gate-to-driver capacitance Cgd, so that the gate-source voltage Vgs becomes large and thus an erroneous turn-on of the gate is prone to occur. FIG. 37(b) shows changes in the drain-to-source voltage Vds and the gate-to-source voltage Vgs occurring when the semiconductor device of the switching element turns from off to on. The gate-to-source voltage Vgs rises during a change ΔV/Δt in the drain-to-source voltage Vds.

FIG. 37(c) shows a state where the semiconductor device (switching element) on the low side turns from off to on. The semiconductor device on the low side also turns from off to on in the hard-switching state when the charge/discharge of the drain-to-source voltage Vds in the output capacitance is incomplete, so that the change ΔV/Δt=dv/dt in the drain-to-source voltage Vds becomes large, resulting in the generation of the displacement current di/dt.

The displacement current di/dt generated in the semiconductor device on the low side charges the gate-to-source capacitance Cgs of the semiconductor device on the high side, and thereby the gate-to-source voltage Vgs increases to cause the erroneous turn-on of the gate.

FIG. 38 shows waveforms of the power conversion device 100 created by the circuit configurations shown in FIG. 37. FIGS. 38(a) and 38(b) show a gate signal gQ1a, a voltage VQ1a and a current IQ1a of a switching element Q1a on the high side, and FIGS. 38(c) and 38(d) show a gate signal gQ2a, a voltage VQ2a and a current IQ2a of a switching element Q2a on the low side. These figures respectively show waveforms of an upper class-D amplifier 101a.

FIGS. 38(e) and 38(f) show a gate signal gQ1b, a voltage VQ1b and a current IQ1b of a switching element Q1b on the high side, and FIGS. 38(g) and 38(h) show a gate signal gQ2b, a voltage VQ2b and a current IQ2b of a switching element Q2b on the low side. These figures respectively show waveforms of a lower class-D amplifier 101b. FIG. 38(i) shows an output voltage Vout and an output current Iout from the power conversion device 100. Furthermore, a broken line in FIG. 38 denotes a current.

According to the waveforms of the upper class-D amplifier 101a (FIGS. 38(a) to 38(d)), a change in the current IQ2a occurring when the switching element Q2a on the low side turns from off to on (number 1 in the figure) causes incorrect generation of a gate signal of the switching element Q1a on the high side (number 2 in the figure) that leads to erroneous turn-on. The erroneous turn-on of the switching element Q1a generates a short-circuit current in the current IQ1a (number 3 in the figure) that becomes a factor for a malfunction of a power amplifier.

Furthermore, a change in the current IQ1a occurring when the switching element Q1a on the high side turns from off to on (number 4 in the figure) causes incorrect generation of a gate signal of the switching element Q2a on the low side (number 5 in the figure) that leads to erroneous turn-on. The erroneous turn-on of the switching element Q2a generates a short-circuit current in the current IQ2a (number 6 in the figure) that becomes a factor for the malfunction of the power amplifier.

According to the waveforms of the lower class-D amplifier 101b (FIGS. 38(e) to 38(h)), a change in the current IQ2b occurring when the switching element Q2b on the low side turns from off to on (number 1 in the figure) causes incorrect generation of a gate signal of the switching element Q1b on the high side (number 2 in the figure) that leads to erroneous turn-on. The erroneous turn-on of the switching element Q1b generates a short-circuit current in the current IQ1b (number 3 in the figure) that becomes a factor for a malfunction of a power amplifier.

Furthermore, a change in the current IQ1b occurring when the switching element Q1b on the high side turns from off to on (number 4 in the figure) causes incorrect generation of a gate signal of the switching element Q2b on the low side (number 5 in the figure) that leads to erroneous turn-on. The erroneous turn-on of the switching element Q2b generates a short-circuit current in the current IQ2b (number 6 in the figure) that becomes a factor for the malfunction of the power amplifier.

In here, the words "upper" and "lower" used for the class-D amplifiers mean class-D amplifiers of a module formed by two class-D amplifiers, and more specifically, the word "lower" is used for a class-D amplifier having an output transformer whose end on the secondary side is grounded as a lower class-D amplifiers, and the word "upper" is used for a class-D amplifier having an output transformer whose secondary side is connected to an output terminal of the power conversion device as an upper class-D amplifier. Furthermore, the words "high side" and "low side" used for the switching elements mean switching elements that form a bridge circuit that forms either one of the upper class-D amplifier and the lower class-D amplifier, and more specifically, the word "high side" is used for a switching element to be connected to a high voltage side as a high-side switching element, and the word "low side" is used for a switching element to be connected to a low voltage side as a low-side switching element. Now, a description will be made by using the terms "upper class-D amplifier", "lower class-D amplifier", "high-side switching element" and "low-side switching element".

The power conversion device 100 shown in FIG. 36 represents circuitry in which each of the upper and lower class-D amplifiers has a half bridge formed of two switching elements, namely high-side and low-side switching elements. However, even if each class-D amplifier is configured as a circuit having a full bridge formed of four switching elements, namely two high-side switching elements and two low-side switching elements, there arises the same problem of the erroneous turn-on of the gate.

As described above, the class-D amplifier of the power conversion device 100 with the conventional configuration has the problem that the phase shift control cannot be performed because of the increase in losses of quality due to the erroneous turn-on of the gate of the semiconductor device constituting the switching element.

The smaller a gate phase difference $\theta$ in the phase shift control, more likely charging/discharging of the output capacitance (drain-to-source capacitance) Cds of the semiconductor device is not completed within a dead time. The gate phase difference $\theta$ has substantially short time width in a high-frequency band of MHz band because the substantial time width of the gate phase difference $\theta$ is dependent on a frequency for controlling the class-D amplifier, and losses in the semiconductor device increase due to the erroneous turn-on of the gate, thereby making the phase shift control more difficult.

An object of the present invention is to solve the above problem and to reduce the losses in the semiconductor device by preventing the occurrence of the erroneous turn-on of the gate of the semiconductor device constituting the class-D amplifier in the power conversion device to be subjected to the phase shift control. Another object of the invention is to enable the phase shift control by reducing the losses in the semiconductor device in the power conversion device to be subjected to the phase shift control even when the gate phase difference $\theta$ is small.

Means for Solving the Problem

The power conversion device of the present invention is provided with a plurality of class-D amplifiers arranged in parallel and is subjected to phase shift control to shift phases of ON/OFF operations of switching elements of a leading leg and a lagging leg in each class-D amplifier by the gate phase difference $\theta$. In this phase shift control, an auxiliary current is fed to an upper class-D amplifier and a lower class-D amplifier based on a voltage difference between an output terminal of the upper class-D amplifier and an output terminal of the lower class-D amplifier. The auxiliary current supplements a current flowing between a drain and a source of a switching element, so as to prevent the generation of a displacement voltage dv/dt when the switching element turns from off to on and the generation of a displacement current di/dt associated with the generation of the voltage, thereby preventing the other switching element of the leg in an off state from being turned on erroneously due to the displacement current di/dt.

(Basic Configuration)

A basic configuration of the power conversion device of the present invention includes an upper class-D amplifier and a lower class-D amplifier, a control circuit for controlling driving of switching elements included in the upper class-D amplifier and the lower class-D amplifier, and a current-auxiliary circuit for supplying auxiliary currents to the upper class-D amplifier and the lower class-D amplifier.

An input terminal of the upper class-D amplifier and an input terminal of the lower class-D amplifier are in parallel connection with a DC power supply, and an output terminal of the upper class-D amplifier and an output terminal of the lower class-D amplifier are in series connection via corresponding output transformers.

With the above connection configuration, the power conversion device can connect a plurality of class-D amplifiers in parallel on a primary side to deal with large-current power, while connecting the plurality of class-D amplifier in series on a secondary side to deal with a high voltage, thereby converting low-voltage DC power into high-voltage DC power.

(Class-D Amplifier and Control Circuit)

The upper class-D amplifier and the lower class-D amplifier consist of bridge circuits of legs, each of which consists of two series-connected switching elements. The bridge circuit may be a half-bridge circuit consisting of one leg and a capacitor voltage divider consisting of two series-connected capacitors, or a full-bridge circuit including two legs consisting of switching elements.

The control circuit is configured to control a gate phase difference $\theta$ between gate signals for driving switching elements that constitute a class-D amplifier to perform phase shift control. The phase shift control is for controlling an output voltage in such a way that a gate phase difference $\theta$ is provided between the legs in the control of the gate signals so as to control the gate phase difference $\theta$ as an amount of phase shift. When the amount of phase shift is large, a high output voltage can be obtained, and when the amount of phase shift is small, a low output voltage is obtained.

In a case of constituting a class-D amplifier with a half-bridge circuit, either the leg of the upper class-D amplifier or the leg of the lower class-D amplifier is used as a leading leg, and the other leg is used as a lagging leg. The control circuit controls a gate phase difference $\theta$ between gates signals to be applied to switching elements of the leading leg and switching elements of the lagging leg as an amount of phase shift.

In a case of constituting a class-D amplifier with a full-bridge circuit, in each of the class-D amplifiers of the upper class-D amplifier and the lower class-D amplifier, one of two legs provided in each class-D amplifier is used as a leading leg, and the other leg is used as a lagging leg. The control circuit controls a gate phase difference $\theta$ between gates signals to be applied to switching elements of the leading leg and switching elements of the lagging leg as an amount of phase shift. In this way, the phase shift control is performed on each of the upper class-D amplifier and the lower class-D amplifier. The phase shift control is performed by using the same amount of phase shift for both class-D amplifiers.

(Current-Auxiliary Circuit)

A current-auxiliary circuit is connected between the output terminal of the upper class-D amplifier and the output terminal of the lower class-D amplifier to supply a current based on a voltage difference between the output terminals of both class-D amplifiers as an auxiliary current to the upper class-D amplifier and the lower class-D amplifier. The auxiliary current is for charging or discharging a parasitic capacitance of the switching element of the class-D amplifier to thereby apply the current to the switching element.

A leakage inductance of the output transformer discharges energy accumulated during an ON period of a switching element, so as to charge or discharge the parasitic capacitance of the switching element during an OFF period. When the amount of phase shift is small and a current produced by the accumulated energy in the leakage inductance is low, a time for supplying the current is short and thus the charge or discharge of the parasitic capacitance cannot be completed.

The auxiliary current is used to supplement the charging or discharging of the parasitic capacitance of the switching element to thereby pass a current between the drain and the source of the switching element. The switching element turns from off to on while the current is flowing between the drain and the source of the switching element, so that a value of a displacement voltage dv/dt generated between the drain and the source is limited. A displacement current di/dt generated in one of switching elements of a leg flows into the other switching element of the leg, which is in an OFF state, and then charges a gate-to-source capacitance Cgs via a drain-to-gate capacitance Cdg to increase a gate-to-source voltage Vgs. The limitation on the displacement voltage dv/dt causes a limitation on the displacement current di/dt, so that the increase in the gate-to-source voltage Vgs is prevented, and the prevention of increase in the gate-to-source voltage Vgs can avoid erroneous turn-on of the switching element.

In a case where the class-D amplifier consists of a full-bridge circuit, the amount of phase shift of the upper class-D amplifier and the amount of phase shift of the lower class-D amplifier are equalized, thereby allowing the current-auxiliary circuit to prevent a lag of timing that the auxiliary current flows into the class-D amplifier.

The current-auxiliary circuit has a configuration to generate an auxiliary current to charge or discharge the parasitic capacitance of the switching element and a configuration to perform termination process on the supplied current. Thus, the auxiliary current that charged or discharged the parasitic capacitance of the switching element is subjected to the termination process. As a circuit configuration for performing the termination process on the auxiliary current, a regeneration circuit for regenerating an auxiliary current to a power supply or a resistance circuit for releasing heat by resistance of the auxiliary current can be employed.

(Regeneration Circuit)

In a case where a current-auxiliary circuit consists of a regeneration circuit, an auxiliary current taken in the regeneration circuit is regenerated into a power source as regenerative power. The regeneration circuit has a regeneration transformer whose primary side is connected between the upper class-D amplifier and the lower class-D amplifier and a regeneration/rectification circuit that is connected to a secondary side of the regeneration transformer to rectify an AC voltage on the secondary side to thereby generate a regenerative voltage. A current generated due to a voltage difference between the upper class-D amplifier and the lower class-D amplifier flows on the primary side of the regeneration transformer. The regeneration transformer passes an AC voltage on the secondary side to the regeneration/rectification circuit.

The regeneration/rectification circuit consists of a diode bridge circuit that is connected to an output terminal of the regeneration transformer, and an LC smoothing circuit that is connected on the DC power supply side. The AC voltage on the secondary side of the regeneration transformer is rectified to a direct current in the diode bridge circuit and then smoothened by the LC smoothing circuit, and thereby a regenerative voltage is generated. A turns ratio of the regeneration transformer is designed such that an equivalent circuit satisfies the requirements of zero voltage switching (ZVS) when a gate phase difference θ is zero degree.

The regeneration circuit regenerates the electric power by the auxiliary current as regenerative power to the DC power supply, so as to enhance conversion efficiency of the power conversion device.

(Resistance Circuit)

In a case where a current-auxiliary circuit consists of a resistance circuit, electric power by an auxiliary current is discharged as heat in a resistive element. The resistance circuit includes a distribution transformer that has its primary side connected between the upper class-D amplifier and the lower class-D amplifier, and a resistive element that is connected on a secondary side of the distribution transformer.

A current generated based on a voltage difference between the upper class-D amplifier and the lower class-D amplifier flows on the primary side of the distribution transformer.

The resistive element is connected on the secondary side of the distribution transformer, and an AC current guided to the distribution transformer is discharged as heat in the resistive element.

Since the auxiliary current is discharged as heat in the resistance circuit consisting of the current-auxiliary circuit, the conversion efficiency of the power conversion device is lowered.

(Bridge Circuit)

A bridge circuit of a class-D amplifier can be configured as a half bridge circuit having one leg and as a full bridge circuit having two legs in terms of a leg formed by connecting an upper arm switching element and a lower arm switching element in series.

Half Bridge Circuit

In a case where a bridge circuit of a class-D circuit is a half bridge circuit, each of an upper class-D amplifier and a lower class-D amplifier has a half bridge that consists of one leg formed by connecting an upper arm switching element on a high voltage side and a lower arm switching element on a low voltage side in series and a capacitor voltage divider formed by connecting two capacitors in series.

The half bridge circuit is configured to use a leg of the upper class-D amplifier and a leg of the lower class-D amplifier respectively as a leading leg and a lagging leg or as a lagging leg and a leading leg, and drive both legs by a gate signal with a gate phase difference θ to perform phase shift control.

Full Bridge Circuit

In a case where a bridge circuit of a class-D circuit is a full bridge circuit, each of an upper class-D amplifier and a lower class-D amplifier has a full bridge that consists of two legs, each of which is formed by connecting an upper arm switching element on a high voltage side and a lower arm switching element on a low voltage side in series.

The full bridge circuit is configured to use two legs of the upper class-D amplifier and two legs of the lower class-D amplifier respectively as leading legs and lagging legs or as lagging legs and leading legs, and drive both legs by a gate signal with a gate phase difference θ to perform phase shift control on the upper and lower class-D amplifiers to thereby control voltages therein.

(Connection of Regeneration Circuit)

In the connection of the regeneration circuit between the upper class-D amplifier and the lower class-D amplifier, the bridge circuit of the class-D amplifier is in a form of either of half bridge and full bridge, or has some forms depending on whether the number of the circuit configurations of the regeneration circuit is one or two. In the connection between both terminals of the regeneration circuit and the output terminal of the bridge circuit of the class-D amplifier, the circuits can be in different forms.

First Connection Configuration of Regeneration Circuit A first connection configuration is for connecting an upper class-D amplifier and a lower class-D amplifier having half bridge circuits with one regeneration circuit.

In the first connection configuration, the upper class-D amplifier and the lower class-D amplifier have the half bridge circuits, each of which is formed by one leg consisting of series-connected high-voltage side switching element and low-voltage side switching element, and a capacitor voltage divider formed by connecting two capacitors in series.

In the half bridge circuit, either a leg of the bridge circuit of the upper class-D amplifier or a leg of the bridge circuit of the lower class-D amplifier is used as a leading leg and the other leg is used as a lagging leg. The regeneration circuit has one circuit configuration consisting of a regeneration transformer and a regeneration/rectification circuit.

In the connection between the upper class-D amplifier and the lower class-D amplifier, one end of the regeneration transformer is connected to a midpoint of the leg of the half bridge of the upper class-D amplifier, and the other end of the regeneration transformer is connected to a midpoint of the leg of the half bridge of the lower class-D amplifier.

Second Connection Configuration of Regeneration Circuit

The second connection configuration is for connecting the upper class-D amplifier and the lower class-D amplifier having the half bridge circuits with two regeneration configurations.

In a second connection configuration, as with the case of the first connection configuration, an upper class-D amplifier and a lower class-D amplifier have half bridge circuits, each of which is formed by one leg consisting of series-connected high-voltage side switching element and low-voltage side switching element and a capacitor voltage divider formed by connecting two capacitors in series.

In the half bridge circuit, either a leg of the bridge circuit of the upper class-D amplifier or a leg of the bridge circuit of the lower class-D amplifier is used as a leading leg and the other leg is used as a lagging leg. The regeneration circuit has two circuit configurations consisting of a regeneration transformer and a regeneration/rectification circuit.

In the connection between the upper class-D amplifier and the lower class-D amplifier, one end of one of the regeneration transformers is connected to a midpoint of the capacitor voltage divider of the upper class-D amplifier, and the other end is connected to a midpoint of the capacitor voltage divider of the lower class-D amplifier or a midpoint of the leg of the half bridge. As to the other regeneration transformer, its one end is connected to a midpoint of the leg of the half bridge of the upper class-D amplifier, and the other end is connected to a midpoint of the leg of the half bridge of the lower class-D amplifier or the midpoint of the capacitor voltage divider.

Third Connection Configuration of Regeneration Circuit

A third connection configuration is for connecting an upper class-D amplifier and a lower class-D amplifier having full bridge circuits with two regeneration configurations.

In the third connection configuration, an upper class-D amplifier and a lower class-D amplifier have full bridge circuits, each of which is formed by two legs consisting of leading legs (20Ha, 20La) and lagging legs (20Hb, 20Lb) in which a switching element of an upper arm connected on a high-voltage side and a switching element of a lower arm connected on a low-voltage side are connected in series. A regeneration circuit (6) has two circuit configurations of a regeneration transformer and a regeneration/rectification circuit.

In the connection between the upper class-D amplifier and the lower class-D amplifier, one end of one of the regeneration transformers is connected to a midpoint of the leading leg of the full bridge circuit of the upper class-D amplifier, and the other end is connected to a midpoint of the lagging leg of the full bridge circuit of the lower class-D amplifier. As to the other regeneration transformer, its one end is connected to a midpoint of the lagging leg of the full bridge of the upper class-D amplifier, and the other end is connected to a midpoint of the leading leg of the full bridge of the lower class-D amplifier.

(Multiple Arrangement of Pairs of Class-D Amplifiers)

The power conversion device has the configuration that employs two class-D amplifiers to have one module formed by a pair of an upper class-D amplifier and a lower class-D amplifier. Alternatively, the power conversion device can have a configuration that employs even numbers of class-D amplifiers to have and arrange a plurality of modules formed by pairs of the upper class-D amplifier and the lower class-D amplifier.

In the configuration that arranges the plurality of modules formed by the pairs of the upper class-D amplifier and the lower class-D amplifier by employing the even numbers of class-D amplifiers, multiple current-auxiliary circuits are used to be provided to the modules one-by-one basis, or a single current-auxiliary circuit is used to be shared among the modules.

Configuration Using Multiple Current-Auxiliary Circuits

The configuration using the multiple current-auxiliary circuits to provide them to the pairs of modules has the even numbers of class-D amplifiers, and further has multiple modules, each consisting of a pair of class-D amplifiers consisting of one upper class-D amplifier and one lower class-D amplifier, and multiple current-auxiliary circuits that are the same in number of the class-D amplifier modules. Since the class-D amplifier module formed by one upper class-D amplifier and one lower class-D amplifier, the number of the class-D amplifiers is an even number. The current-auxiliary circuit is provided to each of modules, so that the number of the current-auxiliary circuits is equal to the number of the class-D amplifier modules.

To each module of a pair of class-D amplifiers, one current-auxiliary circuit is connected between the upper class-D amplifier and the lower class-D amplifier, and output terminals of multiple sets of circuit configurations are connected in series or in parallel. This provides multiple sets of circuit configurations, each of which consists of a module of a pair of class-D amplifiers and one current-auxiliary circuit. The modules of the pairs of class-D amplifiers have their switching elements supplied with auxiliary currents for charging and discharging by the current-auxiliary circuits provided to the respective individual modules.

Configuration Using One Current-Auxiliary Circuit

The configuration using a single current-auxiliary circuit to share the single current-auxiliary circuit among the multiple modules of the class-D amplifiers has multiple modules of pairs of class-D amplifiers, each of which consists of one upper class-D amplifier and one lower class-D amplifier, and further have one current-auxiliary circuit.

To each module of a pair of class-D amplifiers, one current-auxiliary circuit is connected between the upper class-D amplifier and the lower class-D amplifier, and each of sets of output terminals of multiple sets are connected in series or in parallel, in which the pair consists of the module of class-D amplifiers. The modules of the pairs of class-D amplifiers are supplied with an auxiliary current for charging and discharging by the current-auxiliary circuit provided for common use among the modules. In this configuration, each pair of modules of the class-D amplifiers is synchronized with a timing of a gate signal for performing phase shift control, so as to be synchronized with a timing of a current that flows through the common current-auxiliary circuit. This makes it possible to match a direction of an auxiliary current flowing through each class-D amplifier.

Series-Connection and Parallel-Connection of Modules of Class-D Amplifiers

The output terminals of the modules of the class-D amplifiers can be configured to be connected in series or in parallel. This connection configuration can be applied both of the configuration using the multiple current-auxiliary circuits and the configuration using the single current-auxiliary circuit.

Effect of the Invention

As described above, according to the present invention, the power conversion device for performing phase shift control can prevent erroneous gate turn-on in a semiconductor device that forms a class-D amplifier. Furthermore, the power conversion device performing the phase shift control can reduce losses in the semiconductor device even when a gate phase difference θ is small, so that the phase shift control can be performed.

BRIEF DESCRIPTION OF THE DRAWINGS

FIG. 37 illustrates erroneous gate turn-on; and

BEST MODE FOR CARRYING OUT THE INVENTION

Now, a schematic configuration and an operation of a power conversion device of the present invention will be described by referring to FIGS. 1 to 5, a first configuration example and an operation of the power conversion device of the invention will be described by referring to FIGS. 6 to 21, a second configuration example and an operation of the power conversion device of the invention will be described by referring to FIGS. 22 to 32, a third configuration example and an operation of the power conversion device of the invention will be described by referring to FIG. 33, another configuration example of a regeneration circuit of the power conversion device will be described by referring to FIG. 34, and another configuration example of a current-auxiliary circuit of the power conversion device of the invention will be described by referring to FIG. 35.

<Schematic Configuration of Power Conversion Device of the Invention>

Figure 1:
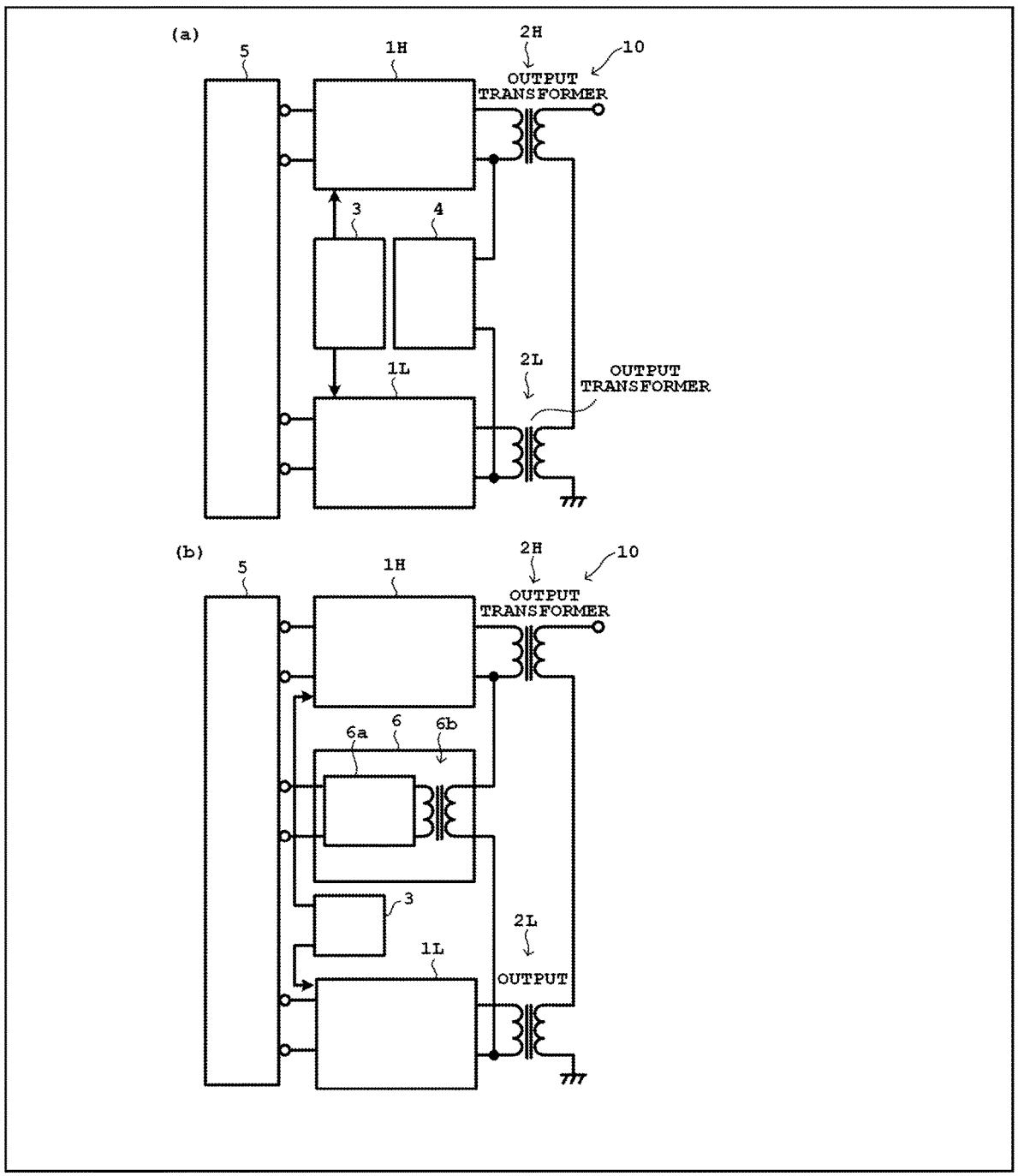
FIG. 1 illustrates a schematic configuration of a power conversion device according to the present invention.
Figure 2:
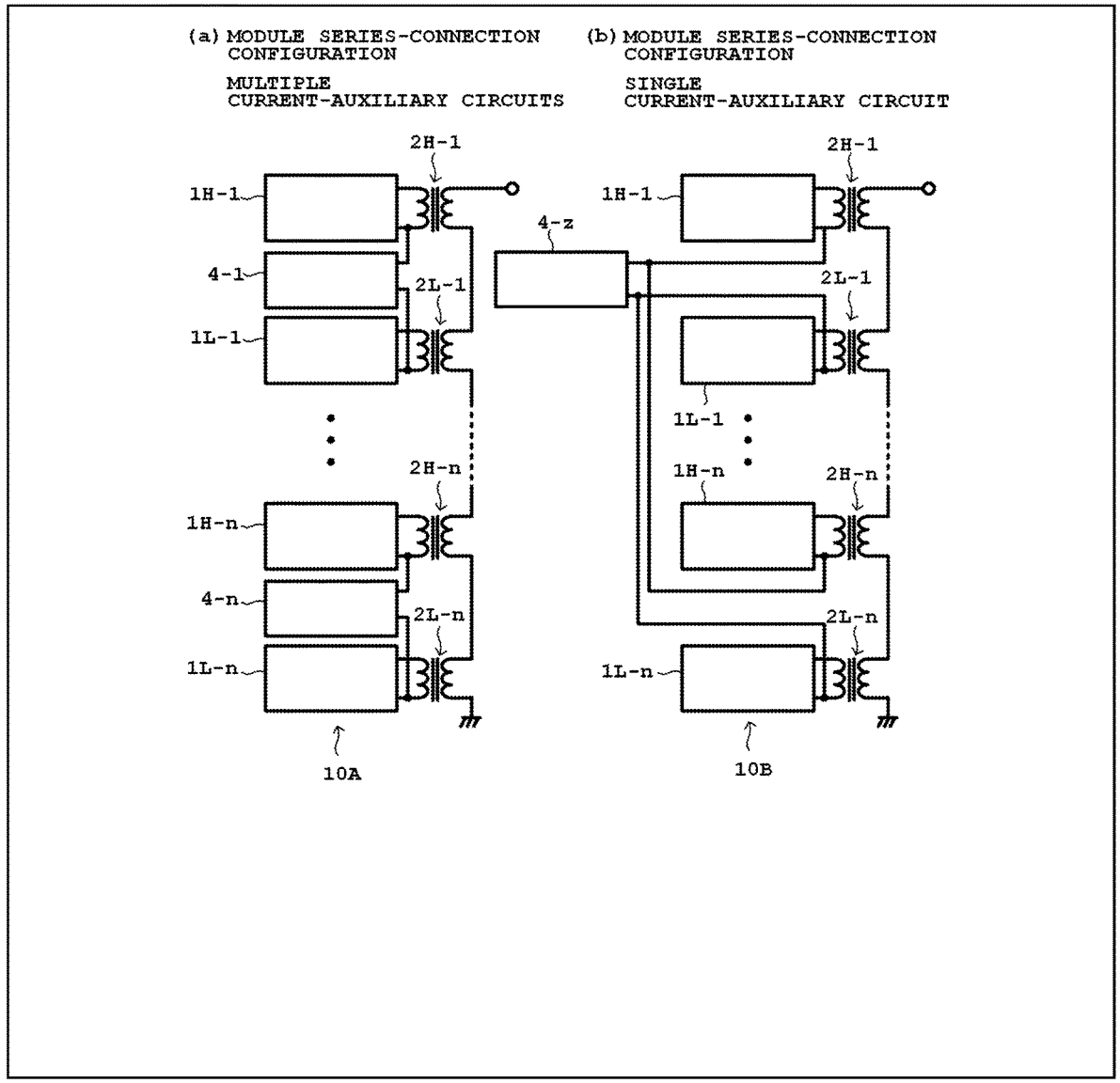
FIG. 2 illustrates a configuration example of series-connection of a module of class-D amplifiers in the power conversion device according to the present invention.
Figure 3:
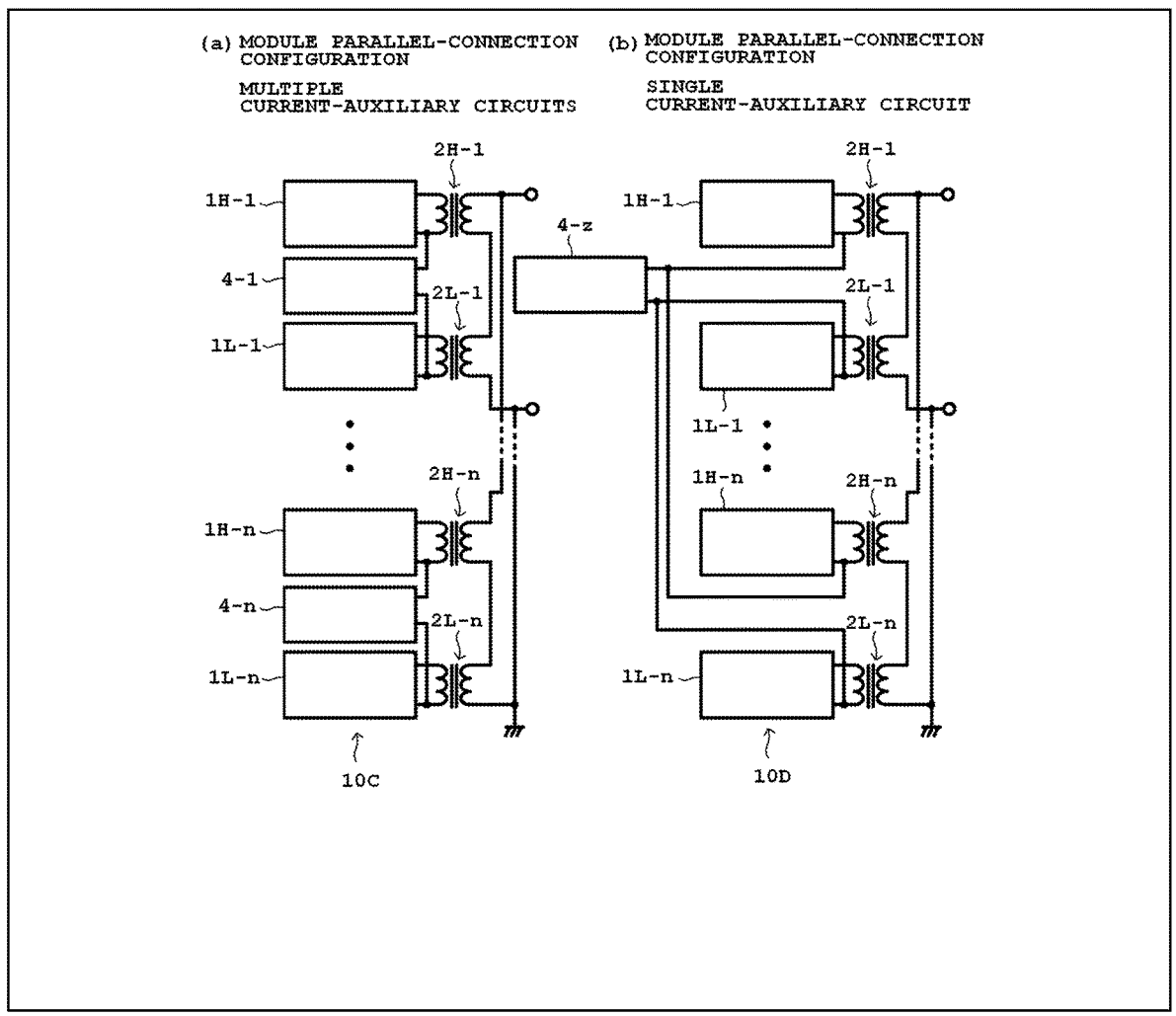
FIG. 3 illustrates a configuration example of parallel-connection of the module of the class-D amplifiers in the power conversion device according to the present invention.
Figure 4:
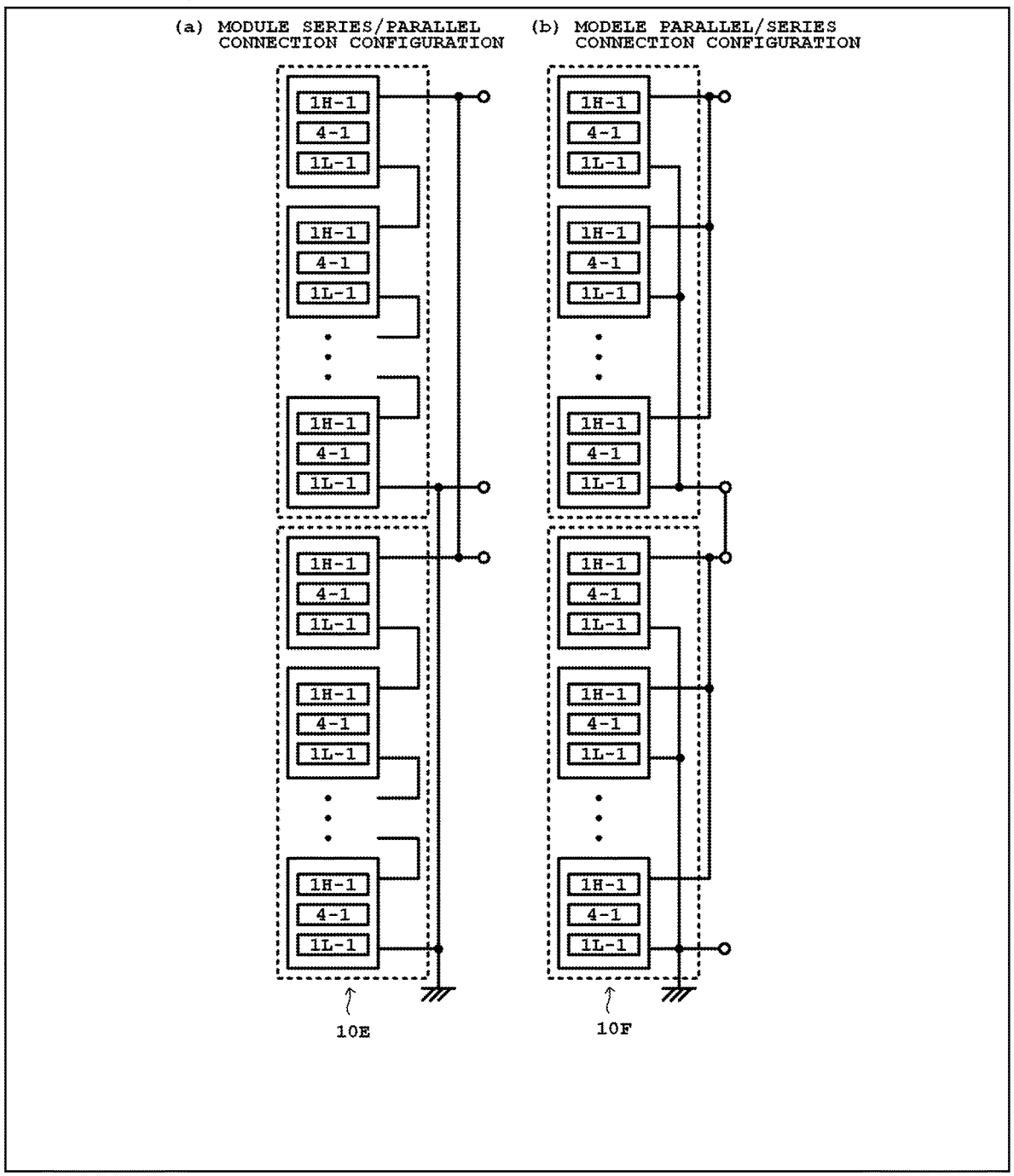
FIG. 4 illustrates configuration examples of parallel/series-connection and series/parallel-connection of the module of the class-D amplifiers in the power conversion device according to the present invention.

FIG. 1 is a schematic diagram illustrating a schematic configuration of a power conversion device according to the present invention. FIG. 1(a) is a schematic diagram of a power conversion device 10. The power conversion device 10 includes class-D amplifiers, consisting of upper class-D amplifier 1H and lower class-D amplifier 1L, a control circuit 3 that controls drive of switching elements included in the upper class-D amplifier 1H and the lower class-D amplifier 1L, and a current-auxiliary circuit 4 that supplies an auxiliary current to the upper class-D amplifier 1H and the lower class-D amplifier 1L.

An input terminal of the upper class-D amplifier 1H and an input terminal of the lower class-D amplifier 1L are connected to a DC power supply 5 in parallel, and an output terminal of the upper class-D amplifier 1H and an output terminal of the lower class-D amplifier 1L are series-connected to each other respectively through output transformers 2H and 2L. The control circuit 3 performs phase shift control on the upper class-D amplifier 1H and the lower class-D amplifier 1L, so as to adjust a voltage by phase shifting by a gate phase difference θ.

In a case where the upper class-D amplifier 1H and the lower class-D amplifier 1L are configured by a half bridge circuit, either a leg of the upper class-D amplifier 1H or a leg of the lower class-D amplifier is used as a leading leg and the other leg is used as a lagging leg, and thereby the phase shift control is performed controlling an amount of shift of the gate phase difference θ between gate signals for driving switching elements of these legs.

In a case where the upper class-D amplifier 1H and the lower class-D amplifier 1L are configured by a full bridge circuit, one of two legs in each of the upper class-D amplifier and the lower class-D amplifier is used as a leading leg and the other leg is used as a lagging leg, and thereby the phase shift control is performed controlling an amount of shift of the gate phase difference θ between gate signals for driving switching elements of these legs.

The current-auxiliary circuit 4 is connected between the output terminal of the upper class-D amplifier 1H and the output terminal of the lower class-D amplifier 1L. In the phase shift control, when the phase shift control is performed by providing the gate phase difference θ between the gate signal of the upper class-D amplifier 1H and the gate signal of the lower class-D amplifier 1L, a voltage difference occurs between the output terminal of the upper class-D amplifier and the output terminal of the lower class-D amplifier. The current-auxiliary circuit 4 passes a current through the upper class-D amplifier 1H or the lower class-D amplifier 1L based on the voltage difference. The auxiliary current flowing from the current-auxiliary circuit 4 into the upper class-D amplifier 1H or the lower class-D amplifier 1L charges or discharges a parasitic capacitance Cds between a drain and a source of a switching element, and thus the current flows into a switching element in an OFF state.

The auxiliary current supplements a current flowing between the drain and the source of the switching element to thereby prevent the generation of a displacement voltage dv/dt when the switching element turns from off to on and the generation of a displacement current di/dt occurring in connection with the voltage generation. It allows the displacement current di/dt to flow into the other switching element in a leg in the OFF state to increase a gate-to-source voltage Vgs, thereby preventing an occurrence of erroneous turn-on.

FIG. 1(b) shows a configuration example of the power conversion device 10 that uses a regeneration circuit 6 as the current-auxiliary circuit 4 shown in FIG. 1(a). In the configuration of the power conversion device 10 shown in FIG. 1(b), the current-auxiliary circuit 4 which is the constituent element of the power conversion device 10 shown in FIG. 1(a) is replaced with the regeneration circuit 6, and the remaining constituent elements are the same.

The regeneration circuit 6 includes a regeneration/rectification circuit 6a and a regeneration transformer 6b. The regeneration transformer 6b has its one end on a primary side connected to the output terminal of the upper class-D amplifier 1H and the other end on the primary side connected to the output terminal of the lower class-D amplifier 1L, and has its secondary side connected to the regeneration/rectification circuit 6a.

When a voltage difference occurs between the output terminal of the upper class-D amplifier 1H and the output terminal of the lower class-D amplifier 1L during the shift phase control, a voltage is generated across the ends on the primary side of the regeneration transformer 6b. On the secondary side of the regeneration transformer 6b, a voltage is generated by converting the voltage generated across the ends on the primary side. The regeneration/rectification circuit 6a rectifies an AC voltage generated on the secondary side of the regeneration transformer 6b to a DC voltage, so as to supply the obtained voltage to a DC power supply, not shown. The regeneration circuit 6 regenerates a current resulting from the voltage difference between the output terminal of the upper class-D amplifier 1H and the output terminal of the lower class-D amplifier 1L to the DC power supply.

<Multiple Arrangement of Pairs of Class-D Amplifiers>

The configuration example in FIG. 1 shows a configuration constituting a module by using the upper class-D amplifier and the lower class-D amplifier as a pair of two class-D amplifiers.

In addition to the configuration of using two class-D amplifiers to constitute a module with a pair of the upper class-D amplifier and the lower class-D amplifier, the power conversion device of the invention can have a configuration of using even numbers of class-D amplifiers to arrange modules formed by multiple sets of the upper class-D amplifier and the lower class-D amplifier. In this case, since the modules are constituted by a combination of the pairs of the upper and lower class-D amplifiers, the number of the class-D amplifiers is even. In the configuration of arranging multiple sets of the combination of the upper class-D amplifier and the lower class-D amplifier, output terminals of each pair are connected in series, so that output voltages are superimposed on one another to increase the output voltages.

In the configuration using the even numbers of class-D amplifiers to arrange multiple modules formed by the pairs of the upper class-D amplifier and the lower class-D amplifier, multiple numbers of current-auxiliary circuits may be applied to provide a current-auxiliary circuit to each of the modules of the pairs, or a single current-auxiliary circuit is applied to share the single current-auxiliary circuit among the modules of the pairs. In addition to that, the modules can be connected in series, and the modules can also be connected in parallel.

(A: Configuration of Using Multiple Current-Auxiliary Circuits to Connect Modules in Series)

FIG. 2(a) shows a configuration in which multiple current-auxiliary circuits are used to provide each current-auxiliary circuits to each of the modules of the pairs, and the modules are connected in series. In this configuration, a power conversion device 10A has the even numbers of class-D amplifiers that constitute multiple sets of modules, each formed by a pair of class-D amplifiers consisting of one upper class-D amplifier (1H-1 . . . 1H-n) and one lower class-D amplifier (1L-1 . . . 1L-n), and multiple current-auxiliary circuits (4-1 . . . 4-n) which are the same in number as the modules of the class-D amplifiers, and thus each module of the class-D amplifiers has one current-auxiliary circuit.

In each module of the multiple class-D amplifiers, one current-auxiliary circuit (4-1 . . . 4-n) is connected between the upper class-D amplifier (1H-1 . . . 1H-n) and the lower class-D amplifier (1L-1 . . . 1L-n), and output terminals are connected to each other in series via output transformers (2H-1, 2L-1 . . . 2H-n, 2L-n). Consequently, multiple circuit configurations, each of which consists of the module of the pair of class-D amplifiers and one current-auxiliary circuit, are cascaded. Each module formed by the pair of class-D amplifiers is supplied with an auxiliary current for charging or discharging from the current-auxiliary circuit provided individually to the module to reduce a displacement voltage and a displacement current generated when a switching element in each module turns from off to on, thereby preventing erroneous turn-on of another switching element that is connected in series in a leg.

(B: Configuration of Using One Current-Auxiliary Circuit to Connect Modules in Series)

FIG. 2(b) shows a configuration of using a single current-auxiliary circuit to share it among the pairs of amplifiers. In this configuration, a power conversion device 10B has the even numbers of class-D amplifiers (1H-1 . . . 1H-n, 1L-1 . . . 1L-n) that constitute multiple sets of class-D amplifiers, each consisting of one upper class-D amplifier and one lower class-D amplifier, and a single current-auxiliary circuit 4-z is connected to these pairs in parallel. The pairs of class-D amplifiers share the single current-auxiliary circuit 4-z.

In each of the pair of class-D amplifiers, the single current-auxiliary circuit 4-z is connected between the upper class-D amplifier (1H-1 . . . 1H-n) and the lower class-D amplifier (1L-1 . . . 1L-n), and the output terminals of the multiple sets of a pair of class-D amplifiers are connected in series via corresponding output transformers (2H-1, 2L-1 . . . 2H-n, 2L-n). The pairs of class-D amplifiers are supplied with an auxiliary current from the shared current-auxiliary circuit.

(C: Configuration of Using Multiple Current-Auxiliary Circuits to Connect Modules in Parallel)

FIG. 3(a) shows a configuration in which multiple current-auxiliary circuits are used to provide each current-auxiliary circuit to a module formed by a pair of class-D amplifiers, and multiple modules are connected in parallel. In this configuration, a power conversion device 10C has the even numbers of class-D amplifiers that constitute multiple sets of modules, each formed by a pair of class-D amplifiers consisting of one upper class-D amplifier (1H-1 . . . 1H-n) and one lower class-D amplifier (1L-1 . . . 1L-n), and multiple current-auxiliary circuits (4-1 . . . 4-n) which are the same in number as the modules of the class-D amplifiers. In this way, each module of the class-D amplifiers has one current-auxiliary circuit.

In the module of the pair of multiple class-D amplifiers, one current-auxiliary circuit (4-1 . . . 4-n) is connected between the upper class-D amplifier (1H-1 . . . 1H-n) and the lower class-D amplifier (1L-1 . . . 1L-n), and output terminals of the modules are connected to each other in parallel via output transformers (2H-1, 2L-1 . . . 2H-n, 2L-n). Consequently, multiple circuit configurations, each of which consists of the module formed by the pair of class-D amplifiers and one current-auxiliary circuit, are connected in parallel. Each module of the pair of class-D amplifiers is supplied with an auxiliary current for charging or discharging from the current-auxiliary circuit provided individually to the module.

(D: Configuration of Using One Current-Auxiliary Circuit to Connect Modules in Parallel)

FIG. 3(b) shows a configuration of using a single current-auxiliary circuit to share it among multiple modules formed by pairs of class-D amplifiers, and the modules are connected in parallel. In this configuration, a power conversion device 10D has the even numbers of class-D amplifiers (1H-1 . . . 1H-n, 1L-1 . . . 1L-n) that constitute multiple sets of modules, each formed by a pair of class-D amplifiers consisting of one upper class-D amplifier and one lower class-D amplifier, and a single current-auxiliary circuit 4-z is connected to these pairs in parallel. The multiple modules of the pairs of class-D amplifiers share the single current-auxiliary circuit 4-z.

In each of the modules of the pairs of class-D amplifiers, the single current-auxiliary circuit 4-z is connected between the upper class-D amplifier (1H-1 . . . 1H-n) and the lower class-D amplifier (1L-1 . . . 1L-n), and the output terminals of the multiple modules are connected in parallel via corresponding output transformers (2H-1, 2L-1 . . . 2H-n, 2L-n). The modules of the pairs of class-D amplifiers are supplied with an auxiliary current from the shared current-auxiliary circuit.

(E: Configuration of Connecting Series-Connected Modules in Parallel)

The configurations (A) and (B) having the series-connected modules of the class-D amplifiers may further be connected in parallel. FIG. 4(a) shows a plurality of configurations having series-connected multiple modules of class-D amplifiers are provided and connected in parallel. FIG. 4(a) shows a configuration example in which two series-connected circuit configurations are employed and connected in parallel, but the number of the circuit configurations to be connected in parallel is not limited to two, and thus the number of the circuit configurations may be three or more.

(F: Configuration of Connecting Parallel-Connected Module in Series)

The configurations (C) and (D) having parallel-connected modules of the class-D amplifiers may further be connected in series. FIG. 4(b) shows a plurality of configurations having multiple parallel-connected modules of class-D amplifiers are provided and connected in series. FIG. 4(b) shows a configuration example in which two parallel-connected circuit configurations are employed and connected in series, but the number of the circuit configurations to be connected in series is not limited to two, and thus the number of the circuit configurations may be three or more.

Operation Example of Current-Auxiliary Circuit

Figure 5:
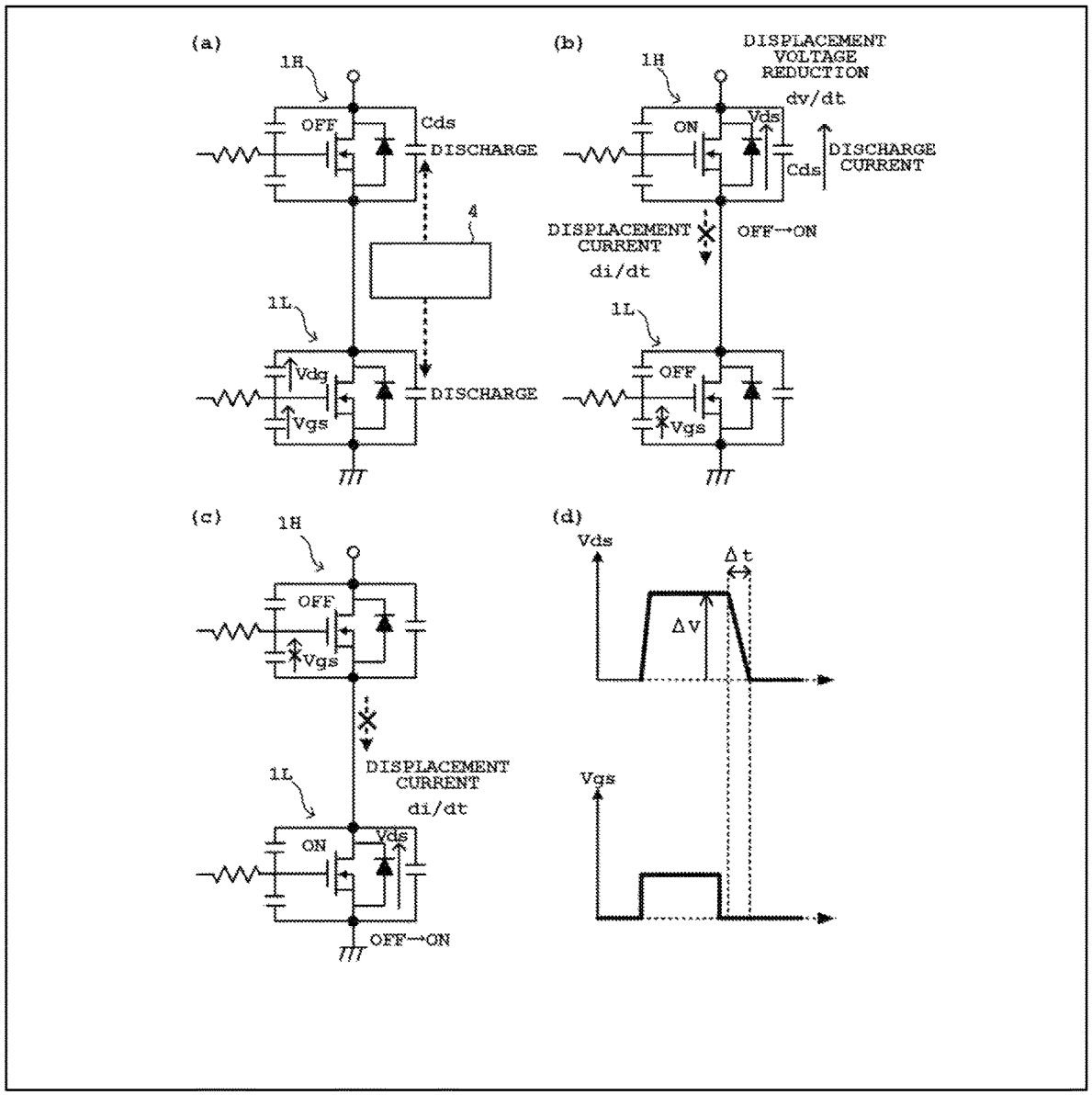
FIG. 5 illustrates an operation example of a current-auxiliary circuit of the power conversion device according to the present invention.

By referring to FIG. 5, an operation example of a current-auxiliary circuit will be described. FIG. 5(a) shows how an upper class-D amplifier 1H and a lower class-D amplifier 1L are supplied with auxiliary currents from a current-auxiliary circuit 4. A broken line in the figure schematically indicates a state of supplying the auxiliary currents. A parasitic capacitance Cds between a drain and a source of each of the upper class-D amplifier 1H and the lower class-D amplifier 1L is charged or discharged with an auxiliary current from the current-auxiliary circuit 4, and thus during charging or discharging, a charging current or discharging current flows between the drain and the source of the class-D amplifier.

FIG. 5(b) shows a state where a switching element of an upper class-D amplifier 1H turns from off to on. In a case where a parasitic capacitance Cds of the upper class-D amplifier 1H is not discharged, when the switching element of the upper class-D amplifier 1H turns from off to on, the switching element of the upper class-D amplifier 1H goes into a hard switching state, so that a large displacement voltage dv/dt is generated between a drain and a source. The displacement voltage dv/dt causes the generation of a displacement current di/dt. The displacement current di/dt causes an increase in a gate-to-source voltage Vgs in a switching element of a lower class-D amplifier 1L, and when the gate-to-source voltage Vgs exceeds an turn-on voltage in the switching element of the lower class-D amplifier 1L, the switching element of the lower class-D amplifier 1L is erroneously turned on.

On the other hand, when the upper class-D amplifier 1H is supplied with an auxiliary current from a current-auxiliary circuit 4 and thus a current flows to the switching element, the switching element is prevented from going into the hard switching state, thereby reducing the displacement voltage dv/dt between the drain and the source. The reduction of the displacement voltage dv/dt leads to the reduction of the displacement current di/dt. Since the displacement current di/dt from the upper class-D amplifier 1H is reduced, the increase in the gate-to-source voltage Vgs in the switching element of the lower class-D amplifier 1L is suppressed, thereby preventing an occurrence of erroneous turn-on of the switching element of the lower class-D amplifier 1L. FIG. 5(b) shows that the displacement voltage dv/dt and the displacement current di/dt are reduced.

FIG. 5(c) shows a state where a switching element of a lower class-D amplifier 1L turns from off to on. In a case where a parasitic capacitance Cds of the lower class-D amplifier 1L is not discharged, when the switching element of the lower class-D amplifier 1L turns from off to on, the switching element of the lower class-D amplifier 1L goes into a hard switching state, so that a large displacement voltage dv/dt is generated between a drain and a source. The displacement voltage dv/dt causes the generation of a displacement current di/dt. The displacement current di/dt causes an increase in a gate-to-source voltage Vgs in a switching element of an upper class-D amplifier 1H, and when the gate-to-source voltage Vgs exceeds an turn-on voltage in the switching element, the switching element is erroneously turned on.

On the other hand, when the lower class-D amplifier 1L is supplied with an auxiliary current from the current-auxiliary circuit 4 and thus a current flows to the switching element, the switching element is prevented from going into the hard switching state, thereby reducing the displacement voltage dv/dt between the drain and the source. The reduction of the displacement voltage dv/dt leads to the reduction of the displacement current di/dt. Since the displacement current di/dt from the lower class-D amplifier 1L is reduced, the increase in the gate-to-source voltage Vgs in the switching element of the upper class-D amplifier 1H is suppressed, thereby preventing an occurrence of erroneous turn-on of the switching element of the upper class-D amplifier 1H. FIG. 5(c) shows that the displacement voltage dv/dt and the displacement current di/dt are reduced.

FIG. 5(d) shows changes in a drain-to-source voltage Vds and a gate-to-source voltage Vgs in a switching element. When a switching element of one of the class-D amplifiers turns from off to on, its drain-to-source voltage Vds decreases. A voltage change $\Delta V/\Delta t$ occurring at this time causes the generation of a displacement current di/dt that flows to a parasitic capacitance Cds between the drain and the source, so that a current flow to a switching element of the other class-D amplifier is prevented. Since the displacement current di/dt does not flow into the switching element of the other class-D amplifier, the increase in the gate-to-source voltage Vgs in the switching element of the other class-D amplifier is suppressed, thereby preventing an occurrence of erroneous turn-on of the switching element.

First Configuration Example of Present Invention

A first configuration example of the invention will be described by referring to FIGS. 6 to 21. In the first configuration example, an upper class-D amplifier and a lower class-D amplifier comprise half bridges, and one regeneration circuit is provided as a current-auxiliary circuit.

Circuit Example of First Configuration Example

Figure 6:
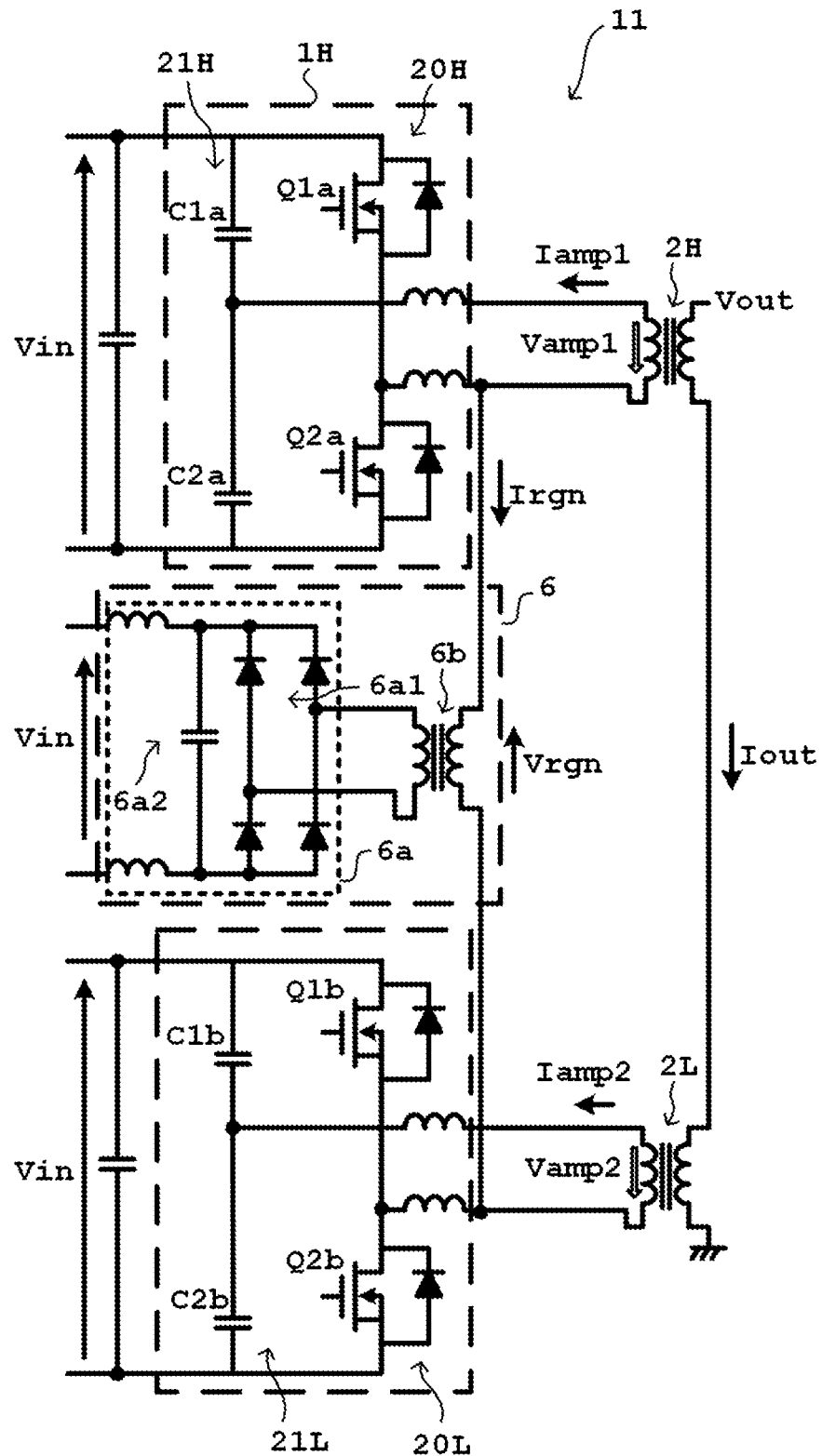
FIG. 6 illustrates a circuit example in a first configuration example of the power conversion device according to the present invention.

FIG. 6 shows a circuit example of the first configuration example of the invention. This figure shows only an upper class-D amplifier 1H, a lower class-D amplifier 1L and a regeneration circuit 6.

In a power conversion device 11, the upper class-D amplifier 1H has a half bridge circuit formed by a leading leg 20H consisting of a high-side switching element Q1a and a low-side switching element Q2a, which are connected in series, and a capacitor voltage divider 21H consisting of a capacitor C1a and a capacitor C2a, which are connected in series. The high-side switching element Q1a forming the leading leg 20H has its one end connected to a high voltage part of a DC power supply, not shown, and the low-side switching element Q2a forming the leading leg 20H has its one end connected to a low voltage part of the DC power supply, not shown. The high-side switching element Q1a and the low-side switching element Q2a have their other ends connected to a midpoint that is one of output terminals of the upper class-D amplifier 1H, the midpoint being connected to one end of an output transformer 2H on a primary side. In the figure, Vin represents a voltage in the DC power supply, not shown.

The capacitor C1a forming the capacitor voltage divider 21H has its one end connected to the high voltage part of the DC power supply, not shown, and the capacitor C2a forming the capacitor voltage divider 21H has its one end connected to the low voltage part of the DC power supply, not shown. The capacitor C1a and the capacitor C2a have their other ends connected to a midpoint that is the other output terminal of the upper class-D amplifier 1H, the midpoint being connected to the other end of the output transformer 2H on the primary side.

There are leakage inductances of the output transformer 2H between the midpoint of the leading leg 20H and the output transformer 2H and between the midpoint of the capacitor voltage divider 21H and the output transformer 2H.

The lower class-D amplifier 1L has a half bridge circuit formed by a lagging leg 20L consisting of a high-side switching element Q1b and a low-side switching element Q2b, which are connected in series, and a capacitor voltage divider 21L consisting of a capacitor C1b and a capacitor C2b, which are connected in series. The switching element Q1b forming the lagging leg 20L has its one end connected to the high voltage part of the DC power supply, not shown, and the low-side switching element Q2b forming the lagging leg 20L has its one end connected to the low voltage part of the DC power supply, not shown. The high-side switching element Q1b and the low-side switching element Q2b have their other ends connected to a midpoint that is one of output terminals of the lower class-D amplifier 1L, the midpoint being connected to one end of an output transformer 2L on a primary side.

The capacitor C1b forming the capacitor voltage divider 21L has its one end connected to the high voltage part of the DC power supply, not shown, and the capacitor C2b forming the capacitor voltage divider 21L has its one end connected to the low voltage part of the DC power supply, not shown. The capacitor C1b and the capacitor C2b have their other ends connected to a midpoint that is the other output terminal of the lower class-D amplifier 1L, the midpoint being connected to the other end of the output transformer 2L on the primary side.

There are leakage inductances of the output transformer 2L between the midpoint of the lagging leg 20L and the output transformer 2L and between the midpoint of the capacitor voltage divider 21L and the output transformer 2L.

The regeneration circuit 6 includes a regeneration/rectification circuit 6a and a regeneration transformer 6b, and is configured to regenerate auxiliary current power received from the class-D amplifier as regenerated power to the DC power supply. The regeneration transformer 6b has its primary side connected between the upper class-D amplifier 1H and the lower class-D amplifier 1L and its secondary side connected to the regeneration/rectification circuit 6a. The regeneration/rectification circuit 6a is configured to rectify an AC voltage on the secondary side of the regeneration transformer 6b to generate a DC regeneration voltage. On the primary side of the regeneration transformer 6b, a current flows based on a voltage difference between the upper class-D amplifier 1H and the lower class-D amplifier 1L. The regeneration transformer 6b sends the AC voltage on its secondary side to the regeneration/rectification circuit 6a. The regeneration transformer has its turns ratio designed such that an equivalent circuit satisfies a condition of a zero-voltage switching (ZVS) when a gate phase difference θ is zero.

The regeneration/rectification circuit 6a consists of a diode bridge circuit 6a1 connected to an output terminal of the regeneration transformer 6b and an LC smoothing circuit 6a2 connected to the DC power supply side. The AC voltage on the secondary side of the regeneration transformer 6b is rectified by the diode bridge circuit 6a1, and then subjected to a smoothing process by the LC smoothing circuit 6a2. Consequently, a smoothed DC voltage is regenerated to the DC power supply as a regenerated voltage. In this way, the regeneration circuit 6 regenerates the auxiliary current power as regenerated power to the DC power supply, thereby enhancing conversion efficiency of the power conversion device.

Operation Example of First Configuration Example

An operation example of the first configuration example will be described by referring to a diagram showing signals in FIG. 7. FIGS. 7(a) and 7(b) show a gate signal gQ1a and waveforms of a voltage VQ1a and a current IQ1a, respectively, for the high-side switching element Q1a on an upper arm side of the upper class-D amplifier 1H, FIGS. 7(c) and 7(d) show a gate signal gQ2a, and waveforms of a voltage VQ2a and a current IQ2a, respectively, for the low-side switching element Q2a on a lower arm side of the upper class-D amplifier 1H, FIGS. 7(e) and 7(f) show a gate signal gQ1b, and waveforms of a voltage VQ1b and a current IQ1b, respectively, for the high-side switching element Q1b on an upper arm side of the lower class-D amplifier 1L, and FIGS. 7(g) and 7(h) show a gate signal gQ2b, and waveforms of a voltage VQ2b and a current IQ2b, respectively, for the low-side switching element Q2b on a lower arm side of the lower class-D amplifier 1L.

FIG. 7(i) shows an output voltage Vamp1 and an output current Iamp1 of the upper class-D amplifier 1H, FIG. 7(j) shows an output voltage Vamp2 and an output current Iamp2 of the lower class-D amplifier 1L, FIG. 7(k) shows an input voltage Vrgn and a current Irgn of the regeneration circuit, FIGS. 7(l) and 7(m) show an output current Iout and an output voltage Vout, respectively, of the power conversion device. The input voltage Vrgn and the current Irgn correspond to a primary side voltage and a primary side current of the regeneration transformer 6b, respectively.

In here, a leg formed by the high-side switching element Q1a and the low-side switching element Q2a of the upper class-D amplifier 1H is used as a leading leg, and a leg formed by the high-side switching element Q1b and the low-side switching element Q2b of the lower class-D amplifier 1L is used as lagging leg. Furthermore, in FIGS. 7(b), 7(d), 7(e), 7(g) and 7(h) to 7(l), solid lines indicate the voltage waveforms, and broken lines indicate the current waveforms.

Firstly, a description will be made about an operation performed when the gate signal gQ1a and the gate signal gQ2a turn from off to on, respectively, in the high-side switching element Q1a and the low-side switching element Q2a, which form the leg of the upper class-D amplifier 1H.

At a point where the gate signal gQ1a turns from off to on (point "a1" in FIG. 7(a)), a displacement voltage dv/dt generated when the switching element Q1a goes into an ON state is reduced by passing a current to the switching element Q1a.

In FIG. 7(b), a point "a2" in the waveform of the current IQ1a shows current fluctuation at the time of the change in the signal state. Before the point "a1" of the gate signal gQ1a, an input voltage Vrgn is generated on the primary side of the regeneration transformer 6b due to a voltage difference between the upper class-D amplifier 1H and the lower class-D amplifier 1L, and the input voltage Vrgn causes a current Irgn to flow into the upper class-D amplifier 1H (point "a3" in FIG. 7(k)). The current Irgn thus flows in charges or discharges a parasitic capacitance Cds of the switching element Q1a. This charging/discharging current allows a current to flow into the switching element Q1a (point "a2" in FIG. 7(b)).

The displacement voltage dv/dt generated in the switching element Q1a by the charging/discharging current is reduced. The reduction in the displacement voltage dv/dt leads to the reduction in the displacement current di/dt, and thereby an amount of fluctuation of the current IQ1a is reduced. The reduction in the amount of fluctuation of the displacement current IQ1a leads to the suppression of the increase in the gate-to-source voltage Vgs in the low-side switching element Q2a in the same leg, thereby preventing erroneous turn-on. The signal waveform indicated by the broken line in the gate signal gQ2a in FIG. 7(c) shows that an erroneous turn-on signal induced by the displacement current di/dt is suppressed.

At a point where the gate signal gQ2a turns from off to on (point "b1" in FIG. 7(c)), a displacement voltage dv/dt generated when the switching element Q2a goes into an ON state is reduced by passing a current to the switching element Q2a.

In FIG. 7(d), a point "b2" in the waveform of a current IQ2a shows current fluctuation at the time of the change in the signal state. When the low-side switching element Q2a also turns from off to on, due to a voltage difference between the upper class-D amplifier 1H and the lower class-D amplifier 1L, an input voltage Vrgn on the primary side of the regeneration transformer 6b causes a current Irgn to flow into the upper class-D amplifier 1H before the point "b1" of the gate signal gQ2a (point "b3" in FIG. 7(k)). The current Irgn thus flows in charges or discharges a parasitic capacitance Cds of the switching element Q2a. This charging/discharging current allows a current to flow into the switching element Q2a (point "b2" in FIG. 7(d)).

The displacement voltage dv/dt generated in the switching element Q2a by the charging/discharging current is reduced. The reduction in the displacement voltage dv/dt leads to the reduction in the displacement current di/dt, and thereby an amount of fluctuation of the current IQ2a is reduced. The reduction in the amount of fluctuation of the displacement current IQ2a leads to the suppression of the increase in the gate-to-source voltage Vgs in the high-side switching element Q1a in the same leg, thereby preventing erroneous turn-on. The signal waveform indicated by the broken line in the gate signal gQ1a in FIG. 7(a) shows that an erroneous turn-on signal induced by the displacement current di/dt is suppressed.

A description will now be made about an operation performed when the gate signal gQ1b and the gate signal gQ2b turn from off to on respectively in the high-side switching element Q1b and the low-side switching element Q2b, which form together a leg of the lower class-D amplifier 1L.

At a point where the gate signal gQ1b turns from off to on (point "c1" in FIG. 7(e)), a displacement voltage dv/dt generated when the switching element Q1b goes into an ON state is reduced by passing a current to the switching element Q1b.

In FIG. 7(f), a point "c2" in the waveform of a current IQ1b shows current fluctuation at the time of the change in the signal state. Before the point "c1" of the gate signal gQ1b, an input voltage Vrgn is generated on the primary side of the regeneration transformer 6b due to a voltage difference between the upper class-D amplifier 1H and the lower class-D amplifier 1L, and the input voltage Vrgn causes a current Irgn to flow into the upper class-D amplifier 1H (point "c3" in FIG. 7(k)). The current Irgn thus flows in charges or discharges a parasitic capacitance Cds of the switching element Q1b. This charging/discharging current allows a current to flow into the switching element Q1b (point "c2" in FIG. 7(f)).

The displacement voltage dv/dt generated in the switching element Q1b by the charging/discharging current is reduced. The reduction in the displacement voltage dv/dt leads to the reduction in the displacement current di/dt, and thereby an amount of fluctuation of the current IQ1b is reduced. The reduction in the amount of fluctuation of the displacement current IQ1b leads to the suppression of the increase in the gate-to-source voltage Vgs in the low-side switching element Q2b in the same leg, thereby preventing erroneous turn-on. The signal waveform indicated by the broken line in the gate signal gQ2b in FIG. 7(g) shows that an erroneous turn-on signal induced by the displacement current di/dt is suppressed.

At a point where the gate signal gQ2b turns from off to on (point "d1" in FIG. 7(g)), a displacement voltage dv/dt generated when the switching element Q2b goes into an ON state is reduced by passing a current to the switching element Q2b.

In FIG. 7(h), a point "d2" in the waveform of a current IQ2b shows current fluctuation at the time of the change in the signal state. When the low-side switching element Q2b also turns from off to on, due to a voltage difference between the upper class-D amplifier 1H and the lower class-D amplifier 1L, an input voltage Vrgn on the primary side of the regeneration transformer 6b causes a current Irgn to flow into the upper class-D amplifier 1H before the point "d1" of the gate signal gQ2b (point "d3" in FIG. 7(k)). The current Irgn thus flows in charges or discharges a parasitic capacitance Cds of the switching element Q2b. This charging/discharging current allows a current to flow into the switching element Q2b (point "d2" in FIG. 7(h)).

The displacement voltage dv/dt generated in the switching element Q2b by the charging/discharging current is reduced. The reduction in the displacement voltage dv/dt leads to the reduction in the displacement current di/dt, and thereby an amount of fluctuation of the current IQ2b is reduced. The reduction in the amount of fluctuation of the displacement current IQ2b leads to the suppression of the increase in the gate-to-source voltage Vgs in the high-side switching element Q1b in the same leg, thereby preventing erroneous turn-on. The signal waveform indicated by the broken line in the gate signal gQ1b in FIG. 7(e) shows that an erroneous turn-on signal induced by the displacement current di/dt is suppressed.

The current Irgn shown in FIG. 7(k) is an auxiliary current that discharges a drain-to-source capacitance Cds of a switching element to supplement a current flowing the switching element, and flows based on the input voltage Vrgn that corresponds to a difference voltage between the upper class-D amplifier 1H and the lower class-D amplifier 1L. The direction of the current Irgn changes according to the direction of the input voltage Vrgn.

Figure 7:
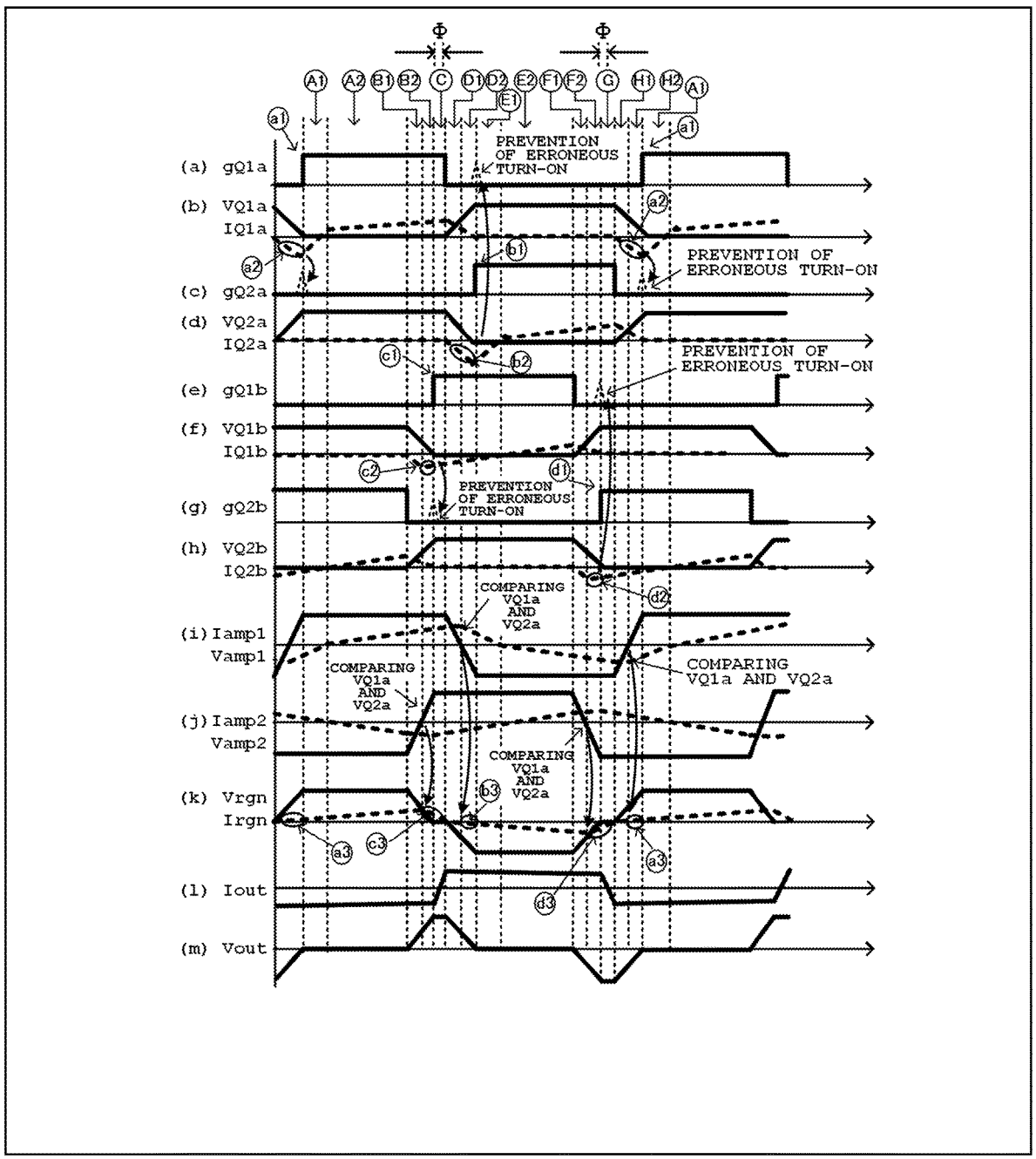
FIG. 7 illustrates a signal example in the first configuration example of the power conversion device according to the present invention.

In FIG. 7, a gate phase difference θ is provided between the gate signals gQ1a, gQ2a for driving the switching elements Q1a, Q2a which form one leg and the gate signals gQ1b, gQ2b for driving the switching elements Q1b, Q2b which form the other leg, and the gate phase difference θ is shifted to control a voltage. FIG. 7 shows an example of using the leg formed by the switching elements Q1a, Q2a, to which the gate signals gQ1a, gQ2a are applied, as a leading leg, and using the leg formed by the switching elements Q1b, Q2b, to which the gate signals gQ1b, gQ2b are applied, as a lagging leg.

An operation aspect of the power conversion device changes according to a combination of the gate signals gQ1a, gQ2a and the gate signals gQ1b, gQ2b. In FIG. 7, the power conversion device has operation aspects according to the gate signals in eight zones "A" to "H".

The gate signals gQ1a, gQ2a, gQ1b and gQ2b in the zone "A" make the switching element Q1a to be ON, the switching element Q2a to be OFF, the switching element Q1b to be OFF and the switching element Q2b to be ON, respectively. In the zone "B", the gate signals gQ1a, gQ2a, gQ1b and gQ2b make the switching elements Q1a, Q2a, Q1b and Q2b to be ON, OFF, OFF and OFF, respectively. In the zone "C", the gate signals gQ1a, gQ2a, gQ1b and gQ2b make the switching elements Q1a, Q2a, Q1b and Q2b to be ON, OFF, ON and OFF, respectively. In the zone "D", the gate signals gQ1a, gQ2a, gQ1b and gQ2b make the switching elements Q1a, Q2a, Q1b and Q2b to be OFF, OFF, ON and OFF, respectively. In the zone "E", the gate signals gQ1a, gQ2a, gQ1b and gQ2b make the switching elements Q1a, Q2a, Q1b and Q2b to be OFF, ON, ON and OFF, respectively. In the zone "F", the gate signals gQ1a, gQ2a, gQ1b and gQ2b make the switching elements Q1a, Q2a, Q1b and Q2b to be OFF, ON, OFF and OFF, respectively. In the zone "G", the gate signals gQ1a, gQ2a, gQ1b and gQ2b make the switching elements Q1a, Q2a, Q1b and Q2b to be OFF, ON, OFF and ON, respectively. In the zone "H", the gate signals gQ1a, gQ2a, gQ1b and gQ2b make the switching elements Q1a, Q2a, Q1b and Q2b to be OFF, OFF, OFF and ON, respectively.

The zone "C" and the zone "G" are phase shifting zones, in which an output voltage is generated. The zone "B", the zone "D", the zone "F" and the zone "H", respectively on either side of the phase shifting zones, are dead time zones, in which both of two switching elements in either leg turn off. Except for the phase shifting zones "C" and "G", the zone "A" and the zone "E" as well as the dead zones "B", "D", "F" and "H" are zones for performing a regeneration operation.

Furthermore, the zone "A", the zone "B", the zone "D", the zone "E", the zone "F" and the zone "H" are divided into two zones, so that these zones have zones "A1" and "A2", zones "B1" and "B2", zones "D1" and "D2", zones "E1" and "E2", zones "F1" and "F2" and zones "H1" and "H2", respectively. In this way, there are 14 zones in one operation cycle.

Table 1 shows items in each zone, namely an ON/OFF state, a voltage change and a current change of the switching element, output voltages Vamp1, Vamp2 and output currents Iamp1, Iamp2 of the upper class-D amplifier 1H and the lower class-D amplifier, an input voltage Vrgn and a current Irgn of the regeneration circuit, an output voltage Vout and an output current Iout of the power conversion device, and a state of regeneration. Portions marked with asterisk symbols "*" in Table 1 show auxiliary currents and currents flowing through the switching elements as well as the changes in the current Irgn of the auxiliary circuit when the switching elements turn from off to on.

TABLE 1

| Zone | A1 | A2 | Dead Time | | Phase Shifting Zone θ | Dead Time | |
|---|---|---|---|---|---|---|---|
| | | | B1 | B2 | C | D1 | D2 |
| Q1a | *ON diode | *ON MOS | ON MOS | ON MOS | ON MOS | OFF Charging | OFF Charging |
| Q2a | OFF Charged | OFF Charged | OFF Charged | OFF Charged | OFF Charged | *OFF Dis-Charging | *OFF Dis-Charging |
| Q1b | OFF Dis-Charged | OFF Dis-Charged | *OFF Dis-Charging | *OFF Dis-Charging | *ON diode | ON diode | ON diode |
| Q2b | ON diode | ON MOS | OFF Charging | OFF Charging | OFF Charged | OFF Charged | OFF Charged |
| IQ1a | ↑ | ↓ | ↓ | ↓ | ↓ | ↓ | ↓ |
| IQ2a | 0 | 0 | 0 | 0 | 0 | ↑ | ↑ b2 |
| IQ1b | 0 | 0 | ↑ | ↑ c2 | ↑ | ↑ | ↑ |
| IQ2b | ↑ | ↓ | ↓ | ↓ | 0 | 0 | 0 |
| Vamp1 | ↓ | ↓ | ↓ | ↓ | ↓ | ↓ | ↑ |
| Vamp2 | ↑ | ↑ | ↑ | ↓ | ↓ | ↓ | ↓ |
| Iamp1 | → | ← | ← | ← | ← | ← | → |
| Iamp2 | ← | → | → | ← | → | → | → |
| Vrgn | ↑ | ↑ | ↑ | ↑ | 0 | ↓ | ↓ |
| Irgn | ↓ | ↓ | ↓ | *↓ c3 | ↓ | ↑ | *↑ b3 |
| Vout | 0 | 0 | Increase | Increase | −Vin | Decrease | Decrease |
| Iout | ↓ | ↓ | ↓ | ↓ | ↓→↑ | ↑ | ↑ |

TABLE 1-continued

| | | | Dead Time | | Phase Shifting Zone θ | Dead Time | |
|---|---|---|---|---|---|---|---|
| Zone | E1 | E2 | F1 | F2 | G | H1 | H2 |
| Q1a | OFF Charged | OFF Charged | OFF Charged | OFF Charged | OFF Charged | *OFF Dis-Charging | *OFF Dis-Charging |
| Q2a | *ON diode | *ON MOS | ON MOS | ON MOS | ON MOS | OFF Charging | OFF Charging |
| Q1b | ON diode | ON MOS | OFF Charging | OFF Charging | OFF Charged | OFF Charged | OFF Charged |
| Q2b | OFF Charged | OFF Charged | *OFF Dis-Charging | *OFF Dis-Charging | *ON diode | ON diode | ON diode |
| IQ1a | 0 | 0 | 0 | 0 | 0 | ↑ | ↑ a2 |
| IQ2a | ↑ | ↓ | ↓ | ↓ | ↓ | 0 | 0 |
| IQ1b | ↑ | ↓ | ↓ | ↓ | 0 | 0 | 0 |
| IQ2b | 0 | 0 | ↑ | ↑ | ↑ d2 | ↑ | ↑ |
| Vamp1 | ↑ | ↑ | ↑ | ↑ | ↑ | ↑ | ↑ |
| Vamp2 | ↓ | ↓ | ↓ | ↑ | ↑ | ↑ | ↑ |
| Iamp1 | ← | → | → | → | → | → | → |
| Iamp2 | → | ← | ← | ← | → | ← | ← |
| Vrgn | ↓ | ↓ | ↓ | ↓ | 0 | ↑ | ↑ |
| Irgn | ↑ | ↑ | ↑ | *↑ d3 | ↑ | ↓ | *↓ a3 |
| Vout | 0 | 0 | Decrease | Decrease | Vin | Increase | Increase |
| Iout | ↑ | ↑ | ↑ | ↑ | ↑←↓ | ↓ | ↓ |

Operations in the zones "A" to "H" will now be described by referring to FIGS. 8 to 21.

(Zone "A")

Figure 8:
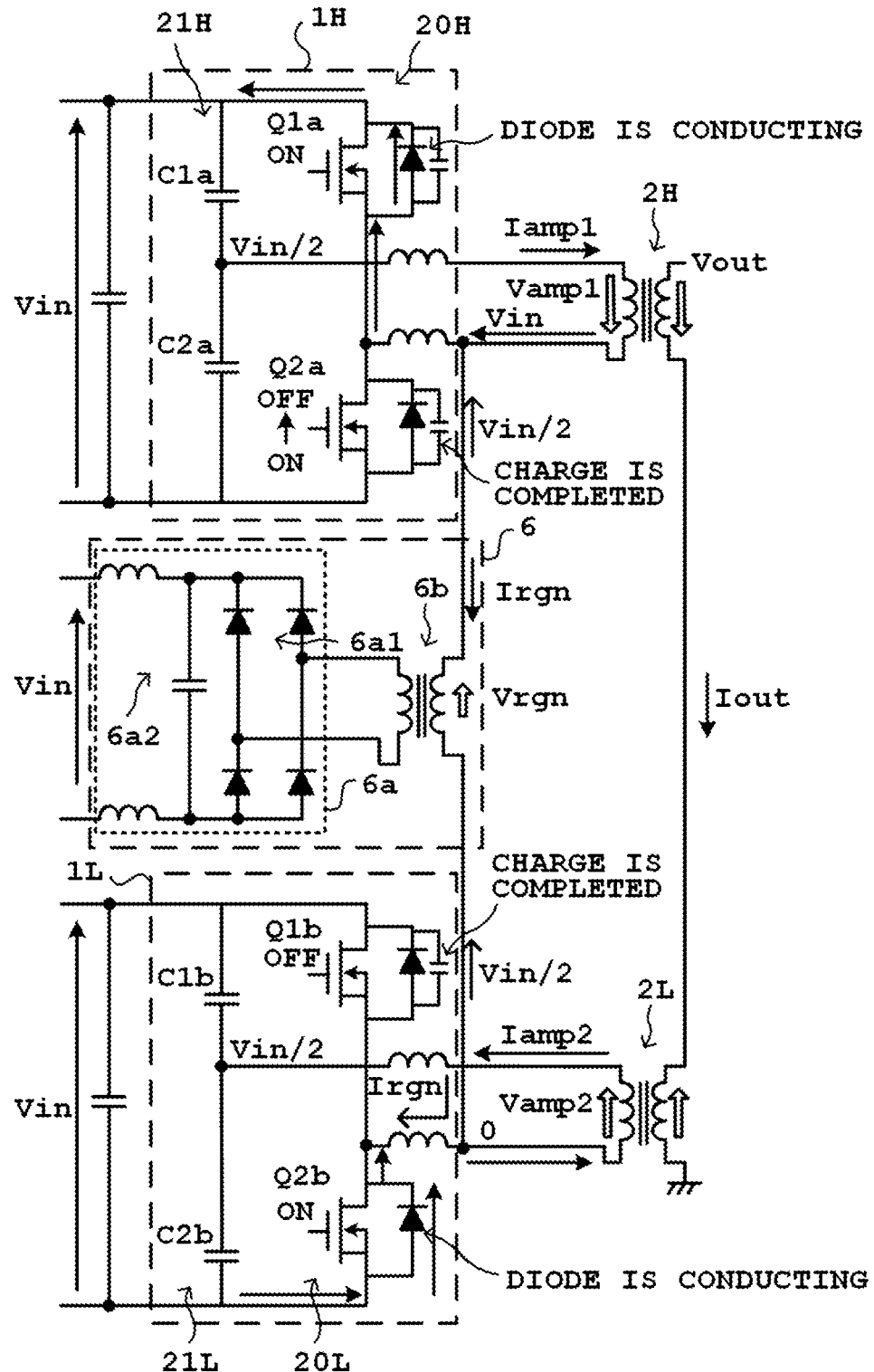
FIG. 8 illustrates an operation example (zone "A1") in the first configuration example of the power conversion device according to the present invention.
Figure 9:
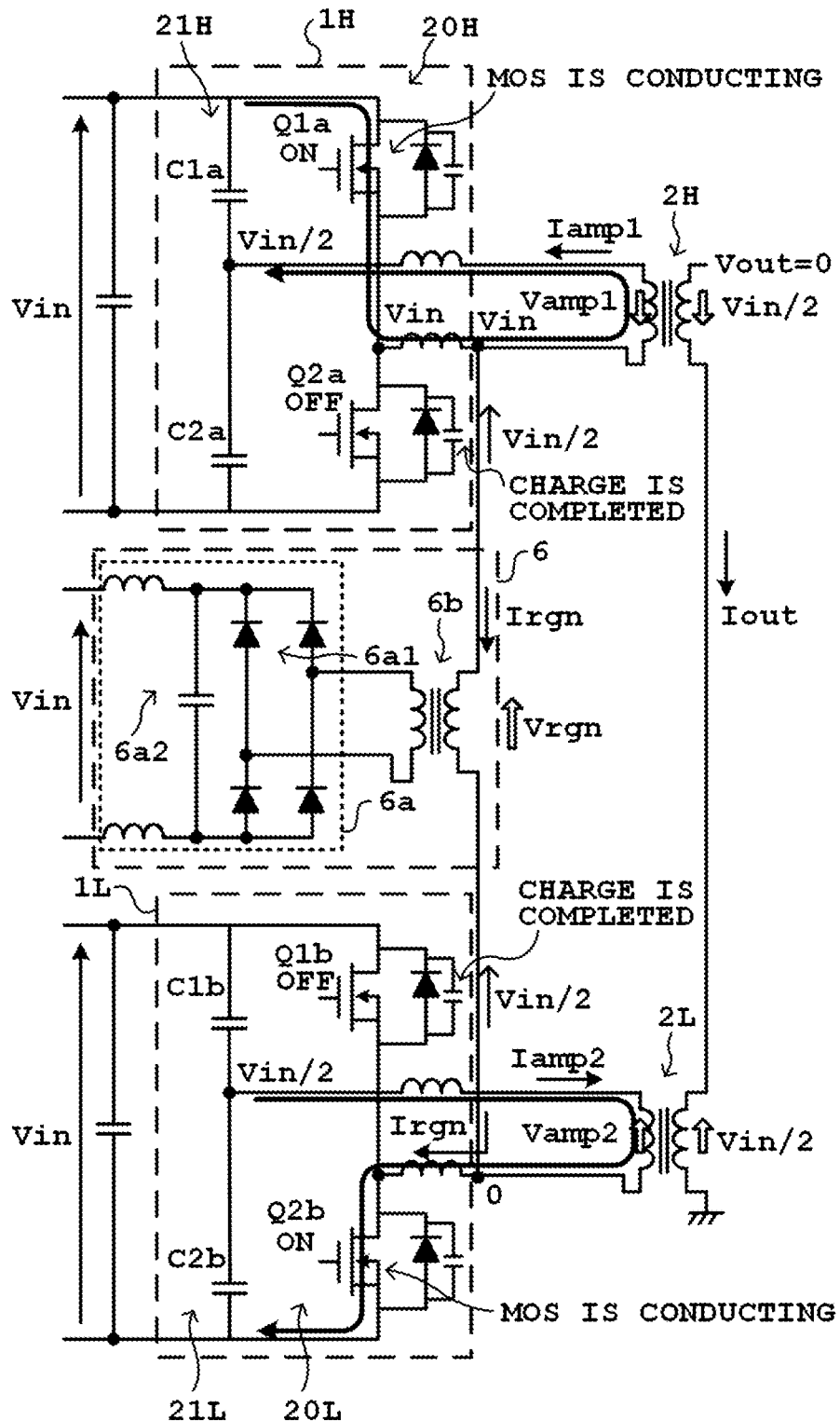
FIG. 9 illustrates an operation example (zone "A2") in the first configuration example of the power conversion device according to the present invention.

The zone "A" is divided into the zones "A1" and "A2", in which the directions of the current lamp differ from each other. FIG. 8 shows an operation example in the zone "A1", and FIG. 9 shows an operation example in the zone "A2". In the zone "A", the switching elements Q1a, Q2a, Q1b and Q2b are ON, OFF, OFF and ON, respectively.

(Zone "A1")

FIG. 8 shows the operation example in the zone "A1". In the zone "A1", the switching elements Q1a, Q2a, Q1b and Q2b are ON, OFF, OFF and ON, respectively.

(a) Switching Element Q1a:

The high-side switching element Q1a of the upper class-D amplifier 1H turns from off to on ("a1" in FIG. 7(a)). The discharge of an electric charge of a parasitic capacitance in the switching element Q1a is completed. However, a current flows via a parasitic diode of the switching element Q1a because energy of an inductance of a primary coil in the output transformer 2H keeps flowing. When the switching element Q1a turns from off to on, a discharge current is flowing in the switching element Q1a in the previous zone (H2) ("a2" in FIG. 7(b)), so that a displacement voltage dv/dt is limited and thus a displacement current di/dt is limited. It prevents the increase in a gate-to-source voltage Vgs, thereby avoiding erroneous turn-on of the other switching element Q2a in the same leg (pulse signal indicated by a broken line in FIG. 7(c)).

(b) Switching Element Q2a:

The low-side switching element Q2a of the upper class-D amplifier 1H is OFF. The charge of a parasitic capacitance in the switching element Q2a is completed at Vin/2.

(c) Switching Element Q1b:

The high-side switching element Q1b of the lower class-D amplifier 1L is OFF. The charge of a parasitic capacitance in the switching element Q1b is completed at Vin/2.

(d) Switching Element Q2b:

The low-side switching element Q2b of the lower class-D amplifier 1L is ON. A current flows via a parasitic diode of the switching element Q2b because energy of an inductance of a primary coil in the output transformer 2L keeps flowing.

(e) Regeneration Transformer 6b:

The voltage Vamp1 in the upper class-D amplifier 1H is at Vin/2 due to a potential difference between a potential Vin of a connection point between the high-side switching element Q1a and the low-side switching element Q2a and a midpoint potential Vin/2 of the capacitor voltage divider 21H. The voltage Vamp2 in the lower class-D amplifier 1L is at Vin/2 due to a potential difference between potential zero of a connection point between the high-side switching element Q1b and the low-side switching element Q2b and a midpoint potential Vin/2 of the capacitor voltage divider 21L. Thus, there is a potential difference between the voltages Vamp1 and Vamp2, and consequently an input voltage Vrgn is generated on an input terminal of the regeneration transformer 6b, thereby causing a current Irgn to flow.

(f) Output:

The output voltage Vamp1 in the upper class-D amplifier 1H and the output voltage Vamp2 in the lower class-D amplifier 1L are in mutually opposite directions, so that no output voltage Vout is generated.

The current Irgn flows to the regeneration transformer 6b of the regeneration circuit 6 to thereby implement the regeneration operation.

(Zone "A2")

FIG. 9 shows an operation example in the zone "A2". In the zone "A2", the switching elements Q1a, Q2a, Q1b and Q2b are ON, OFF, OFF and ON, respectively.

(a) Switching Element Q1a:

The high-side switching element Q1a of the upper class-D amplifier 1H is ON. A current flows through the switching element Q1a in the ON state. Since a switching element can employ a MOS transistor, FIG. 9 shows the current in the switching element Q1a as a MOS current.

(b) Switching Element Q2a:

The low-side switching element Q2a of the upper class-D amplifier 1H is OFF. The charge of the parasitic capacitance in the switching element Q2a is completed at Vin/2.

(c) Switching element Q1b:

The high-side switching element Q1b of the lower class-D amplifier 1L is OFF. The charge of the parasitic capacitance in the switching element Q1b is completed at Vin/2.

(d) Switching element Q2b:

The low-side switching element Q2b of the lower class-D amplifier 1L is ON. The current flows through the switching element Q2b in the ON state.

(e) Regeneration Transformer 6b:

The voltage Vamp1 in the upper class-D amplifier 1H is at Vin/2 due to a potential difference between the potential Vin of the connection point between the high-side switching element Q1a and the low-side switching element Q2a and the midpoint potential Vin/2 of the capacitor voltage divider 21H. The voltage Vamp2 in the lower class-D amplifier 1L is at Vin/2 due to the potential difference between potential zero of the connection point between the high-side switching element Q1b and the low-side switching element Q2b and a midpoint potential Vin/2 of the capacitor voltage divider 21L. Thus, there is a potential difference between the voltages Vamp1 and Vamp2, and consequently the input voltage Vrgn is generated on the input terminal of the regeneration transformer 6b, thereby causing the current Irgn to flow.

(f) Output:

The output voltage Vamp1 in the upper class-D amplifier 1H and the output voltage Vamp2 in the lower class-D amplifier 1L are in mutually opposite directions, so that no output voltage Vout is generated.

(g) Regeneration:

The current Irgn flows to the regeneration transformer 6b of the regeneration circuit 6 to thereby implement the regeneration operation.

(Zone "B")

Figure 10:
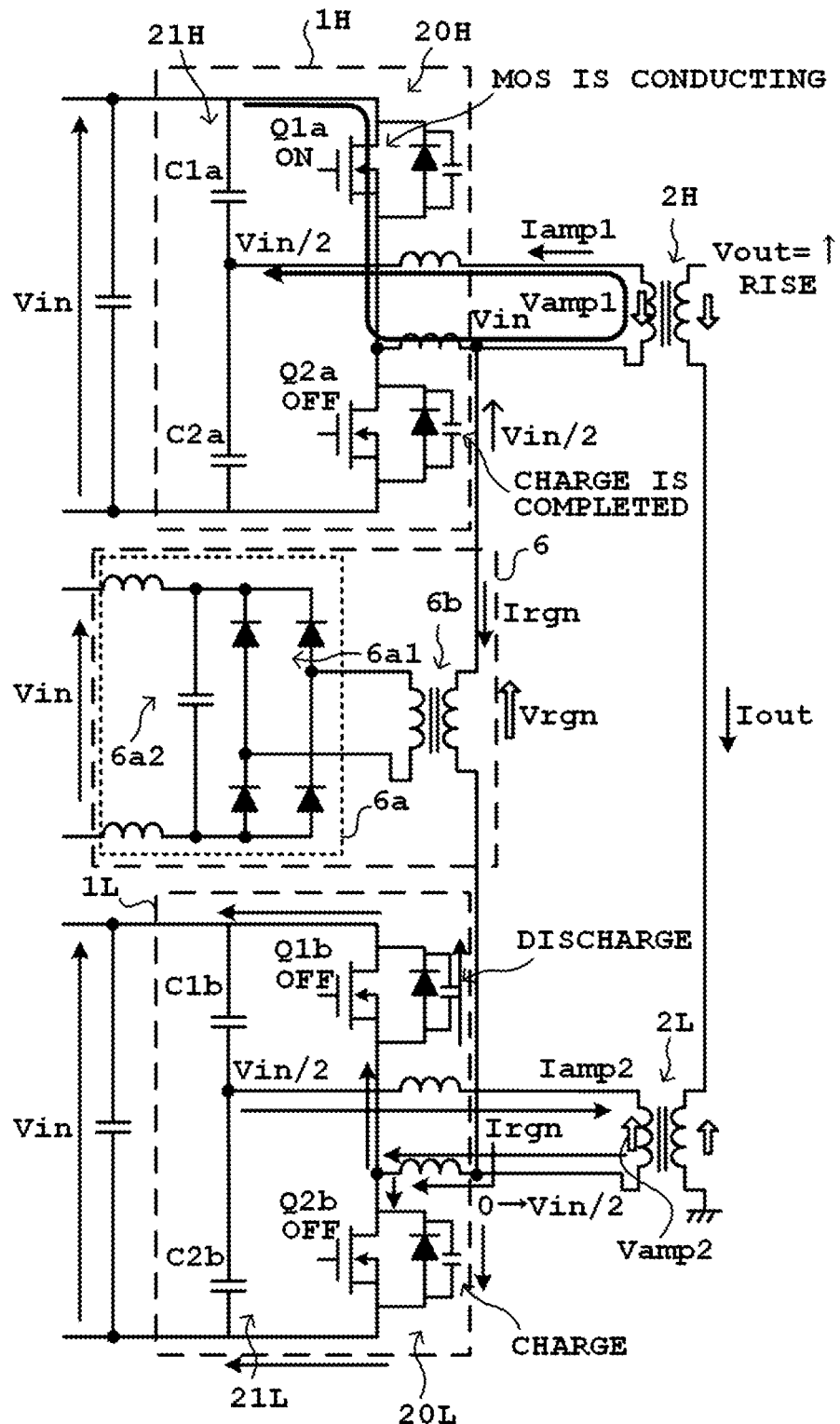
FIG. 10 illustrates an operation example (zone "B1") in the first configuration example of the power conversion device according to the present invention.
Figure 11:
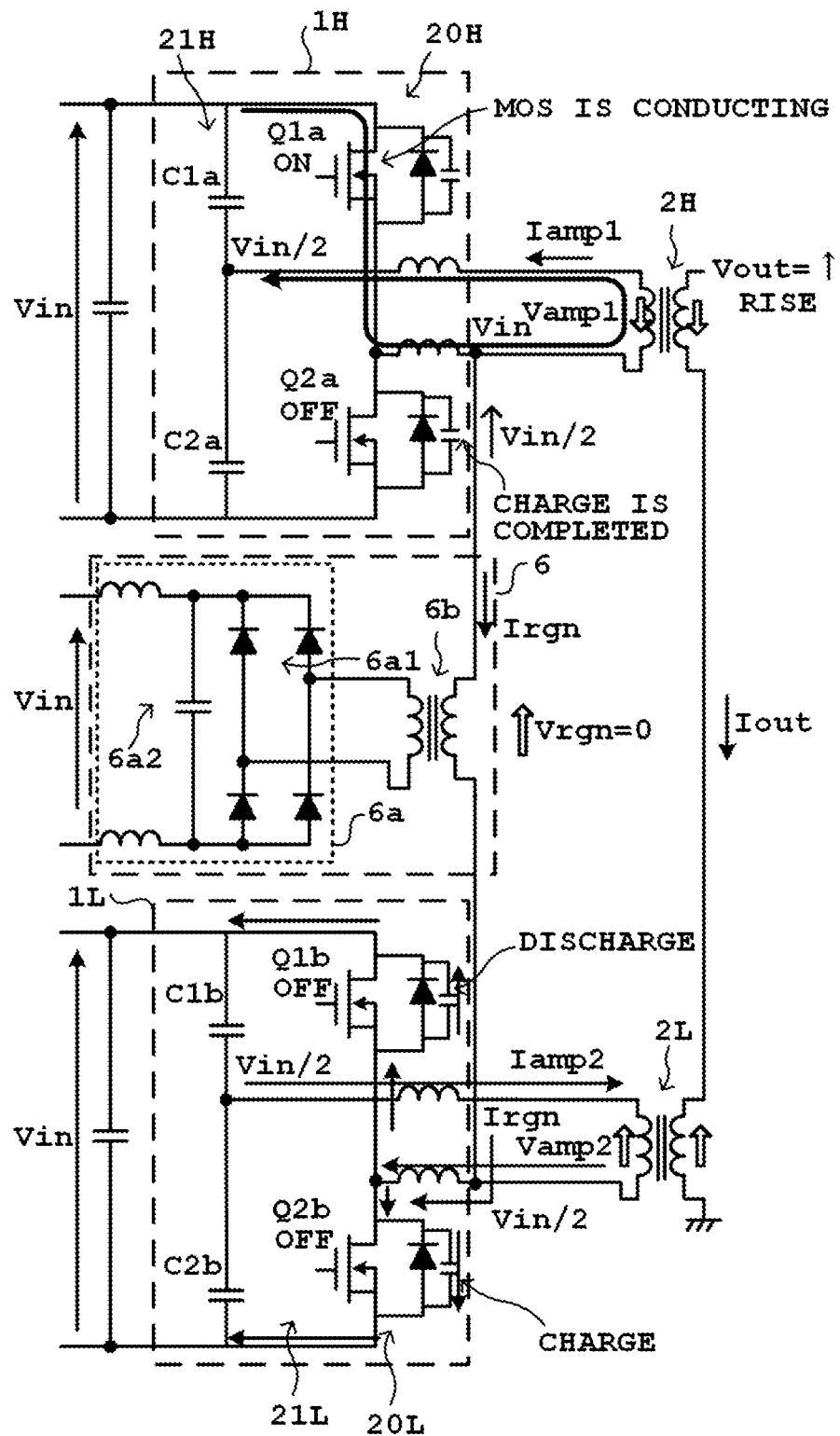
FIG. 11 illustrates an operation example (zone "B2") in the first configuration example of the power conversion device according to the present invention.

The zone "B" is divided into a zone "B1" and a zone "B2", in which the voltage Vamp and the current Iamp are in mutually opposite directions. FIG. 10 shows an operation example in the zone "B1", and FIG. 11 shows an operation example in the zone "B2". In the zone "B", the switching elements Q1a, Q2a, Q1b and Q2b are ON, OFF, OFF and OFF, respectively. The zone "B" is a dead time zone where both of the switching element Q1b and the switching element Q2b are OFF.

(Zone "B1")

(a) Switching Element Q1a:

The high-side switching element Q1a of the upper class-D amplifier 1H is ON. The current flows to the switching element Q1a in the ON state (this current is indicated as a MOS current in FIG. 10).

(b) Switching Element Q2a:

The low-side switching element Q2a of the upper class-D amplifier 1H is OFF. The charge of a parasitic capacitance in the switching element Q2a is completed at Vin/2.

(c) Switching Element Q1b:

The high-side switching element Q1b of the lower class-D amplifier 1L is OFF. Although the low-side switching element Q2b turns off, the discharge of an electric charge of a parasitic capacitance in the switching element Q1b is started because the energy of the inductance of the primary coil in the output transformer 2L keeps flowing.

(d) Switching Element Q2b:

The low-side switching element Q2b of the lower class-D amplifier 1L turns from on to off. Thus, the current charged from the high-side switching element Q1b and the current Irgn cause the discharge of an electric charge of the parasitic capacitance in the switching element Q2b.

(e) Regeneration Transformer 6b:

The voltage Vamp1 in the upper class-D amplifier 1H is at Vin/2 due to a potential difference between a potential Vin of the connection point between the high-side switching element Q1a and the low-side switching element Q2a and the midpoint potential Vin/2 of the capacitor voltage divider 21H. The voltage Vamp2 in the lower class-D amplifier 1L changes from −Vin/2 to zero due to a potential difference between a potential that increases from zero toward Vin/2 at the connection point between the high-side switching element Q1b and the low-side switching element Q2b and the midpoint potential Vin/2 of the capacitor voltage divider 21L. Thus, there is a potential difference between the voltages Vamp1 and Vamp2, and consequently the input voltage Vrgn is generated on the input terminal of the regeneration transformer 6b, thereby causing the current Irgn to flow.

(f) Output:

The output voltage Vamp1 in the upper class-D amplifier 1H and the output voltage Vamp2 in the lower class-D amplifier 1L increase to thereby generate an output current Tout.

(g) Regeneration:

The current Irgn flows to the regeneration transformer 6b of the regeneration circuit 6 to thereby implement the regeneration operation.

(Zone "B2")

(a) Switching Element Q1a:

The high-side switching element Q1a of the upper class-D amplifier 1H is ON. A current flows to the switching element Q1a in the ON state (this current is indicated as a MOS current in FIG. 11).

(b) Switching Element Q2a:

The low-side switching element Q2a of the upper class-D amplifier 1H is OFF. The charge of the parasitic capacitance in the switching element Q2a is completed at Vin/2.

(c) Switching Element Q1b:

The high-side switching element Q1b of the lower class-D amplifier 1L is OFF. The discharge of an electric charge, the charging of which was started in the zone "B2", in the parasitic capacitance in the switching element Q1b is completed.

(d) Switching Element Q2b:

The charge of the electric charge in the parasitic capacitance in the low-side switching element Q2b of the lower class-D amplifier 1L is completed by the discharge current discharged from the high-side switching element Q1b and the current Irgn.

The current Irgn is used as an auxiliary current to supplement discharging/charging of the parasitic capacitances of the switching element Q1b and the switching element Q2b ("c2" in FIG. 7(f) and "c3" in FIG. 7(k)), so as to reduce a drain-to-source displacement voltage dv/dt, thereby preventing erroneous turn-on of a gate between the zone "B2" and the zone "C".

(e) Regeneration Transformer 6b:

The voltage Vamp1 in the upper class-D amplifier 1H is at Vin/2 due to a potential difference between the potential Vin of the connection point between the high-side switching element Q1a and the low-side switching element Q2a and the midpoint potential Vin/2 of the capacitor voltage divider 21H. The voltage Vamp2 in the lower class-D amplifier 1L changes from zero to Vin/2 due to a potential difference between a potential that increases from zero toward Vin/2 at the connection point between the high-side switching element Q1b and the low-side switching element Q2b and the midpoint potential Vin/2 of the capacitor voltage divider 21L. Thus, there is a potential difference between the voltages Vamp1 and Vamp2, and consequently the input voltage Vrgn is generated on the input terminal of the regeneration transformer 6b, thereby causing the current Irgn to flow.

(f) Output:

The output voltage Vamp1 in the upper class-D amplifier 1H and the output voltage Vamp2 in the lower class-D amplifier 1L increase to thereby generate an output current Iout.

(g) Regeneration:

The current Irgn flows to the regeneration transformer 6b of the regeneration circuit 6 to thereby implement the regeneration operation.

(Zone "C")

Figure 12:
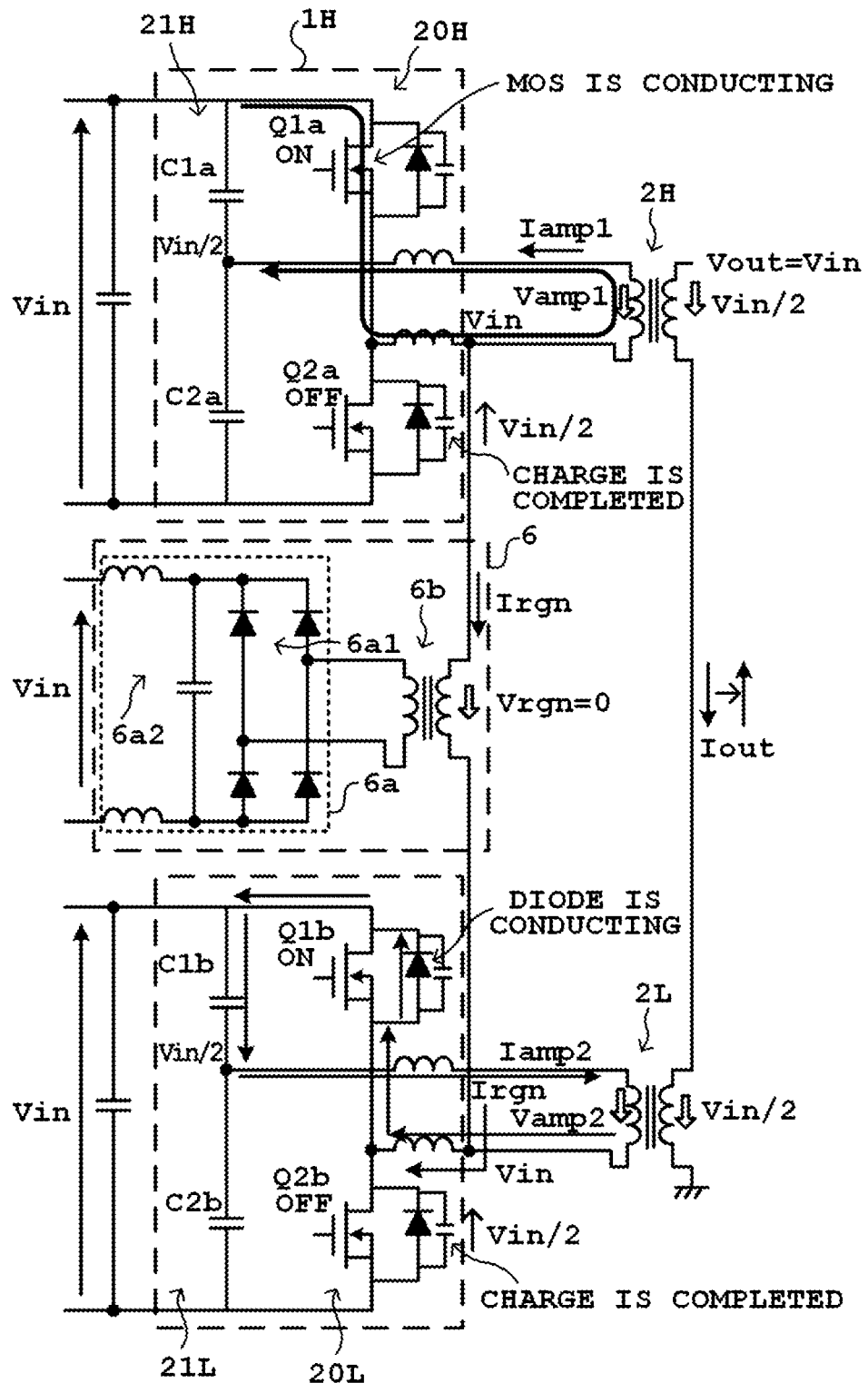
FIG. 12 illustrates an operation example (zone "C") in the first configuration example of the power conversion device according to the present invention.

FIG. 12 shows the operation example in the zone "C". In the zone "C", the switching elements Q1a, Q2a, Q1b and Q2b are ON, OFF, ON and OFF, respectively.

(a) Switching element Q1a:

The high-side switching element Q1a of the upper class-D amplifier 1H is ON. The current flows to the switching element Q1a in the ON state (this current is indicated as a MOS current in FIG. 12).

(b) Switching Element Q2a:

The low-side switching element Q2a of the upper class-D amplifier 1H is OFF. The charge of the parasitic capacitance in the switching element Q2a is completed at Vin/2.

(c) Switching Element Q1b:

The high-side switching element Q1b of the lower class-D amplifier 1L turns from off to on ("c1" in FIG. 7(e)). The discharge of the electric charge of the parasitic capacitance in the switching element Q1b is completed. However, a current flows via the parasitic diode of the switching element Q1b because the energy of the inductance of the primary coil in the output transformer 2L keeps flowing.

When the switching element Q1b turns from off to on, the discharge current flows in the switching element Q1b in the previous zone (B2) ("c2" in FIG. 7(f)), so that the displacement voltage dv/dt is limited and thus the displacement current di/dt is limited. It prevents the increase in the gate-to-source voltage Vgs, thereby avoiding erroneous turn-on of the other switching element Q2b in the same leg (pulse signal indicated by a broken line in FIG. 7(g)).

(d) Switching Element Q2b:

The low-side switching element Q2b of the lower class-D amplifier 1L is OFF. The charge of the parasitic capacitance in the switching element Q2b is completed at Vin/2.

(e) Regeneration Transformer 6b:

The voltage Vamp1 in the upper class-D amplifier 1H is at Vin/2 due to a potential difference between the potential Vin of the connection point between the high-side switching element Q1a and the low-side switching element Q2a and the midpoint potential Vin/2 of the capacitor voltage divider 21H. The voltage Vamp2 in the lower class-D amplifier 1L is at Vin/2 due to the potential difference between the potential Vin of the connection point between the high-side switching element Q1b and the low-side switching element Q2b and the midpoint potential Vin/2 of the capacitor voltage divider 21L. Thus, there is no potential difference between the voltages Vamp1 and Vamp2, and consequently no input voltage Vrgn is generated on the input terminal of the regeneration transformer 6b, and the flow of the current Irgn is not caused by the input voltage Vrgn.

(f) Output:

The output voltage Vamp1 in the upper class-D amplifier 1H and the output voltage Vamp2 in the lower class-D amplifier 1L generate the output voltage Vout.

(g) Regeneration:

There is no current flow in the regeneration transformer 6b of the regeneration circuit 6 due to the potential difference between the voltages Vamp1 and Vamp2. Instead, the energy of the leakage inductance causes the flow of the current Irgn ("c3" in FIG. 7(k)), thereby implementing the regeneration operation.

(Zone "D")

Figure 13:
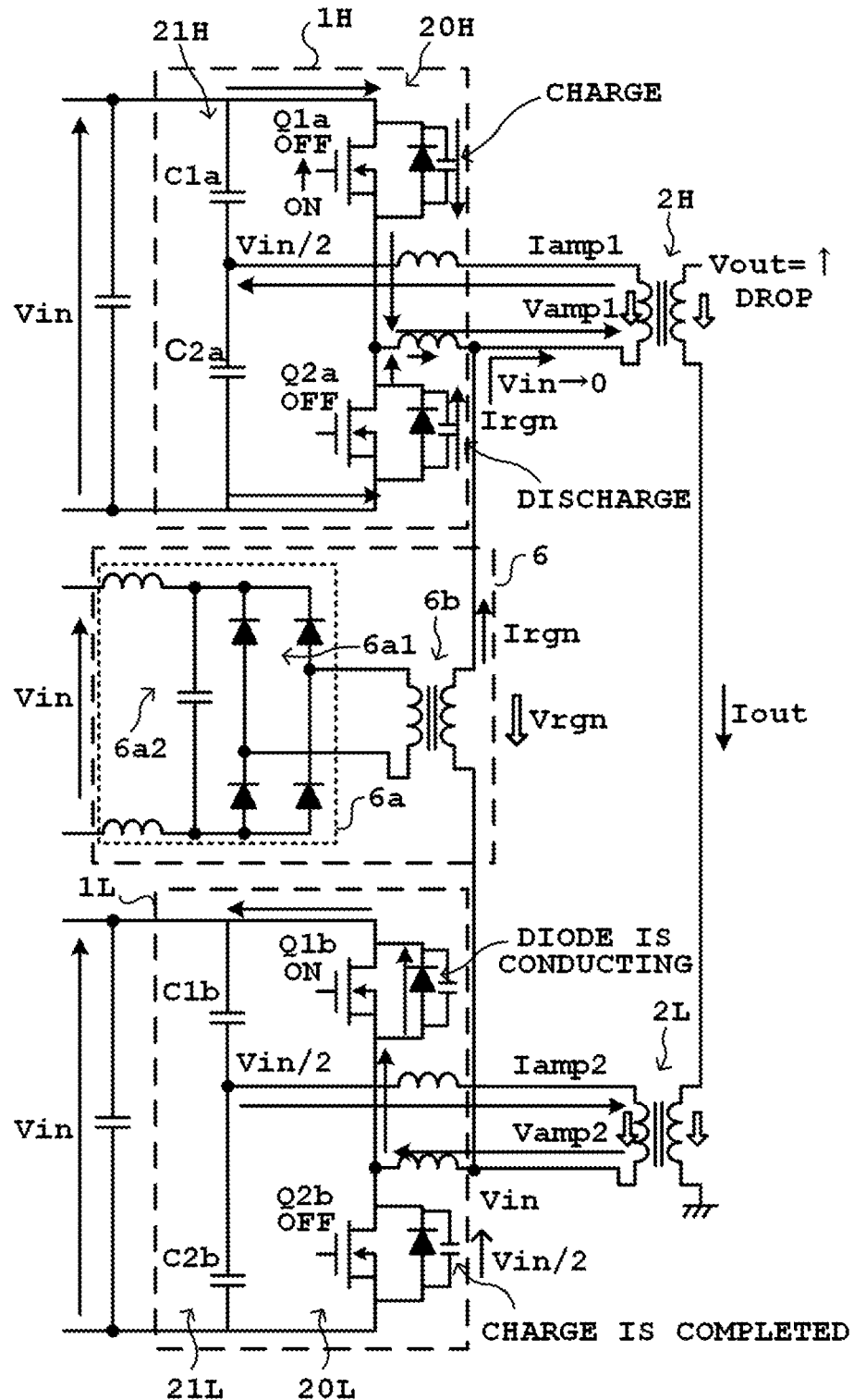
FIG. 13 illustrates an operation example (zone "D1") in the first configuration example of the power conversion device according to the present invention.
Figure 14:
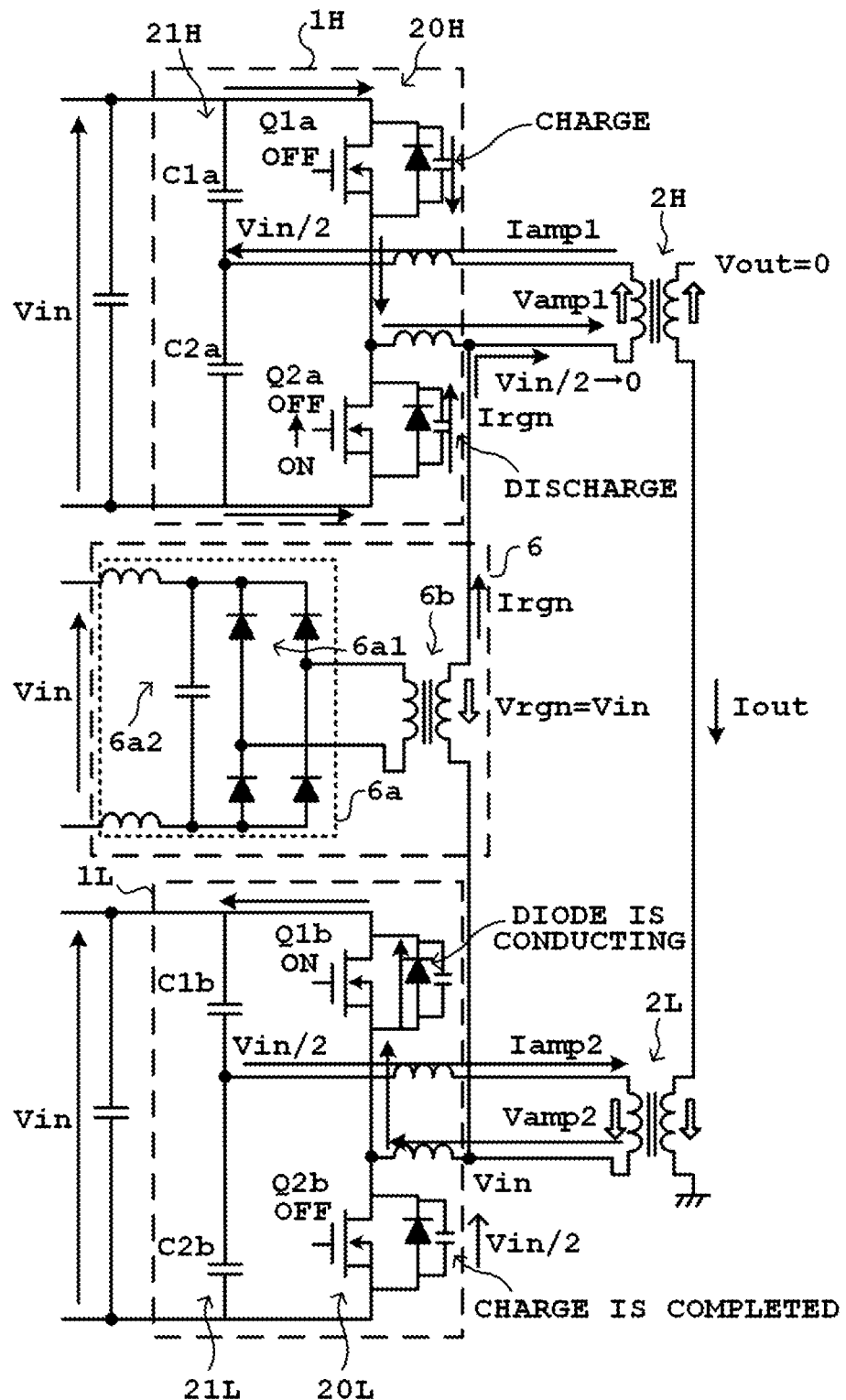
FIG. 14 illustrates an operation example (zone "D2") in the first configuration example of the power conversion device according to the present invention.

The zone "D" has a different direction of the current lamp, and is divided into a zone "D1" and a zone "D2", between these zones the sign of the voltage Vamp changes. FIG. 13 shows an operation example in the zone "D1", and FIG. 14 shows an operation example in the zone "D2". In the zone "D", the switching elements Q1a, Q2a, Q1b and Q2b are OFF, OFF, ON and OFF, respectively. Furthermore, the zone "D" is a dead time zone where both of the switching element Q1a and the switching element Q2a are OFF.

(Zone "D1")

FIG. 13 shows the operation example in the zone "D1". In the zone "D1", the switching elements Q1a, Q2a, Q1b and Q2b are OFF, OFF, ON and OFF, respectively.

(a) Switching Element Q1a:

The high-side switching element Q1a of the upper class-D amplifier 1H turns from on to off.

Since the high-side switching element Q1a of the upper class-D amplifier 1H turns from on to off, the current discharged from the low-side switching element Q2a and the current Irgn initiate the charge of the electric charge in the parasitic capacitance of the switching element Q1a.

(b) The Low-Side Switching Element Q2a of the Upper Class-D amplifier 1H is OFF. Although the high-side switching element Q1a turns off, the energy of the inductance of the primary coil in the output transformer 2H keeps flowing, so that the discharge of the electric charge charged in the parasitic capacitance of the switching element Q2a is started.

(c) Switching Element Q1b:

The high-side switching element Q1b of the lower class-D amplifier 1L is ON. Following the zone "C", the energy of the inductance of the primary coil in the output transformer 2L keeps flowing, so that the current keeps flowing via the parasitic diode of the switching element Q1b.

(d) Switching Element Q2b:

The low-side switching element Q2b of the lower class-D amplifier 1L is OFF. The charge of the parasitic capacitance of the switching element Q2b is completed at Vin/2.

(e) Regeneration Transformer 6b:

A potential of the connection point between the high-side switching element Q1a and the low-side switching element Q2a changes from Vin to Vin/2. Due to a potential difference between the above potential change and the midpoint potential Vin/2 of the capacitor voltage divider 21H, the voltage Vamp1 in the upper class-D amplifier 1H changes from Vin/2 to zero.

The voltage Vamp2 in the lower class-D amplifier 1L is at Vin/2 due to a potential difference between the potential Vin of the connection point between the high-side switching element Q1b and the low-side switching element Q2b and the midpoint potential Vin/2 of the capacitor voltage divider 21L. Thus, there is a potential difference between the voltages Vamp1 and Vamp2, and consequently the input voltage Vrgn is generated on the input terminal of the regeneration transformer 6b, thereby causing the current Irgn to flow.

(f) Output:

The output voltage Vamp1 in the upper class-D amplifier 1H and the output voltage Vamp2 in the lower class-D amplifier 1L generate the output voltage Vout. The output voltage Vout drops from Vin.

(g) Regeneration:

The current Irgn flows to the regeneration transformer 6b of the regeneration circuit 6 to thereby implement the regeneration operation.

(Zone "D2")

FIG. 14 shows an operation example in the zone "D2". In the zone "D2", the switching elements Q1a, Q2a, Q1b and Q2b are OFF, OFF, ON and OFF, respectively.

(a) Switching Element Q1a:

The high-side switching element Q1a of the upper class-D amplifier 1H turns from on to off.

The discharge current in the low-side switching element Q2a and the current Irgn cause the charge of the electric charge in the parasitic capacitance of the high-side switching element Q1a of the upper class-D amplifier 1H.

The current Irgn is used as an auxiliary current to supplement discharging/charging of the parasitic capacitances of the switching element Q1a and the switching element Q2a ("b2" in FIG. 7(d) and "b3" in FIG. 7(k)), so as to reduce the drain-to-source displacement voltage dv/dt, thereby avoiding erroneous turn-on of a gate between the zone "D2" and the zone "E1".

(b) Switching Element Q2a:

The low-side switching element Q2a of the upper class-D amplifier 1H is OFF. Following the zone "D1", the energy in the inductance of the primary coil in the output transformer 2H keeps flowing to the switching element Q2a, and thereby the electric charge charged in the parasitic capacitance of the switching element Q2a is discharged.

(c) Switching Element Q1b:

The high-side switching element Q1b of the lower class-D amplifier 1L is ON. Following the zone "D1", the energy in the inductance of the primary coil in the output transformer 2L keeps flowing, and thereby the current flows via the parasitic diode of the switching element Q1b.

(d) Switching Element Q2b:

The low-side switching element Q2b of the lower class-D amplifier 1L is OFF. The charge of the parasitic capacitance of the switching element Q2b is completed at Vin/2.

(e) Regeneration Transformer 6b:

The potential of the connection point between the high-side switching element Q1a and the low-side switching element Q2a changes from Vin/2 to zero. A potential difference between the above potential change and the midpoint potential Vin/2 of the capacitor voltage divider 21H causes the change in the voltage Vamp1 in the upper class-D amplifier 1H from zero to −Vin/2.

The voltage Vamp2 in the lower class-D amplifier 1L is at Vin/2 due to a potential difference between the potential Vin of the connection point between the high-side switching element Q1b and the low-side switching element Q2b and the midpoint potential Vin/2 of the capacitor voltage divider 21L. Thus, there is a potential difference between the voltages Vamp1 and Vamp2, and consequently the input voltage Vrgn is generated on the input terminal of the regeneration transformer 6b, thereby causing the current Irgn to flow.

(f) Output:

The output voltage Vamp1 in the upper class-D amplifier 1H and the output voltage Vamp2 in the lower class-D amplifier 1L generate the output voltage Vout. The output voltage Vout drops from Vin/2 toward zero.

(g) Regeneration:

The current Irgn flows to the regeneration transformer 6b of the regeneration circuit 6 ("b3" in FIG. 7(k)) to thereby implement the regeneration operation.

(Zone "E")

Figure 15:
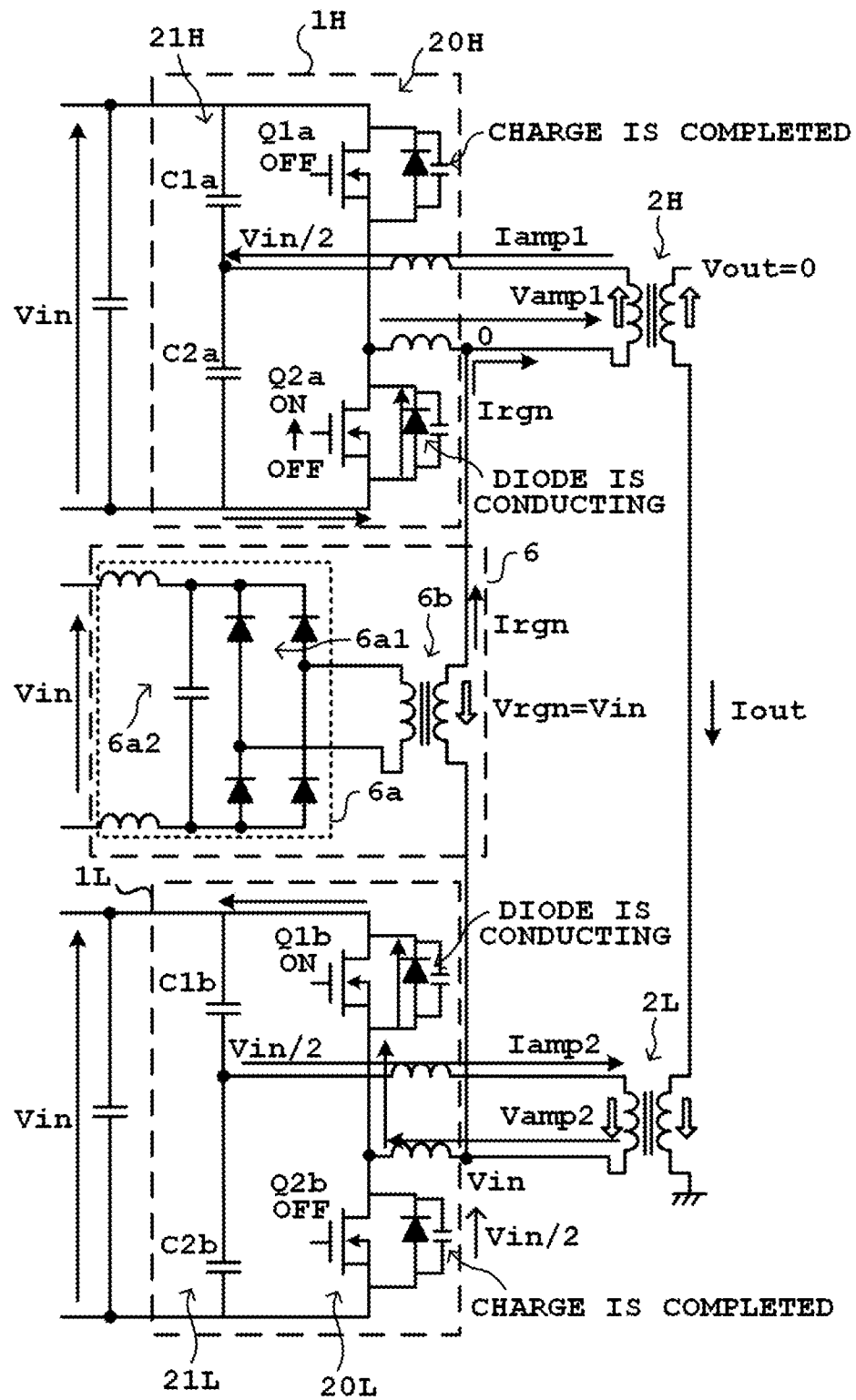
FIG. 15 illustrates an operation example (zone "E1") in the first configuration example of the power conversion device according to the present invention.
Figure 16:
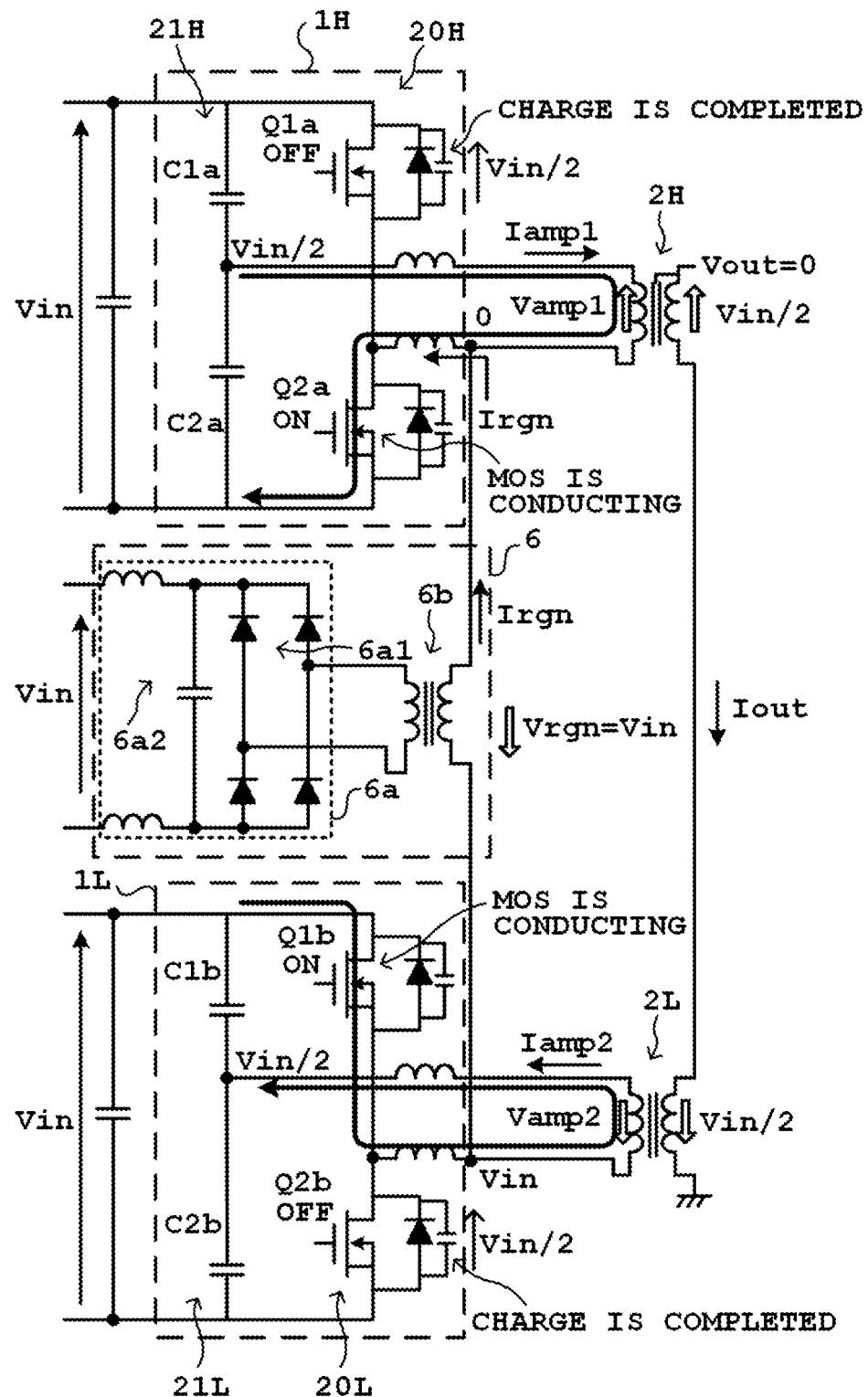
FIG. 16 illustrates an operation example (zone "E2") in the first configuration example of the power conversion device according to the present invention.

The zone "E" is divided into a zone "E1" and a zone "E2", each zone having mutually opposite directions of the current lamp. FIG. 15 shows an operation example in the zone "E1", and FIG. 16 shows an operation example in the zone "E2". In the zone "E", the switching elements Q1a, Q2a, Q1b and Q2b are OFF, ON, ON and OFF, respectively.

(Zone "E1")

FIG. 15 shows the operation example in the zone "E1". In the zone "E1", the switching elements Q1a, Q2a, Q1b and Q2b are OFF, ON, ON and OFF, respectively.

(a) Switching Element Q1a:

The high-side switching element Q1a of the upper class-D amplifier 1H is OFF. Following the charging operation in the zone "D2", due to the discharge current of the low-side switching element Q2a and the current Irgn, the discharge of the electric charge in the parasitic capacitance of the high-side switching element Q1a of the upper class-D amplifier 1H is completed.

(b) Switching Element Q2a:

The low-side switching element Q2a of the upper class-D amplifier 1H turns from off to on ("b1" in FIG. 7(c)). Although the discharge of the electric charge in the parasitic capacitance of the switching element Q1b is completed, the current flows via the parasitic diode of the switching element Q2a because the energy in the inductance of the primary coil in the output transformer 2H keeps flowing.

When the switching element Q2a turns from off to on, the discharge current is flowing in the switching element Q2a in the previous zone (D2) ("b2" in FIG. 7(d)), so that the displacement voltage dv/dt is limited and thus the displacement current di/dt is limited. It prevents the increase in the gate-to-source voltage Vgs, thereby avoiding erroneous turn-on of the other switching element Q1a in the same leg (pulse signal indicated by a broken line in FIG. 7(a)).

(c) Switching Element Q1b:

The high-side switching element Q1b of the lower class-D amplifier 1L is ON. Following the zone "D2", the energy in the inductance of the primary coil in the output transformer 2L keeps flowing, and thereby the current flows via the parasitic diode of the switching element Q1b.

(d) Switching Element Q2b:

The low-side switching element Q2b of the lower class-D amplifier 1L is OFF. The charge of the parasitic capacitance of the switching element Q2b is completed at Vin/2.

(e) Regeneration Transformer 6b:

The potential of the connection point between the high-side switching element Q1a and the low-side switching element Q2a is zero. Due to a potential difference between the zero potential of the connection point and the midpoint potential Vin/2 of the capacitor voltage divider 21H, the voltage Vamp1 in the upper class-D amplifier 1H is at −Vin/2.

The voltage Vamp2 in the lower class-D amplifier 1L is at Vin/2 due to a potential difference between the potential Vin of the connection point between the high-side switching element Q1b and the low-side switching element Q2b and the midpoint potential Vin/2 of the capacitor voltage divider 21L. Thus, there is a potential difference between the voltages Vamp1 and Vamp2, and consequently the input voltage Vrgn is generated on the input terminal of the regeneration transformer 6b, thereby causing the current Irgn to flow.

(f) Output:

The output voltage Vamp1 in the upper class-D amplifier 1H and the output voltage Vamp2 in the lower class-D amplifier 1L are in mutually opposite directions, and thus no output voltage Vout is generated.

(g) Regeneration:

The current Irgn flows to the regeneration transformer 6b of the regeneration circuit 6 to thereby implement the regeneration operation.

(Zone "E2")

FIG. 16 shows the operation example in the zone "E2". In the zone "E2", the switching elements Q1a, Q2a, Q1b and Q2b are OFF, ON, ON and OFF, respectively.

(a) Switching Element Q1a:

The high-side switching element Q1a of the upper class-D amplifier 1H is OFF. The charge of the electric charge in the parasitic capacitance of the switching element Q1a is completed.

(b) Switching Element Q2a:

The low-side switching element Q2a of the upper class-D amplifier 1H is ON. The commutation of the energy in the inductance of the primary coil in the output transformer 2H is finished, and thereby the current flows to the switching element Q2a.

(c) Switching Element Q1b:

The high-side switching element Q1b of the lower class-D amplifier 1L is ON. The commutation of the energy in the inductance of the primary coil in the output transformer 2L is finished, and thereby the current flows to the switching element Q1b.

(d) Switching Element Q2b:

The low-side switching element Q2b of the lower class-D amplifier 1L is OFF. The charge of the parasitic capacitance of the switching element Q2b is completed at Vin/2.

(e) Regeneration Transformer 6b:

The potential of the connection point between the high-side switching element Q1a and the low-side switching element Q2a is zero. Due to a potential difference between the zero potential of the connection point and the midpoint potential Vin/2 of the capacitor voltage divider 21H, the voltage Vamp1 in the upper class-D amplifier 1H is at −Vin/2.

The voltage Vamp2 in the lower class-D amplifier 1L is at Vin/2 due to a potential difference between the potential Vin of the connection point between the high-side switching element Q1b and the low-side switching element Q2b and the midpoint potential Vin/2 of the capacitor voltage divider 21L. Thus, there is a potential difference between the voltages Vamp1 and Vamp2, and consequently the input voltage Vrgn is generated on the input terminal of the regeneration transformer 6b, thereby causing the current Irgn to flow.

(f) Output:

The output voltage Vamp1 in the upper class-D amplifier 1H and the output voltage Vamp2 in the lower class-D amplifier 1L are in mutually opposite directions, and thus no output voltage Vout is generated.

(g) Regeneration:

The current Irgn flows to the regeneration transformer 6b of the regeneration circuit 6 to thereby implement the regeneration operation.

(Zone "F")

Figure 17:
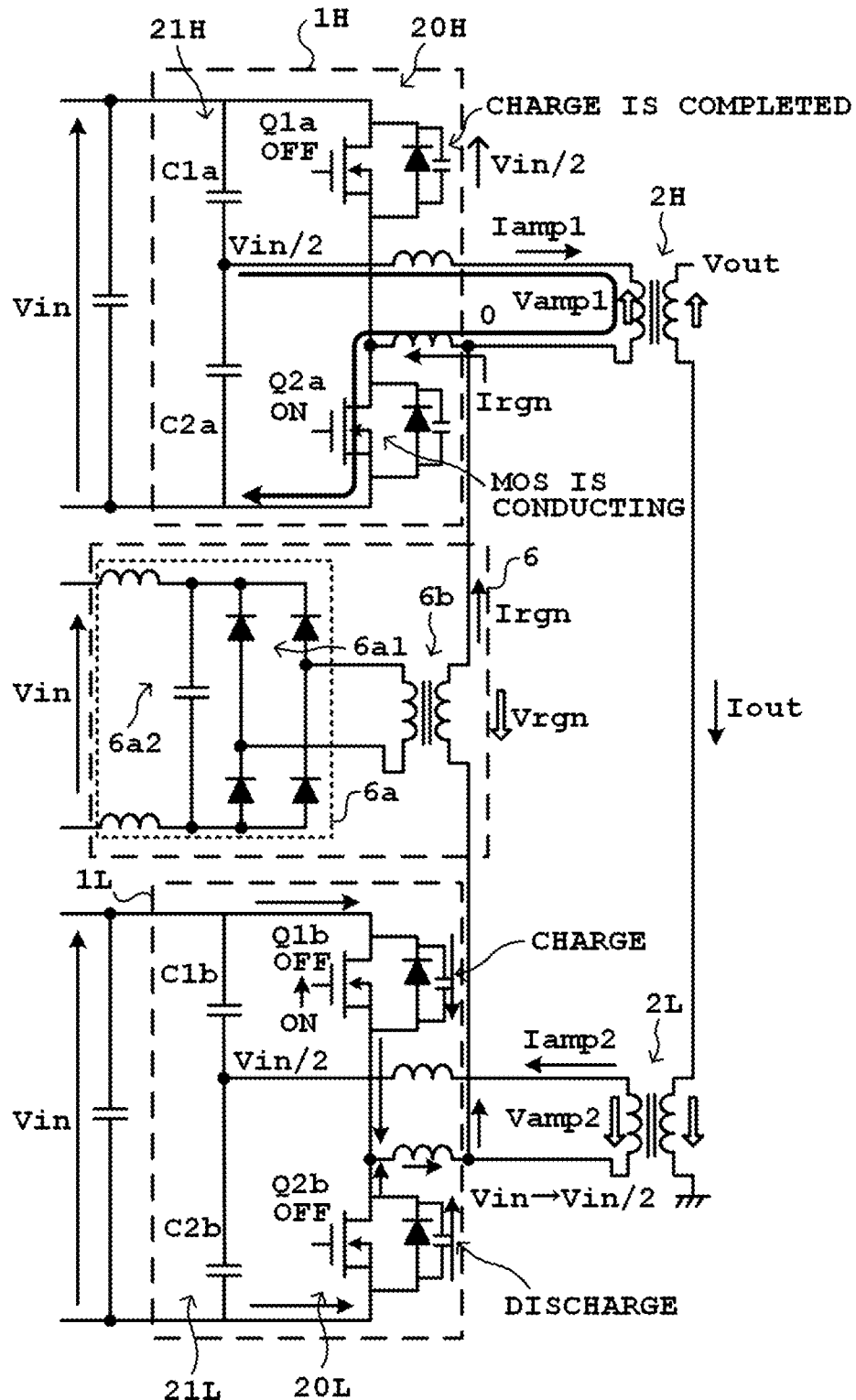
FIG. 17 illustrates an operation example (zone "F1") in the first configuration example of the power conversion device according to the present invention.
Figure 18:
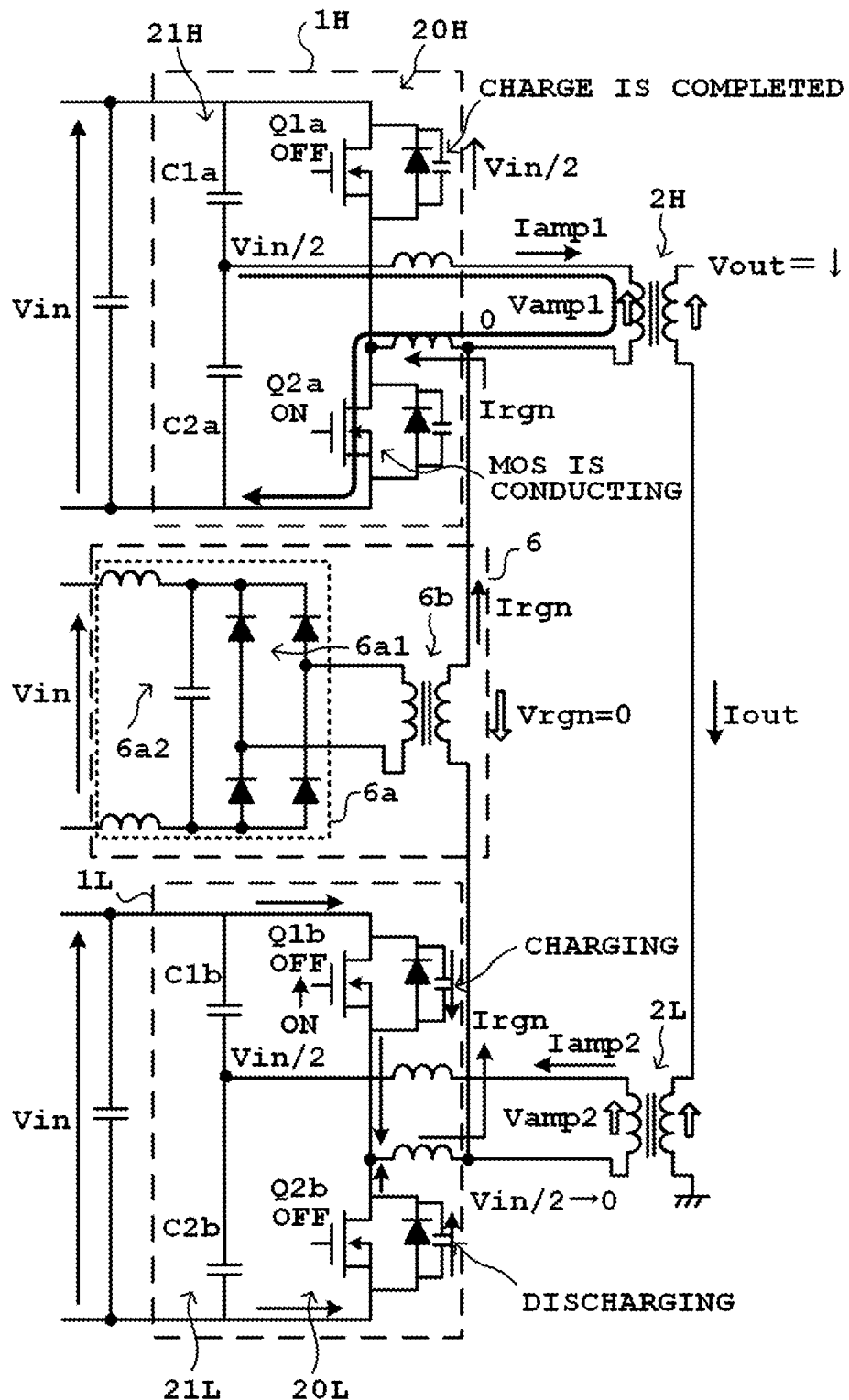
FIG. 18 illustrates an operation example (zone "F2") in the first configuration example of the power conversion device according to the present invention.

The zone "F" has a different direction of the current lamp, and is divided into a zone "F1" and a zone "F2", between these zones the sign of the voltage Vamp changes. FIG. 17 shows an operation example in the zone "F1", and FIG. 18 shows an operation example in the zone "F2". In the zone "F", the switching elements Q1a, Q2a, Q1b and Q2b are OFF, ON, OFF and OFF, respectively. Furthermore, the zone "F" is a dead time zone where both of the switching element Q1b and the switching Q2b are OFF.

(Zone "F1")

FIG. 17 shows the operation example in the zone "F1". In the zone "F1", the switching elements Q1a, Q2a, Q1b and Q2b are OFF, ON, OFF and OFF, respectively.

(a) Switching Element Q1a:

The high-side switching element Q1a of the upper class-D amplifier 1H is OFF. The charge of the electric charge in the parasitic capacitance of the switching element Q1a is completed.

(b) Switching Element Q2a:

The low-side switching element Q2a of the upper class-D amplifier 1H turns from off to on. The current (which is shown as the MOS current in FIG. 12) flows to the switching element Q1a in the ON state.

(c) Switching Element Q1b:

The high-side switching element Q1b of the lower class-D amplifier 1L turns from on to off. Since the high-side switching element Q1b of the lower class-D amplifier 1L turns from on to off, the discharge current of the low-side switching element Q2b and the current Irgn initiate the charge of the electric charge in the parasitic capacitance of the switching element Q1b.

(d) Switching Element Q2b:

The low-side switching element Q2b of the lower class-D amplifier 1L is OFF. Although the high-side switching element Q1b turns off, the discharge of the electric charge charged in the parasitic capacitance of the switching element Q2b is started because the energy in the inductance of the primary coil in the output transformer 2L keeps flowing.

(e) Regeneration Transformer 6b:

The potential of the connection point between the high-side switching element Q1a and the low-side switching element Q2a is zero. Thus, the voltage Vamp1 in the upper class-D amplifier 1H is at −Vin/2 due to a potential difference between the zero potential and the midpoint potential Vin/2 of the capacitor voltage divider 21H.

The potential of the connection point between the high-side switching element Q1b and the low-side switching element Q2b drops from Vin to Vin/2. Thus, the potential of the voltage Vamp2 in the lower class-D amplifier 1L changes from Vin to Vin/2 due to the potential difference between the potential of the connection point and the midpoint potential Vin/2 of the capacitor voltage divider 21L.

There is therefore a potential difference between the voltages Vamp1 and Vamp2, and consequently the input voltage Vrgn is generated on the input terminal of the regeneration transformer 6b, thereby causing the current Irgn to flow.

(f) Output:

The output voltage Vamp1 in the upper class-D amplifier 1H and the output voltage Vamp2 in the lower class-D amplifier 1L generates the output voltage Vout. The output voltage Vout drops from zero.

(g) Regeneration:

The current Irgn flows to the regeneration transformer 6b of the regeneration circuit 6 to thereby implement the regeneration operation.

(Zone "F2")

FIG. 18 shows an operation example in the zone "F2". In the zone "F2", the switching elements Q1a, Q2a, Q1b and Q2b are OFF, ON, OFF and OFF, respectively.

(a) Switching element Q1a:

The high-side switching element Q1a of the upper class-D amplifier 1H is OFF. The charge of the electric charge in the parasitic capacitance of the switching element Q1a is completed.

(b) Switching Element Q2a:

The low-side switching element Q2a of the upper class-D amplifier 1H is ON. The current (which is shown as the MOS current in FIG. 12) flows to the switching element Q1b in the ON state.

(c) Switching element Q1b:

The high-side switching element Q1b of the lower class-D amplifier 1L is OFF. The discharge current of the low-side switching element Q2b and the current Irgn cause the charge of the electric charge in the parasitic capacitance of the switching element Q1b.

The current Irgn is used as an auxiliary current to supplement discharging/charging of the parasitic capacitances of the switching element Q1b and the switching element Q2b (point "d2" in FIG. 7(h) and point "d3" in FIG. 7(k)) so as to reduce the drain-to-source displacement voltage dv/dt, thereby preventing erroneous turn-on of a gate between the zone "F2" and the zone "G".

(d) Switching Element Q2b:

The low-side switching element Q2b of the lower class-D amplifier 1L is OFF. Although the high-side switching element Q1b turns off, the discharge of the electric charge charged in the parasitic capacitance of the switching element Q2b is completed because the energy in the inductance of the primary coil in the output transformer 2L keeps flowing.

(e) Regeneration Transformer 6b:

The potential of the connection point between the high-side switching element Q1a and the low-side switching element Q2a is zero. Thus, the voltage Vamp1 in the upper class-D amplifier 1H is at −Vin/2 due to a potential difference between the zero potential and the midpoint potential Vin/2 of the capacitor voltage divider 21H.

The potential of the connection point between the high-side switching element Q1b and the low-side switching element Q2b drops from Vin/2 to zero. Thus, the potential of the voltage Vamp2 in the lower class-D amplifier 1L changes from zero to −Vin/2 due to the potential difference between the potential of the connection point and the midpoint potential Vin/2 of the capacitor voltage divider 21L.

There is therefore a potential difference between the voltages Vamp1 and Vamp2, and consequently the input voltage Vrgn is generated on the input terminal of the regeneration transformer 6b, thereby causing the current Irgn to flow. The input voltage Vrgn decreases toward zero.

(f) Output:

The output voltage Vamp1 in the upper class-D amplifier 1H and the output voltage Vamp2 in the lower class-D amplifier 1L generates the output voltage Vout. The output voltage Vout is at −Vin.

(g) Regeneration:

The current Irgn flows to the regeneration transformer 6b of the regeneration circuit 6 to thereby implement the regeneration operation.

(Zone "G")

Figure 19:
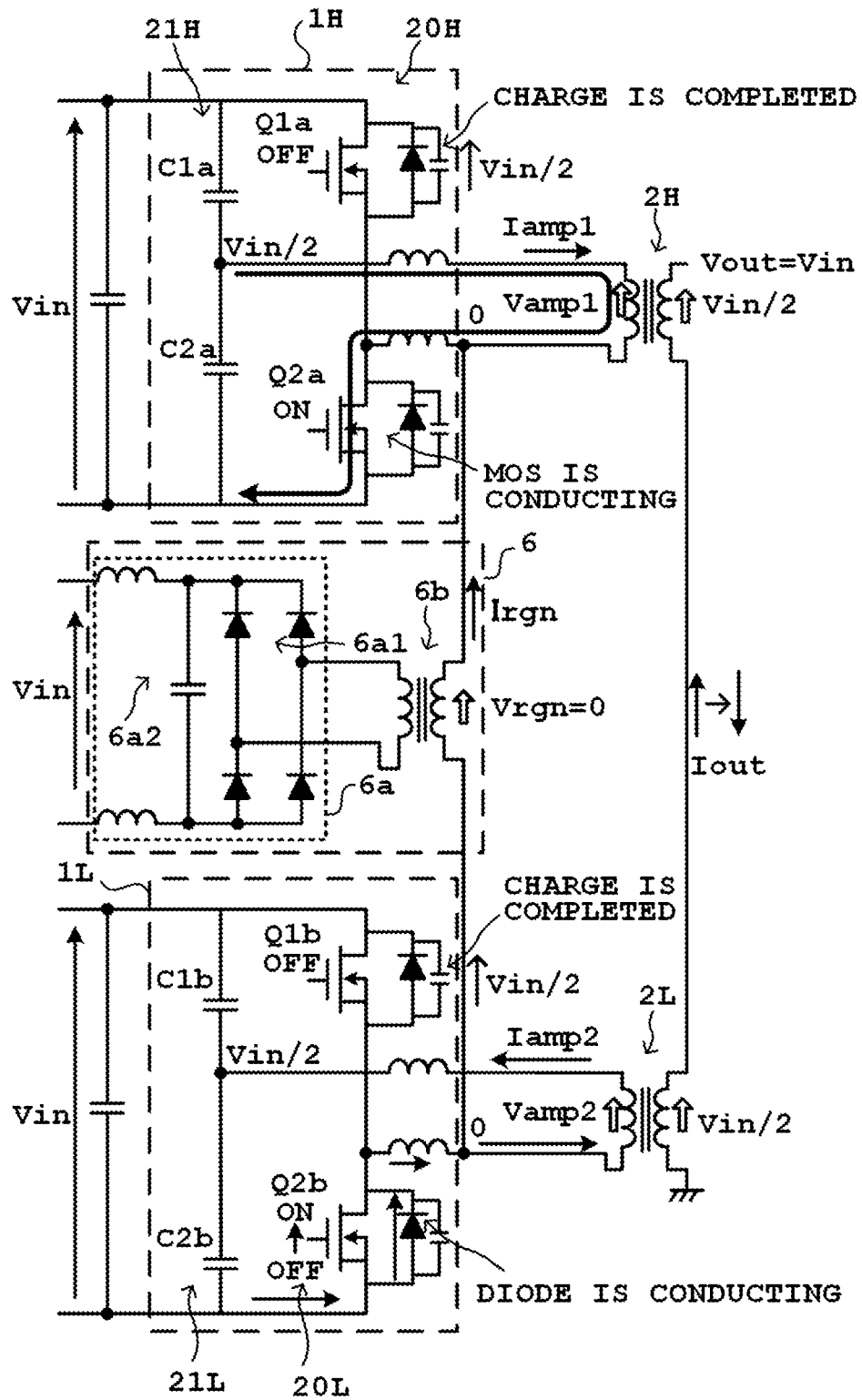
FIG. 19 illustrates an operation example (zone "G") in the first configuration example of the power conversion device according to the present invention.

FIG. 19 shows an operation example in the zone "G". In the zone "G", the switching elements Q1a, Q2a, Q1b and Q2b are OFF, ON, OFF and ON, respectively.

(a) Switching Element Q1a:

The high-side switching element Q1a of the upper class-D amplifier 1H is OFF. The charge of the parasitic capacitance of the switching element Q1a is completed at Vin/2.

(b) Switching Element Q2a:

The low-side switching element Q2a of the upper class-D amplifier 1H is ON. The current (which is shown as a MOS current in FIG. 19) flows to the switching element Q2a in the ON state.

(c) Switching Element Q1b:

The high-side switching element Q1b of the lower class-D amplifier 1L is OFF. The charge of the parasitic capacitance of the switching element Q1b is completed at Vin/2.

(d) Switching Element Q2b:

The low-side switching element Q2b of the lower class-D amplifier 1L turns from off to on ("d1" in FIG. 7(g)). Although the discharge of the electric charge in the parasitic capacitance of the switching element Q1b is completed, the current flows via the parasitic diode of the switching element Q2b because the energy in the inductance of the primary coil in the output transformer 2L keeps flowing.

When the switching element Q2b turns from off to on, the discharge current flows in the switching element Q2b in the previous zone (F2) ("d2" in FIG. 7(h)), so that the displacement voltage dv/dt is limited and thus the displacement current di/dt is limited. It prevents the increase in the gate-to-source voltage Vgs, thereby avoiding erroneous turn-on of the other switching element Q1b in the same leg (pulse signal indicated by the broken line in FIG. 7(e)).

(e) Regeneration Transformer 6b:

The voltage Vamp1 in the upper class-D amplifier 1H is at Vin/2 due to a potential difference between the zero potential of the connection point between the high-side switching element Q1a and the low-side switching element Q2a and the midpoint potential Vin/2 of the capacitor voltage divider 21H. The voltage Vamp2 in the lower class-D amplifier 1L is at Vin/2 due to the potential difference between the zero potential of the connection point between the high-side switching element Q1b and the low-side switching element Q2b and the midpoint potential Vin/2 of the capacitor voltage divider 21L. Thus, there is no potential difference between the voltages Vamp1 and Vamp2, and consequently the input voltage Vrgn is not generated on the input terminal of the regeneration transformer 6b, and the flow of the current Irgn is not caused by the input voltage Vrgn.

(f) Output:

The output voltage Vamp1 in the upper class-D amplifier 1H and the output voltage Vamp2 in the lower class-D amplifier 1L generate the output voltage Vout. The output voltage Vout is at −Vin.

(g) Regeneration:

The current due to the potential difference between the voltages Vamp1 and Vamp2 does not flow to the regeneration transformer 6b of the regeneration circuit 6. However, the energy in the leakage inductance in the generation transformer 6b causes the flow of the current Irgn ("d3" in FIG. 7(k)), and thereby the regeneration operation is implemented.

(Zone "H")

Figure 20:
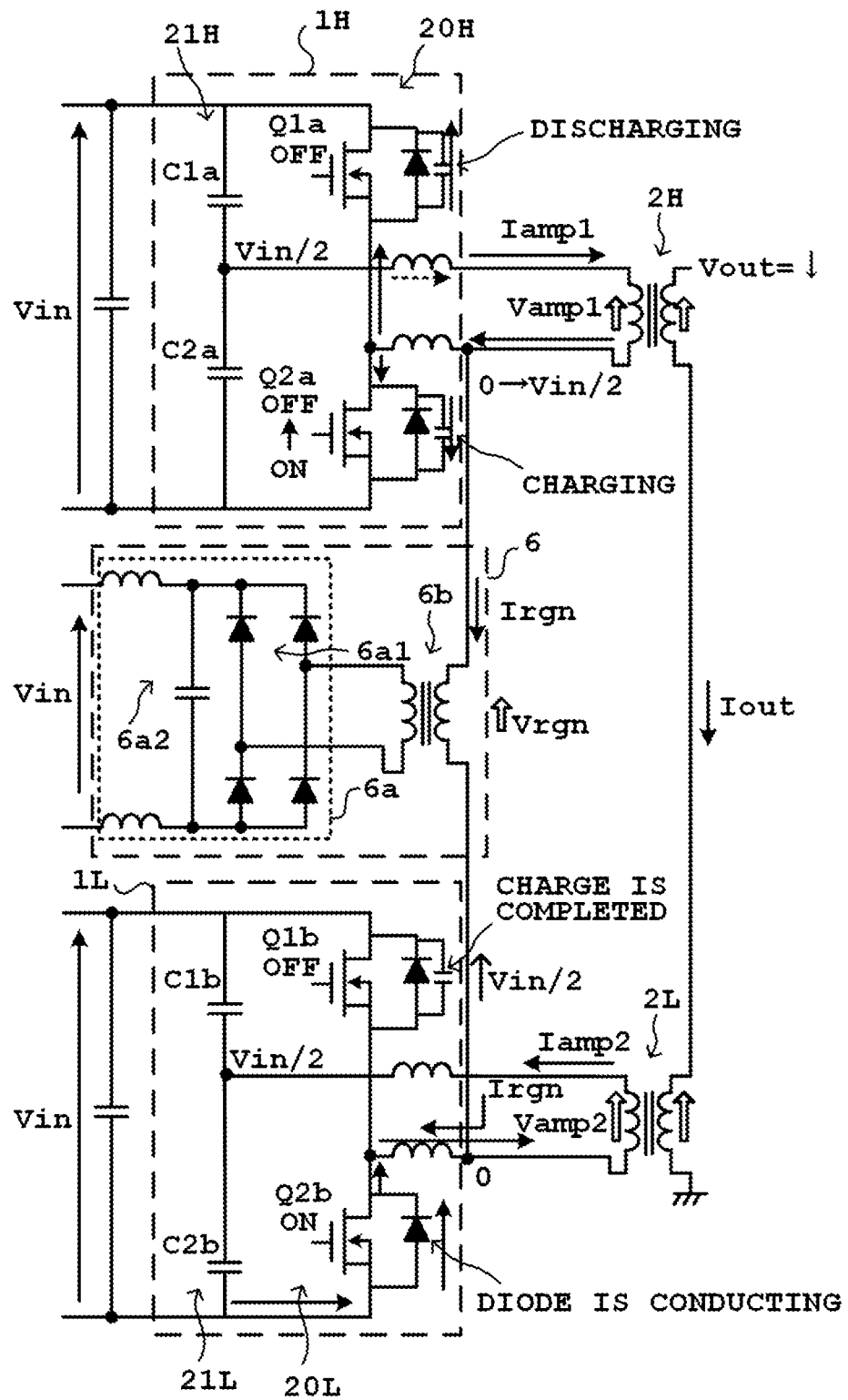
FIG. 20 illustrates an operation example (zone "H1") in the first configuration example of the power conversion device according to the present invention.
Figure 21:
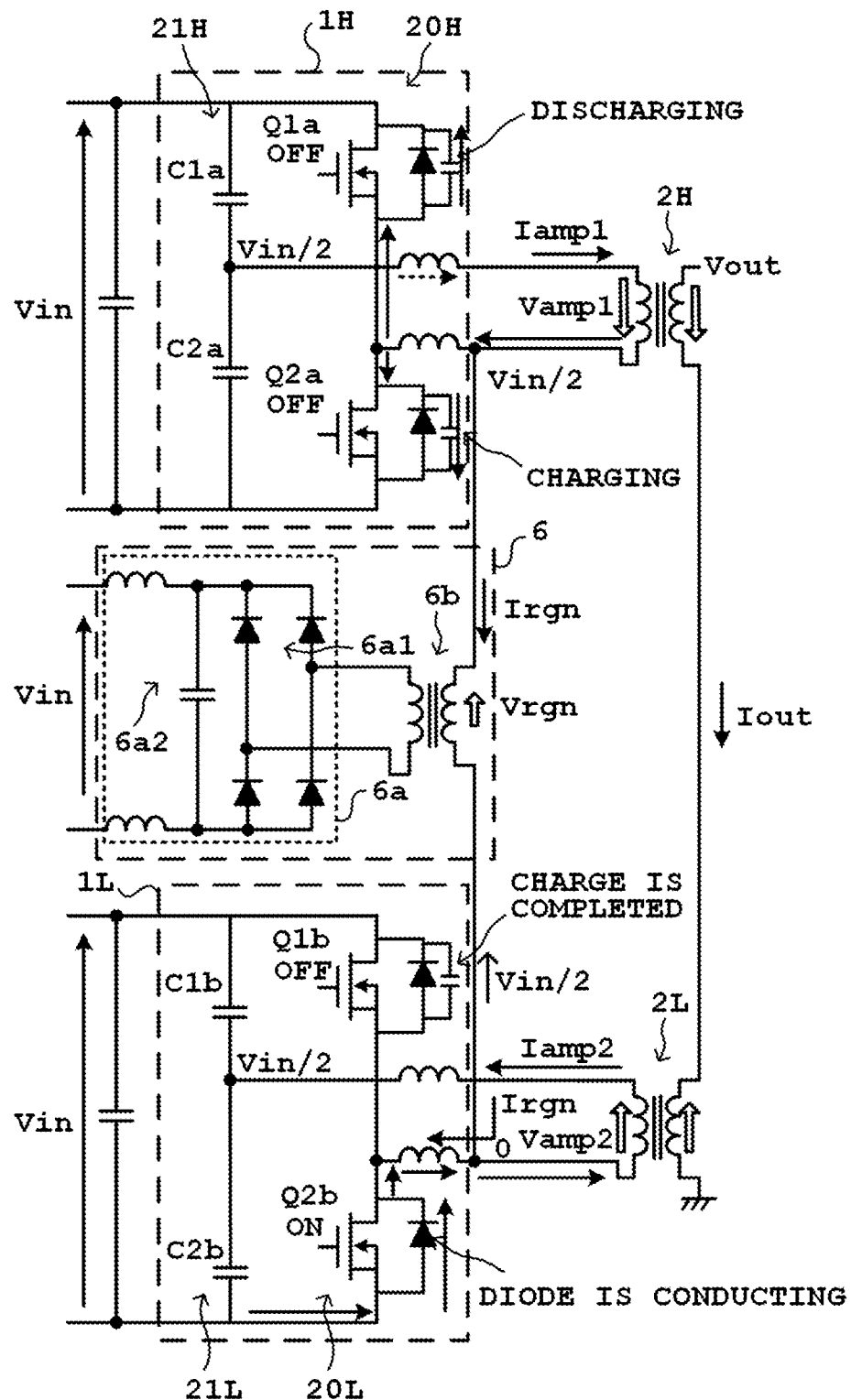
FIG. 21 illustrates an operation example (zone "H2") in the first configuration example of the power conversion device according to the present invention.

The zone "H" has a different direction of the current lamp, and is divided into a zone "H1" and a zone "H2". FIG. 20 shows an operation example in the zone "H1", and FIG. 21 shows an operation example in the zone "H2". In the zone "H", the switching elements Q1a, Q2a, Q1b and Q2b are OFF, OFF, OFF and ON, respectively. Furthermore, the zone "H" is a dead time zone where both of the switching element Q1a and the switching Q2a are OFF.

(Zone "H1")

FIG. 20 shows the operation example in the zone "H1". In the zone "H1", the switching elements Q1a, Q2a, Q1b and Q2b are OFF, OFF, OFF and ON, respectively.

(a) Switching Element Q1a:

The high-side switching element Q1a of the upper class-D amplifier 1H is OFF. Although the low-side switching element Q2a turns off, the discharge of the electric charge charged in the parasitic capacitance of the switching element Q1a is started because the energy in the inductance of the primary coil in the output transformer 2H keeps flowing.

(b) Switching Element Q2a:

The low-side switching element Q2a of the upper class-D amplifier 1H turns from on to off. Since the low-side switching element Q2a of the upper class-D amplifier 1H turns from on to off, the discharge current of the high-side switching element Q1b and the current Irgn initiate the charge of the electric charge in the parasitic capacitance of the switching element Q2a.

(c) Switching element Q1b:

The high-side switching element Q1b of the lower class-D amplifier 1L is OFF. The charge of the parasitic capacitance of the switching element Q1b is completed at Vin/2.

(d) Switching Element Q2b:

The low-side switching element Q2b of the lower class-D amplifier 1L is ON. Following the zone "G", the energy in the inductance of the primary coil in the output transformer 2L keeps flowing, thereby flowing the current via the parasitic diode of the switching element Q2b.

(e) Regeneration Transformer 6b:

The potential of the connection point between the high-side switching element Q1a and the low-side switching element Q2a changes from zero to Vin/2. A potential difference between the above potential change and the midpoint potential Vin/2 of the capacitor voltage divider 21H causes the change in the voltage Vamp1 in the upper class-D amplifier 1H from −Vin/2 to zero.

The voltage Vamp2 in the lower class-D amplifier 1L is at Vin/2 due to a potential difference between the zero potential of the connection point between the high-side switching element Q1b and the low-side switching element Q2b and the midpoint potential Vin/2 of the capacitor voltage divider 21L. Thus, there is a potential difference between the voltages Vamp1 and Vamp2, and consequently the input voltage Vrgn is generated on the input terminal of the regeneration transformer 6b, thereby causing the current Irgn to flow.

(f) Output:

The output voltage Vamp1 in the upper class-D amplifier 1H and the output voltage Vamp2 in the lower class-D amplifier 1L generate the output voltage Vout. The output voltage Vout increases from −Vin.

(g) Regeneration:

The current Irgn flows to the regeneration transformer 6b of the regeneration circuit 6 to thereby implement the regeneration operation.

(Zone "H2")

FIG. 21 shows the operation example in the zone "H2". In the zone "H2", the switching elements Q1a, Q2a, Q1b and Q2b are OFF, OFF, OFF and ON, respectively.

(a) Switching Element Q1a:

The high-side switching element Q1a of the upper class-D amplifier 1H is OFF. Although the low-side switching element Q2a turns off, the discharge of the electric charge charged in the parasitic capacitance of the switching element Q1a is started because the energy in the inductance of the primary coil in the output transformer 2H keeps flowing.

(b) Switching Element Q2a:

The low-side switching element Q2a of the upper class-D amplifier 1H is OFF. The discharge current of the high-side switching element Q1a and the current Irgn initiate the charge of the electric charge in the parasitic capacitance of the switching element Q2a.

The current Irgn is used as an auxiliary current to supplement discharging/charging of the parasitic capacitances of the switching element Q1a and the switching element Q2a ("a2" in FIG. 7(b) and "a3" in FIG. 7(k)) so as to reduce the drain-to-source displacement voltage dv/dt, thereby avoiding erroneous turn-on of a gate between the zone "H2" and the zone "A1".

(c) Switching Element Q1b:

The high-side switching element Q1b of the lower class-D amplifier 1L is OFF. The charge of the parasitic capacitance of the switching element Q1b is completed at Vin/2.

(d) Switching Element Q2b:

The low-side switching element Q2b of the lower class-D amplifier 1L is ON. Following the zone "H1", the energy in the inductance of the primary coil in the output transformer 2L keeps flowing, thereby flowing the current via the parasitic diode of the switching element Q2b.

(e) Regeneration Transformer 6b:

When the discharge in the switching element Q1a is completed, the potential of the connection point between the high-side switching element Q1a and the low-side switching element Q2a becomes Vin. A potential difference between the potential Vin of the connection point and the midpoint potential Vin/2 of the capacitor voltage divider 21H causes a change in the voltage Vamp1 in the upper class-D amplifier 1H from zero to Vin/2.

The voltage Vamp2 in the lower class-D amplifier 1L is at Vin/2 due to a potential difference between the zero potential of the connection point between the high-side switching element Q1b and the low-side switching element Q2b and the midpoint potential Vin/2 of the capacitor voltage divider 21L. Thus, there is a potential difference between the voltages Vamp1 and Vamp2, and consequently the input voltage Vrgn is generated on the input terminal of the regeneration transformer 6b, thereby causing the current Irgn to flow.

(f) Output:

The output voltage Vamp1 in the upper class-D amplifier 1H and the output voltage Vamp2 in the lower class-D amplifier 1L generate the output voltage Vout. The output voltage Vout increases toward zero.

(g) Regeneration:

The current Irgn flows to the regeneration transformer 6b of the regeneration circuit 6 to thereby implement the regeneration operation.

Second Configuration Example of Invention

Circuit Example of Second Configuration Example

A second configuration example of the present invention will be described by referring to FIGS. 22 to 32. In the second configuration, four switching elements of each of an upper class-D amplifier and a lower class-D amplifier form a full bridge configuration, and two regeneration circuits are provided as current-auxiliary circuits.

Figure 22:
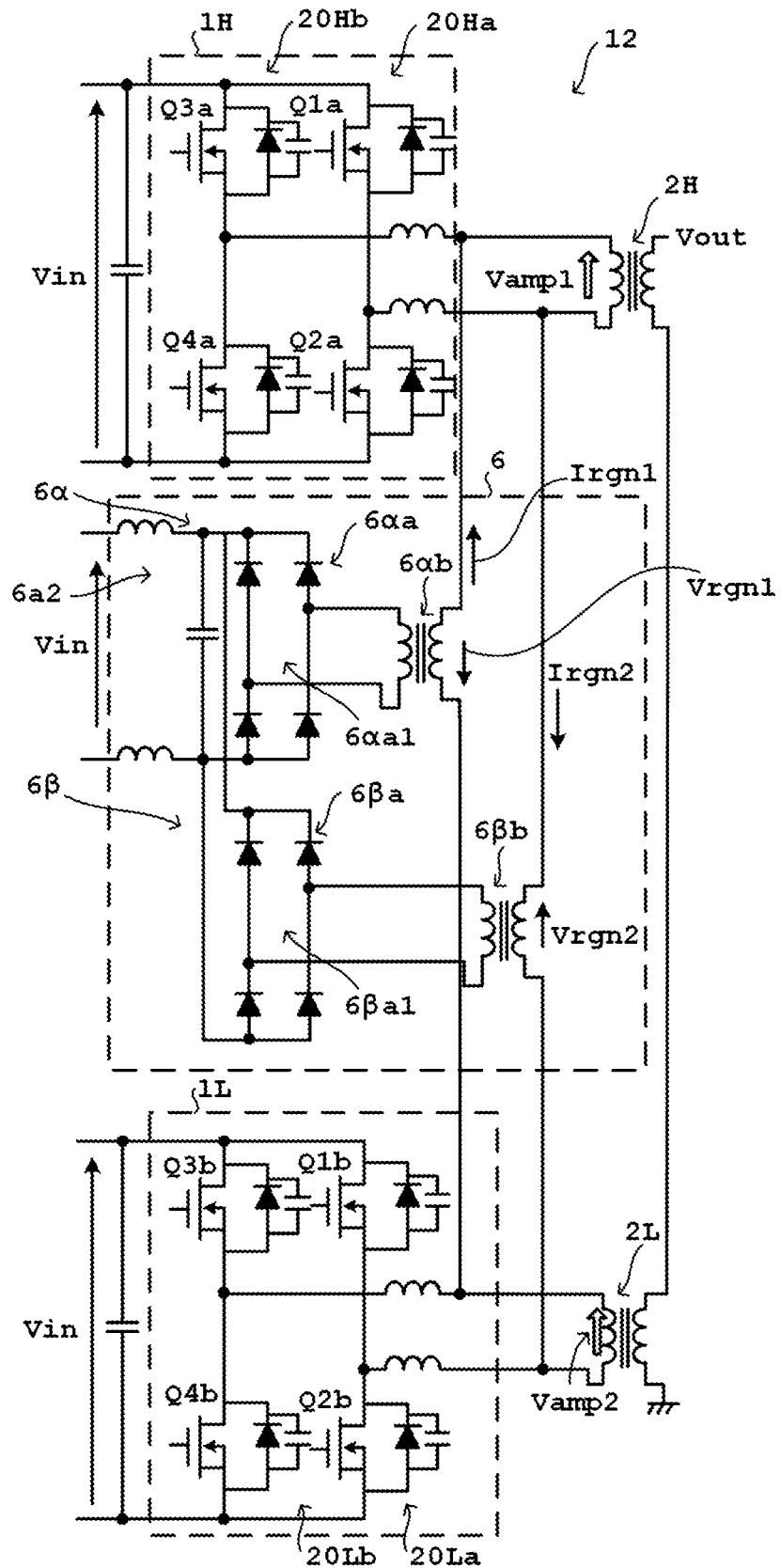
FIG. 22 illustrates a circuit example in a second configuration example of the power conversion device according to the present invention.

FIG. 22 shows a circuit example of the second configuration example of the invention. This figure shows the upper class-D amplifier, the lower class-D amplifier and the regeneration circuits only.

In a power conversion device 12, an upper class-D amplifier 1H has a full bridge circuit formed by a leading leg 20Ha consisting of a high-side switching element Q1a and a low-side switching element Q2a, which are connected in series, and a lagging leg 20Hb consisting of a high-side switching element Q3a and a low-side switching element Q4a, which are connected in series. The leading leg 20Ha and the lagging leg 20Hb may have a converse relation.

The switching element Q1a and the switching element Q2a, which form the leading leg 20Ha, have their one ends connected respectively on a high-voltage side and a low-voltage side of a DC power supply, not shown. The other ends of the switching element Q1a and the switching element Q2a are connected to each other, and a connection point between these ends is one of output terminals of the upper class-D amplifier 1H and is connected to one end of an output transformer 2H on its primary side.

The switching element Q3a and the switching element Q4a, which form the lagging leg 20Hb, have their one ends connected respectively on the high-voltage side and the low-voltage side of the DC power supply, not shown. The other ends of the switching element Q3a and the switching element Q4a are connected to each other, and a connection point between these ends is one of output terminals of the upper class-D amplifier 1H and is connected to one end of the output transformer 2H on the primary side.

There are leakage inductances of the output transformer 2H between a midpoint of the leading leg 20Ha and the output transformer 2H and between a midpoint of the lagging leg 20Hb and the output transformer 2H.

A lower class-D amplifier 1L has a full bridge circuit formed by a leading leg 20La consisting of a high-side switching element Q1b and a low-side switching element Q2b, which are connected in series, and a lagging leg 20Lb consisting of a high-side switching element Q3b and a low-side switching element Q4b, which are connected in series. The switching element Q1b and the switching element Q2b, which form the leading leg 20La, have their one ends connected respectively on a high-voltage side and a low-voltage side of the DC power supply, not shown. The other ends of the switching element Q1b and the switching element Q2b are connected to each other, and a connection point between these ends is one of output terminals of the lower class-D amplifier 1L and is connected to one end of an output transformer 2L on its primary side.

The switching element Q3b and the switching element Q4b, which form the lagging leg 20Lb, have their one ends connected respectively on a high-voltage side and a low-voltage side of the DC power supply, not shown. The other ends of the switching element Q3b and the switching element Q4b are connected to each other, and a connection point between these ends is one of output terminals of the lower class-D amplifier 1L and is connected to one end of the output transformer 2L on the primary side.

There are leakage inductances of the output transformer 2L between a midpoint of the lagging leg 20Lb and the output transformer 2L and between the output transformer 2L and a midpoint of the leading leg 20La, which is a point where the ends of the leading leg 20La are connected to each other.

A regeneration circuit 6 includes two regeneration circuits, namely a first regeneration circuit 6α and a second regeneration circuit 6β, and is configured to regenerate auxiliary current power taken in as regeneration power to the DC power supply, not shown. The first regeneration circuit 6α includes a regeneration/rectification circuit 6αa and a regeneration transformer 6αb, and the second regeneration circuit 6β includes a regeneration/rectification circuit 6βa and a regeneration transformer 6βb.

The regeneration transformer 6αb has its primary side connected between an output terminal of the midpoint in the lagging leg 20Hb of the upper class-D amplifier 1H and an output terminal of the midpoint in the lagging leg 20Lb of the lower class-D amplifier 1L, and has its secondary side connected to the regeneration/rectification circuit 6αa of the first regeneration circuit 6α. On the other hand, the regeneration transformer 6βb has its primary side connected between an output terminal of the midpoint in the leading leg 20Ha of the upper class-D amplifier 1H and an output terminal of the midpoint in the leading leg 20La of the lower class-D amplifier 1L, and has its secondary side connected to the regeneration/rectification circuit 6βa of the second regeneration circuit 6β.

The regeneration/rectification circuit 6αa is configured to rectify an AC voltage on the secondary side of the regeneration transformer 6αb to generate a regeneration voltage. The regeneration/rectification circuit 6βa is configured to rectify an AC voltage on the secondary side of the regeneration transformer 6βb to generate a regeneration voltage.

On the primary sides of the regeneration transformer 6αb and the regeneration transformer 6βb, a current flows based on a voltage difference between the upper class-D amplifier 1H and the lower class-D amplifier 1L. The regeneration transformer 6αb and the regeneration transformer 6βb send the AC voltages on their secondary sides to the regeneration/rectification circuit 6αa and the regeneration/rectification circuit 6βa, respectively. The regeneration transformers 6αb, 6βb have their turns ratio designed such that an equivalent circuit satisfies a condition of zero-voltage switching (ZVS) when a gate phase difference θ is zero degree.

The regeneration/rectification circuits 6αa, 6βa are composed respectively of a diode bridge circuit 6αa1 and an LC smoothing circuit 6a2 connected to the DC power supply side and of a diode bridge circuit 6βa1 and the LC smoothing circuit 6a2 connected to the DC power supply side, and are connected to the output terminals of the regeneration transformers 6αb and 6βb, respectively. The regeneration/rectification circuits 6αa, 6βa shares the LC smoothing circuit 6a2.

The AC voltage on the secondary side of the regeneration transformer 6αb is rectified by the diode bridge circuit 6αa1, and then smoothed into a regeneration voltage by the LC smoothing circuit 6a2. The AC voltage on the secondary side of the regeneration transformer 6βb is rectified by the diode bridge circuit 6βa1, and then smoothed into a regeneration voltage by the LC smoothing circuit 6a2.

The regeneration circuit 6 regenerates the auxiliary current power as regenerated power to the DC power supply, thereby enhancing conversion efficiency of the power conversion device.

Operation Example of Second Configuration Example

In the power conversion device, the second configuration example operates according to a combination of gate signals gQ1a to gQ4a for driving the switching elements Q1a to Q4a of the upper class-D amplifier 1H and gate signals gQ1b to gQ4b for driving the switching elements Q1b to Q4b of the lower class-D amplifier 1L. As with the case of the first configuration example, the second configuration example has an operation aspect according to the combination of the gate signals in eight zones "A" to "H".

In the description about the operation aspect of the first configuration example, the zone "A", the zone "B", the zone "D", the zone "E", the zone "F" and the zone "H" are divided into two zones. In the operation aspect of the second configuration example, each of these zones will be described as one zone without dividing into two zones because no changes occur in a voltage Vrgn and a current Irgn in these zones.

The operation example of the second configuration example will be described by referring to signal diagrams shown in FIGS. 23 and 24.

Signal Diagram of Upper Class-D Amplifier 1H:

FIGS. 23(a) and 23(i) show a gate signal gQ1a, a waveform of a voltage VQ1a and a waveform of a current IQ1a with respect to a high-side switching element Q1a on an upper arm part of the leading leg 20Ha of the upper class-D amplifier 1H.

FIGS. 23(b) and 23(j) show a gate signal gQ2a, a waveform of a voltage VQ2a and a waveform of a current IQ2a with respect to a low-side switching element Q2a on a lower arm part of the leading leg 20Ha of the upper class-D amplifier 1H.

FIGS. 23(c) and 23(k) show a gate signal gQ3a, a waveform of a voltage VQ3a and a waveform of a current IQ3a with respect to a high-side switching element Q3a on an upper arm part of the lagging leg 20Hb of the upper class-D amplifier 1H.

FIGS. 23(d) and 23(h) show a gate signal gQ4a, a waveform of a voltage VQ4a and a waveform of a current IQ4a with respect to a low-side switching element Q4a on a lower arm part of the lagging leg 20Hb of the upper class-D amplifier 1H.

Signal Diagram of Lower Class-D Amplifier 1L:

FIGS. 23(e) and 23(m) show a gate signal gQ1b, a waveform of a voltage VQ1b and a waveform of a current IQ1b with respect to a high-side switching element Q1b on an upper arm part of the leading leg 20La of the lower class-D amplifier 1L.

FIGS. 23(f) and 23(n) show a gate signal gQ2b, a waveform of a voltage VQ2b and a waveform of a current IQ2b with respect to a low-side switching element Q2b on a lower arm part of the leading leg 20La of the lower class-D amplifier 1L.

FIGS. 23(g) and 23(o) show a gate signal gQ3b, a waveform of a voltage VQ3b and a waveform of a current IQ3b with respect to a high-side switching element Q3b on a lower arm part of the lagging leg 20Lb of the lower class-D amplifier 1L.

FIGS. 23(h) and 23(p) show a gate signal gQ4b, a waveform of a voltage VQ4b and a waveform of a current IQ4b with respect to a low-side switching element Q4b on a lower arm part of the lagging leg 20Lb of the lower class-D amplifier 1L.

FIGS. 24(a) and 24(b) show a voltage Vamp1 and a current Iamp1 in the upper class-D amplifier 1H and a voltage Vamp2 and a current Iamp2 in the lower class-D amplifier 1L. FIG. 24(c) shows an input voltage Vrgn1 and a current Irgn1 in the regeneration circuit of the first regeneration circuit 6a, and FIG. 24(d) shows an input voltage Vrgn2 and a current Irgn2 in the second regeneration circuit 6β. The input voltage Vrgn1 and the current Irgn1 correspond to a primary-side voltage and a primary-side current in the regeneration transformer 6αb, respectively, and the input voltage Vrgn2 and the current Irgn2 correspond to a primary-side voltage and a primary-side current in the regeneration transformer 6βb, respectively. FIG. 24(e) shows an output voltage Vout and an output current Iout.

In the upper class-D amplifier 1H, the leg formed by the high-side switching element Q1a and the low-side switching element Q2a is the leading leg 20Ha, and the leg formed by the high-side switching element Q3a and the low-side switching element Q4a is the lagging leg 20Hb. Furthermore, in the lower class-D amplifier 1L, the leg formed by the high-side switching element Q1b and the low-side switching element Q2b is the leading leg 20La, and the leg formed by the high-side switching element Q3b and the low-side switching element Q4b is the lagging leg 20Lb. In FIGS. 23(i) to 23(p) and FIG. 24, a solid line indicates a voltage waveform and a broken line indicates a current waveform.

Now, a description will be made about operations to be performed when the switching elements Q1a to Q4a of the upper class-D amplifier 1H turn from off to on and when the switching elements Q1b to Q4b turn from off to on.

(Operation at Switching in Gate Signals gQ2a, gQ3a)

A description will be made about an operation to be performed when the gate signal gQ2a and the gate signal gQ3a applied respectively to the switching element Q2a and the switching element Q3a of the upper class-D amplifier 1H turn from off to on. This switching operation corresponds to a state shown in FIG. 23 in which the zone changes from "B" to "C".

In the zone "B", a voltage difference between the voltage Vamp1 in the upper class-D amplifier 1H ("a15" in FIG. 24(a)) and the voltage Vamp2 in the lower class-D amplifier 1L ("a16" in FIG. 24(b)) causes the generation of the input voltage Vrgn1 and the current Irgn1 in the first regeneration circuit 6a ("a17" in FIG. 24(c)) and the input voltage Vrgn2 and the current Irgn2 in the second regeneration circuit 6β ("a18" in FIG. 24(d)).

(Action of Current Irgn1)

The current Irgn1 acts as an auxiliary current for discharging a parasitic capacitance Cds of the switching element Q3a ("a14" in FIG. 23(k)). The auxiliary current reduces a displacement voltage dv/dt that is generated in the switching element Q3a. The reduction in the displacement voltage dv/dt leads to the reduction in a displacement current di/dt, and thereby an amount of fluctuation of the current IQ3a is reduced. The reduction in the amount of fluctuation of the displacement current IQ3a leads to the suppression of the increase in a gate-to-source voltage Vgs in the low-side switching element Q4a in the same leg, thereby preventing erroneous turn-on. The signal waveform indicated by the broken line in the gate signal gQ4a in FIG. 23(d) shows that an erroneous turn-on signal induced by the displacement current di/dt is suppressed.

(Action of Current Irgn2)

The current Irgn2 acts as an auxiliary current for charging a parasitic capacitance Cds of the switching element Q2a ("a13" in FIG. 23(j)).

The auxiliary current reduces a displacement voltage dv/dt that is generated in the switching element Q2a. The reduction in the displacement voltage dv/dt leads to the reduction in the displacement current di/dt, and thereby an amount of fluctuation of the current IQ2a is reduced. The reduction in the amount of fluctuation of the displacement current IQ2a leads to the suppression of the increase in a gate-to-source voltage Vgs in the high-side switching element Q1a in the same leg, thereby preventing erroneous turn-on. The signal waveform indicated by the broken line in the gate signal gQ1a in FIG. 23(a) shows that an erroneous turn-on signal induced by the displacement current di/dt is suppressed.

(Operation at switching in gate signals gQ1a, gQ4a)

A description will be made about an operation to be performed when the gate signal gQ1a and the gate signal gQ4a applied respectively to the switching element Q1a and the switching element Q4a of the upper class-D amplifier 1H turn from off to on. This switching operation corresponds to a state shown in FIG. 23 in which the zone changes from "F" to "G".

In the zone "F", a voltage difference between the voltage Vamp1 in the upper class-D amplifier 1H ("c15" in FIG. 24(a)) and the voltage Vamp2 in the lower class-D amplifier 1L ("c16" in FIG. 24(b)) causes the generation of the input voltage Vrgn1 and the current Irgn1 in the first regeneration circuit 6a ("c17" in FIG. 24(c)) and the input voltage Vrgn2 and the current Irgn2 in the second regeneration circuit 6β ("c18" in FIG. 24(d)).

(Action of Current Irgn1)

The current Irgn1 acts as an auxiliary current for discharging a parasitic capacitance Cds of the switching element Q4a ("c14" in FIG. 23(l)).

The auxiliary current reduces a displacement voltage dv/dt that generates in the switching element Q4a. The reduction in the displacement voltage dv/dt leads to the reduction in a displacement current di/dt, and thereby an amount of fluctuation of the current IQ4a is reduced. The reduction in the amount of fluctuation of the displacement current IQ4a leads to the suppression of the increase in a gate-to-source voltage Vgs in the high-side switching element Q3a in the same leg, thereby preventing erroneous turn-on. The signal waveform indicated by the broken line in the gate signal gQ3a in FIG. 23(c) shows that an erroneous turn-on signal induced by the displacement current di/dt is suppressed.

(Action of Current Irgn2)

The current Irgn2 acts as an auxiliary current for discharging a parasitic capacitance Cds of the switching element Q1a ("c13" in FIG. 23(i)).

The auxiliary current reduces a displacement voltage dv/dt that is generated in the switching element Q1a. The reduction in the displacement voltage dv/dt leads to the reduction in a displacement current di/dt, and thereby an amount of fluctuation of the current IQ1a is reduced. The reduction in the amount of fluctuation of the displacement current IQ1a leads to the suppression of the increase in a gate-to-source voltage Vgs in the high-side switching element Q2a in the same leg, thereby preventing erroneous turn-on. The signal waveform indicated by the broken line in the gate signal gQ2a in FIG. 23(b) shows that an erroneous turn-on signal induced by the displacement current di/dt is suppressed.

(Operation at switching in gate signals gQ1b, gQ4b)

A description will be made about an operation to be performed when the gate signal gQ1b and the gate signal gQ4b applied respectively to the switching element Q1b and the switching element Q4b of the lower class-D amplifier 1L turn from off to on. This switching operation corresponds to a state shown in FIG. 23 in which the zone changes from "D" to "E".

In the zone "D", a voltage difference between the voltage Vamp1 in the upper class-D amplifier 1H ("b15" in FIG. 24(a)) and the voltage Vamp2 in the lower class-D amplifier 1L ("b16" in FIG. 24(b)) causes the generation of the input voltage Vrgn1 and the current Irgn1 in the first regeneration circuit 6a ("b17" in FIG. 24(c)) and the input voltage Vrgn2 and the current Irgn2 in the second regeneration circuit 6β ("b18" in FIG. 24(d)).

(Action of Current Irgn1)

The current Irgn1 acts as an auxiliary current for discharging a parasitic capacitance Cds of the switching element Q1b ("b13" in FIG. 23(m)).

The auxiliary current reduces a displacement voltage dv/dt that is generated in the switching element Q1b. The reduction in the displacement voltage dv/dt leads to the reduction in a displacement current di/dt, and thereby an amount of fluctuation of the current IQ1b is reduced. The reduction in the amount of fluctuation of the displacement current IQ1b leads to the suppression of the increase in a gate-to-source voltage Vgs in the high-side switching element Q2b in the same leg, thereby preventing erroneous turn-on. The signal waveform indicated by the broken line in the gate signal gQ2b in FIG. 23(f) shows that an erroneous turn-on signal induced by the displacement current di/dt is suppressed.

(Action of Current Irgn2)

The current Irgn2 acts as an auxiliary current for discharging a parasitic capacitance Cds of the switching element Q4b ("b14" in FIG. 23(p)).

The auxiliary current reduces a displacement voltage dv/dt that is generated in the switching element Q4b. The reduction in the displacement voltage dv/dt leads to the reduction in a displacement current di/dt, and thereby an amount of fluctuation of the current IQ4b is reduced. The reduction in the amount of fluctuation of the displacement current IQ4b leads to the suppression of the increase in a gate-to-source voltage Vgs in the high-side switching element Q3b in the same leg, thereby preventing erroneous turn-on. The signal waveform indicated by the broken line in the gate signal gQ3b in FIG. 23(g) shows that an erroneous turn-on signal induced by the displacement current di/dt is suppressed.

(Operation at Switching in Gate Signals gQ2b, gQ3b)

A description will be made about an operation to be performed when the gate signal gQ2b and the gate signal gQ3b applied respectively to the switching element Q2b and the switching element Q3b of the lower class-D amplifier 1L turn from off to on. This switching operation corresponds to a state shown in FIG. 23 in which the zone changes from "H" to "A".

In the zone "H", a voltage difference between the voltage Vamp1 in the upper class-D amplifier 1H ("d15" in FIG. 24(a)) and the voltage Vamp2 in the lower class-D amplifier 1L ("d16" in FIG. 24(b)) causes the generation of the input voltage Vrgn1 and the current Irgn1 in the first regeneration circuit 6a ("d17" in FIG. 24(c)) and the input voltage Vrgn2 and the current Irgn2 in the second regeneration circuit 6β ("d18" in FIG. 24(d)).

(Action of Current Irgn1)

The current Irgn1 acts as an auxiliary current for discharging a parasitic capacitance Cds of the switching element Q2b ("d13" in FIG. 23(n)).

The auxiliary current reduces a displacement voltage dv/dt that is generated in the switching element Q2b. The reduction in the displacement voltage dv/dt leads to the reduction in a displacement current di/dt, and thereby an amount of fluctuation of the current IQ2b is reduced. The reduction in the amount of fluctuation of the displacement current IQ2b leads to the suppression of the increase in a gate-to-source voltage Vgs in the high-side switching element Q1b in the same leg, thereby preventing erroneous turn-on. The signal waveform indicated by the broken line in the gate signal gQ1b in FIG. 23(e) shows that an erroneous turn-on signal induced by the displacement current di/dt is suppressed.

(Action of Current Irgn2)

The current Irgn2 acts as an auxiliary current for discharging a parasitic capacitance Cds of the switching element Q3b ("d14" in FIG. 23(o)).

The auxiliary current reduces a displacement voltage dv/dt that is generated in the switching element Q3b. The reduction in the displacement voltage dv/dt leads to the reduction in a displacement current di/dt, and thereby an amount of fluctuation of the current IQ3b is reduced. The reduction in the amount of fluctuation of the displacement current IQ3b leads to the suppression of the increase in a gate-to-source voltage Vgs in the high-side switching element Q4b in the same leg, thereby preventing erroneous turn-on. The signal waveform indicated by the broken line in the gate signal gQ4b in FIG. 23(h) shows that an erroneous turn-on signal induced by the displacement current di/dt is suppressed.

Table 2 shows items in each zone, namely ON/OFF states, voltage changes and current changes in the switching elements Q1a to Q4a and Q1b to Q4b, output voltages Vamp1, Vamp2 and output currents Iamp1, Iamp2 of the upper class-D amplifier 1H and the lower class-D amplifier 1L, an input voltage Vrgn and a current Irgn of the regeneration circuit, an output voltage Vout and an output current Iout of the power conversion device, and a state of regeneration. Portions marked with thick solid lines-asterisk symbols "*" in Table 2 show auxiliary currents and currents flowing through the switching elements as well as the changes in the current Irgn of an auxiliary circuit when the switching elements turn from off to on.

TABLE 2

| Zone | A | Dead Time B | Phase Shifting Zone θ C | Dead Time D | E | Dead Time F | Phase Shifting Zone θ G | Dead Time H |
|---|---|---|---|---|---|---|---|---|
| Q1a | ON MOS | OFF Charging | OFF Charged | OFF Charged | OFF Charged | *OFF Discharging | *ON Diode c11 | ON MOS |
| Q2a | OFF Charged | *OFF Discharging | *ON Diode a11 | ON MOS | ON MOS | OFF Charging | OFF Charged | OFF Charged |
| Q3a | OFF Charged | *OFF Discharging | *ON Diode a12 | ON MOS | ON MOS | OFF Charging | OFF Charged | OFF Charged |
| Q4a | ON MOS | OFF Charging | OFF Charged | OFF Charged | OFF Charged | *OFF Discharging | *ON Diode c12 | ON MOS |
| Q1b | OFF Charged | OFF Charged | OFF Charged | *OFF Charged | *ON Diode c11 | ON MOS | ON MOS | OFF Charging |
| Q2b | *ON Diode d11 | ON MOS | ON MOS | OFF Charging | OFF Charged | OFF Charged | OFF Charged | *OFF Discharging |
| Q3b | *ON Diode d12 | ON MOS | ON MOS | OFF Charging | OFF Charged | OFF Charged | OFF Charged | *OFF Discharging |
| Q4b | OFF Charged | OFF Charged | OFF Charged | *OFF Discharging | *ON Diode b12 | ON MOS | ON MOS | OFF Charging |
| IQ1a | Forward ↓ | Forward ↓ a13 | 0 | 0 | 0 | Backward ↑ | Backward ↑ | Forward ↓ |
| IQ2a | 0 | 0 | Backward ↑ | Backward ↑ | Forward ↓ | Forward ↓c13 | 0 | 0 |
| IQ3a | 0 | 0 | Backward ↑ | Backward ↑ | Forward ↓ | Forward ↓c14 | 0 | 0 |
| IQ4a | Forward ↓ | Forward ↓a14 | 0 | 0 | 0 | Backward ↑ | Backward ↑ | Forward ↓ |
| IQ1b | Forward ↓ | 0 | 0 | 0 | Backward ↑ | Backward ↑ | Forward ↓ | Forward ↓ |
| IQ2b | Backward ↑ | Forward ↓ | Forward ↓ | Forward ↓b13 | 0 | 0 | 0 | Backward ↑d13 |
| IQ3b | Backward ↑ | Forward ↓ | Forward ↓ | Forward ↓b14 | 0 | 0 | 0 | Backward ↑d14 |
| IQ4b | Forward ↓ | 0 | 0 | 0 | Backward ↑ | Backward ↑ | Forward ↓ | Forward ↓ |
| Vamp1 | ↓ | ↓→↑ | ↑ | ↑ | ↑ | ↑→↓ | ↓ | ↓ |
| Vamp2 | ↑ | ↑ | ↑ | ↑→↓ | ↓ | ↓ | ↓ | ↓→↑ |
| Iamp1 | ← | ← | ← | → | → | → | → | → |
| Iamp2 | ← | ← | → | → | → | → | ← | ← |
| Vrgn1 | Negative ↓ | Negative ↓ | 0 | Positive ↑ | Positive ↑ | Positive ↑ | 0 | Negative ↓ |
| Irgn1 | ↑ | ↑ a15 | ↑ | ↑ b15 | ↓ | ↓ c15 | ↓ | ↓ d15 |

TABLE 2-continued

| Zone | A | Dead Time B | Phase Shifting Zone θ C | Dead Time D | E | Dead Time F | Phase Shifting Zone θ G | Dead Time H |
|---|---|---|---|---|---|---|---|---|
| Vrgn2 | Positive ↑ | Positive ↑ | 0 | Negative ↓ | Negative ↓ | Negative ↓ | 0 | Positive ↑ |
| Irgn2 | ↓ | ↓ | ↓ | ↓ | ↑ | ↑ | ↑ | ↑ |
|  |  | a16 |  | b16 |  | c16 |  | d16 |
| Vout | 0 | Positive Increase | Positive 2Vin | Positive Decrease | 0 | Negative Decrease | Negative −2Vin | Negative Increase |

The operations in the zones "A" to "H" will now be described by referring to FIGS. 25 to 32.

(Zone "A")

Figure 25:
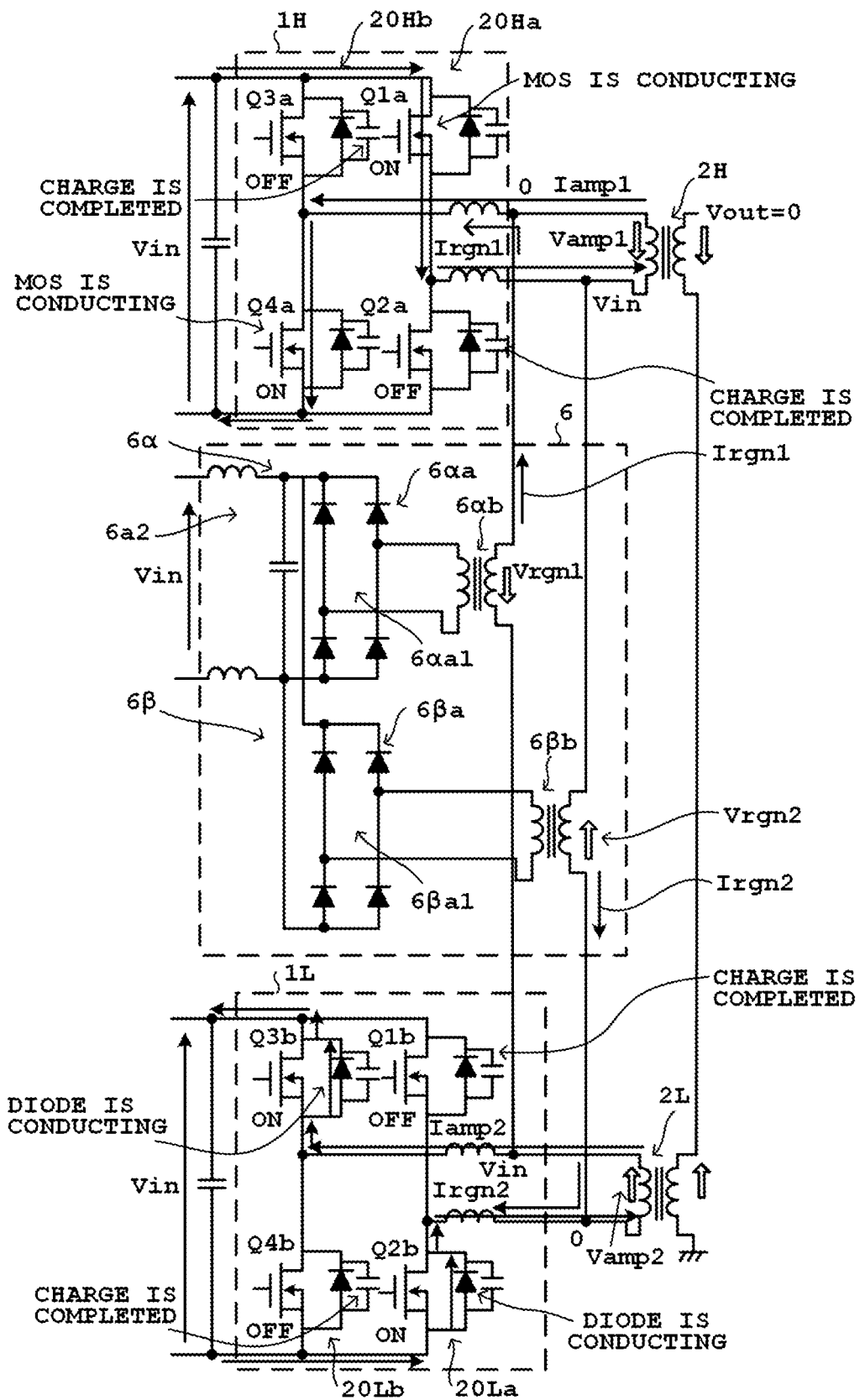
FIG. 25 illustrates an operation example (zone "A") in the second configuration example of the power conversion device according to the present invention.

FIG. 25 shows an operation state in the zone "A". In the zone "A", the switching elements Q1a, Q2a, Q3a and Q4a of the upper class-D amplifier 1H are ON, OFF, OFF and ON, respectively, and the switching elements Q1b, Q2b, Q3b and Q4b of the lower class-D amplifier 1L are OFF, ON, ON and OFF, respectively.

(a) Switching Element Q1a:

The high-side switching element Q1a of the upper class-D amplifier 1H is ON. A current flows via the switching element Q1a.

(b) Switching Element Q2a:

The low-side switching element Q2a of the upper class-D amplifier 1H is OFF. The charge of a parasitic capacitance of the switching element Q2a is completed at Vin because the high-side switching element Q1a is conducting to thereby apply a voltage at Vin between terminals.

(c) Switching Element Q3a:

The high-side switching element Q3a of the upper class-D amplifier 1H is OFF. The charge of a parasitic capacitance of the switching element Q3a is completed at Vin because the low-side switching element Q4a is conducting to thereby apply a voltage at Vin.

(d) Switching Element Q4a:

The low-side switching element Q4a of the upper class-D amplifier 1H is ON. The current flows via the switching element Q4a.

(e) Switching Element Q1b:

The high-side switching element Q1b of the lower class-D amplifier 1L is OFF. The charge of a parasitic capacitance of the switching element Q1b is completed at Vin because the low-side switching element Q2b is conducting to thereby apply a voltage at Vin.

(f) Switching Element Q2b:

The low-side switching element Q2b of the lower class-D amplifier 1L is ON. Although the discharge of electric charge in a parasitic capacitance of the switching element Q2b is completed, a current flows via a parasitic diode of the switching element Q2b because energy in an inductance of a primary coil in the output transformer 2L keeps flowing.

When the switching element Q2b turns from off to on, a discharge current flows in the switching element Q2b in the previous zone (H) ("d13" in FIG. 23(n)), so that a displacement voltage dv/dt is limited and thus a displacement current di/dt is limited. It prevents the increase in the gate-to-source voltage Vgs, thereby avoiding erroneous turn-on of the other switching element Q1b in the same leg (pulse signal indicated by a broken line in FIG. 23(e)).

(g) Switching Element Q3b:

The high-side switching element Q3b of the lower class-D amplifier 1L is ON. Although the discharge of electric charge in a parasitic capacitance of the switching element Q3b is completed, a current flows via a parasitic diode of the switching element Q3b because the energy in the inductance of the primary coil in the output transformer 2L keeps flowing.

When the switching element Q3b turns from off to on, the discharge current flows in the switching element Q3b in the previous zone (H) ("d14" in FIG. 23(o)), so that the displacement voltage dv/dt is limited and thus the displacement current di/dt is limited. It prevents the increase in the gate-to-source voltage Vgs, thereby avoiding erroneous turn-on of the other switching element Q4b in the same leg (pulse signal indicated by a broken line in FIG. 23(h)).

(h) Switching Element Q4b:

The low-side switching element Q4b of the lower class-D amplifier 1L is OFF. The charge of a parasitic capacitance of the switching element Q4b is completed at Vin/2 because the high-side switching element Q3b and the low-side switching element Q2b are conducting to thereby apply a voltage at Vin/2.

(i) Regeneration Transformer 6αb:

Due to a potential difference between the voltage Vamp1 in the upper class-D amplifier 1H and the voltage Vamp2 in the lower class-D amplifier 1L, an input voltage Vrgn1 is generated on an input terminal of the regeneration transformer 6αb, thereby causing a current Irgn1 to flow. There is a potential difference at Vin between the upper class-D amplifier 1H and the lower class-D amplifier 1L.

(j) Regeneration Transformer 6βb:

Due to the potential difference between the voltage Vamp1 in the upper class-D amplifier 1H and the voltage Vamp2 in the lower class-D amplifier 1L, an input voltage Vrgn2 is generated on an input terminal of the regeneration transformer 6βb, thereby causing a current Irgn2 to flow. There is a potential difference at Vin/2 between the upper class-D amplifier 1H and the lower class-D amplifier 1L, so that a regeneration operation is performed.

(k) Output:

The output voltage Vamp1 in the upper class-D amplifier 1H and the output voltage Vamp2 in the lower class-D amplifier 1L are in mutually opposite directions, so that no output voltage Vout is generated.

(l) Regeneration:

The current Irgn1 flows to the regeneration transformer 6αb of the regeneration circuit 6 and the current Irgn2 flows to the regeneration transformer 6βb, thereby implementing the regeneration operation.

(Zone "B")

Figure 26:
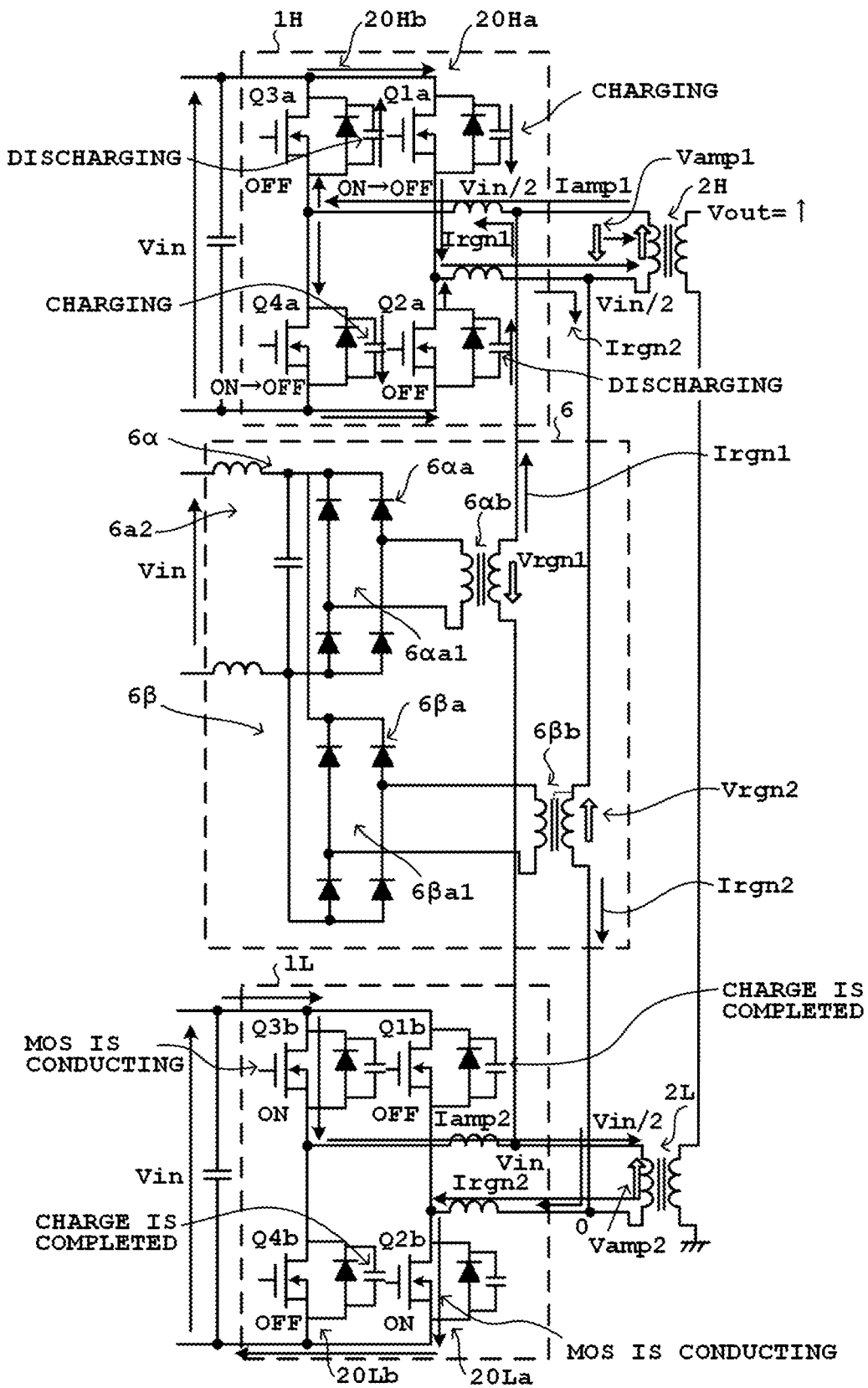
FIG. 26 illustrates an operation example (zone "B") in the second configuration example of the power conversion device according to the present invention.

FIG. 26 shows an operation state in the zone "B". In the zone "B", the switching elements Q1a, Q2a, Q3a and Q4a of the upper class-D amplifier 1H are OFF, OFF, OFF and OFF, respectively, and the switching elements Q1b, Q2b, Q3b and Q4b of the lower class-D amplifier 1L are OFF, ON, ON and OFF, respectively.

(a) Switching Element Q1a:

The high-side switching element Q1a of the upper class-D amplifier 1H turns from on to off. The charge of the parasitic capacitance of the switching element Q1a is started by a discharge current in the low-side switching element Q2a and the current Irgn2.

(b) Switching Element Q2a:

The low-side switching element Q2a of the upper class-D amplifier 1H is OFF. Although the switching element Q1a is OFF, the discharge of electric charge in the parasitic capacitance of the switching element Q2a is started because the energy in the inductance of the primary coil in the output transformer 2H keeps flowing. In addition to that, the current Irgn2 acts as an auxiliary current for discharging the switching element Q2a.

(c) Switching Element Q3a:

The high-side switching element Q3a of the upper class-D amplifier 1H is OFF. Although the switching element Q4a is OFF, the discharge of electric charge in the parasitic capacitance of the switching element Q3a is started because the energy in the inductance of the primary coil in the output transformer 2H keeps flowing. In addition to that, the current Irgn1 acts as an auxiliary current for discharging the switching element Q3a.

(d) Switching Element Q4a:

The low-side switching element Q4a of the upper class-D amplifier 1H turns from on to off. The charge of the parasitic capacitance of the switching element Q4a is started by the discharge current in the high-side switching element Q3a and the current Irgn1.

(e) Switching Element Q1b:

The high-side switching element Q1b of the lower class-D amplifier 1L is OFF. The charge of the parasitic capacitance of the switching element Q1b is completed at Vin because the switching element Q2b is ON.

(f) Switching Element Q2b:

The low-side switching element Q2b of the lower class-D amplifier 1L is ON. The current flows via the switching element Q3b and the switching element Q2b.

(g) Switching Element Q3b:

The high-side switching element Q3b of the lower class-D amplifier 1L is ON. The current flows via the switching element Q3b and the switching element Q2b.

(h) Switching Element Q4b:

The low-side switching element Q4b of the lower class-D amplifier 1L is OFF. The charge of the parasitic capacitance of the switching element Q4b is completed at Vin because the switching element Q3b is ON.

(i) Regeneration Transformer 6αb:

Due to a potential difference between the voltage Vamp1 in the upper class-D amplifier 1H and the voltage Vamp2 in the lower class-D amplifier 1L, the input voltage Vrgn1 is generated on the input terminal of the regeneration transformer 6αb, thereby causing the current Irgn1 to flow. There is a potential difference at Vin/2 between the upper class-D amplifier 1H and the lower class-D amplifier 1L.

(j) Regeneration Transformer 6βb:

Due to a potential difference between the voltage Vamp1 in the upper class-D amplifier 1H and the voltage Vamp2 in the lower class-D amplifier 1L, the input voltage Vrgn2 is generated on the input terminal of the regeneration transformer 6βb, thereby causing the current Irgn2 to flow. There is a potential difference at Vin/2 between the upper class-D amplifier 1H and the lower class-D amplifier 1L.

(k) Output:

The output voltage Vamp1 in the upper class-D amplifier 1H and the output voltage Vamp2 in the lower class-D amplifier 1L are in the same directions, so that an output voltage Vout is generated.

(l) Regeneration:

The current Irgn1 flows to the regeneration transformer 6αb of the regeneration circuit 6 and the current Irgn2 flows to the regeneration transformer 6βb, thereby implementing the regeneration operation.

{Zone "C"}

Figure 27:
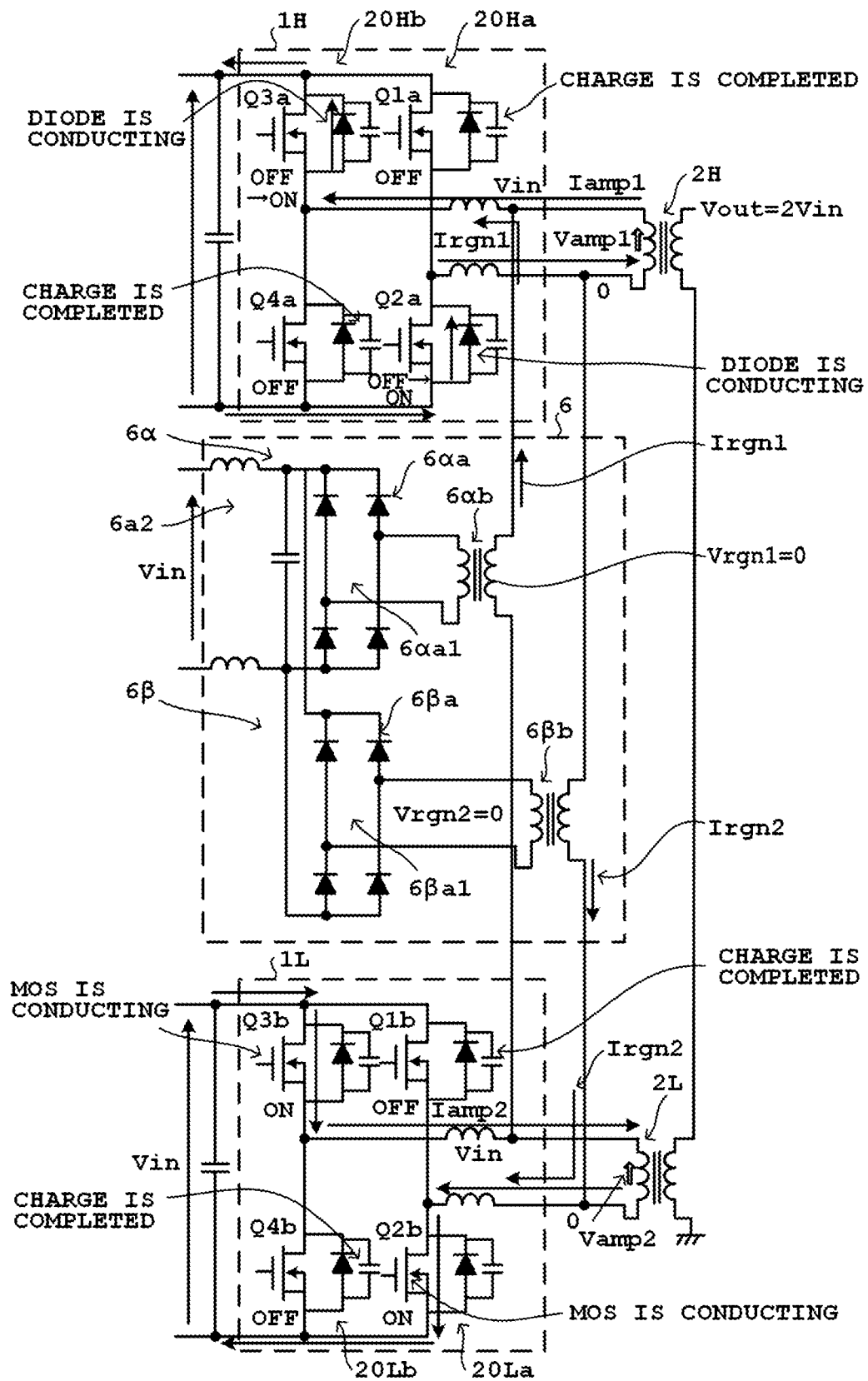
FIG. 27 illustrates an operation example (zone "C") in the second configuration example of the power conversion device according to the present invention.

FIG. 27 shows an operation state in the zone "C". In the zone "C", the switching elements Q1a, Q2a, Q3a and Q4a of the upper class-D amplifier 1H are OFF, ON, ON and OFF, respectively, and the switching elements Q1b, Q2b, Q3b and Q4b of the lower class-D amplifier 1L are OFF, ON, ON and OFF, respectively.

(a) Switching Element Q1a:

The high-side switching element Q1a of the upper class-D amplifier 1H is OFF. The charge of the parasitic capacitance of the switching element Q1a is completed at Vin because the switching element Q2a is ON.

(b) Switching Element Q2a:

The low-side switching element Q2a of the upper class-D amplifier 1H turns from off to on. Although the discharge of the electric charge in the parasitic capacitance of the switching element Q2a is completed, the current flows via the parasitic diode of the switching element Q2a because the energy in the primary coil in the output transformer 2H keeps flowing.

(c) Switching Element Q3a:

The high-side switching element Q3a of the upper class-D amplifier 1H turns from off to on. Although the discharge of the electric charge in the parasitic capacitance of the switching element Q3a is completed, the current flows via the parasitic diode of the switching element Q3a because the energy in the primary coil in the output transformer 2H keeps flowing.

(d) Switching Element Q4a:

The low-side switching element Q4a of the upper class-D amplifier 1H is OFF. The charge of the parasitic capacitance of the switching element Q4a is completed at Vin because the switching element Q3a is ON.

(e) Switching Element Q1b:

The high-side switching element Q1b of the lower class-D amplifier 1L is OFF. The charge of the parasitic capacitance of the switching element Q1b is completed at Vin because the switching element Q2b is ON.

(f) Switching Element Q2b:

The low-side switching element Q2b of the lower class-D amplifier 1L is ON. The current flows via the switching element Q3b and the switching element Q2b.

(g) Switching Element Q3b:

The high-side switching element Q3b of the lower class-D amplifier 1L is ON. The current flows via the switching element Q3b and the switching element Q2b.

(h) Switching Element Q4b:

The low-side switching element Q4b of the lower class-D amplifier 1L is OFF. The charge of the parasitic capacitance of the switching element Q4b is completed at Vin because the switching element Q3b is ON.

(i) Regeneration Transformer 6αb:

There is no potential difference between the voltage Vamp1 in the upper class-D amplifier 1H and the voltage Vamp2 in the lower class-D amplifier 1L. However, energy in a leakage inductance of the regeneration transformer 6αb causes the current Irgn1 to flow.

(j) Regeneration Transformer 6β$b$:

There is no potential difference between the voltage Vamp1 in the upper class-D amplifier 1H and the voltage Vamp2 in the lower class-D amplifier 1L. However, energy in a leakage inductance of the regeneration transformer 6β$b$ causes the current Irgn2 to flow.

(k) Output:

The output voltage Vamp1 in the upper class-D amplifier 1H and the output voltage Vamp2 in the lower class-D amplifier 1L are in the same direction, so that an output voltage Vout=2·Vin is generated.

(l) Regeneration:

The current Irgn1 flows to the regeneration transformer 6α$b$ of the regeneration circuit 6 and the current Irgn2 flows to the regeneration transformer 6β$b$, thereby implementing the regeneration operation.

(Zone "D")

Figure 28:
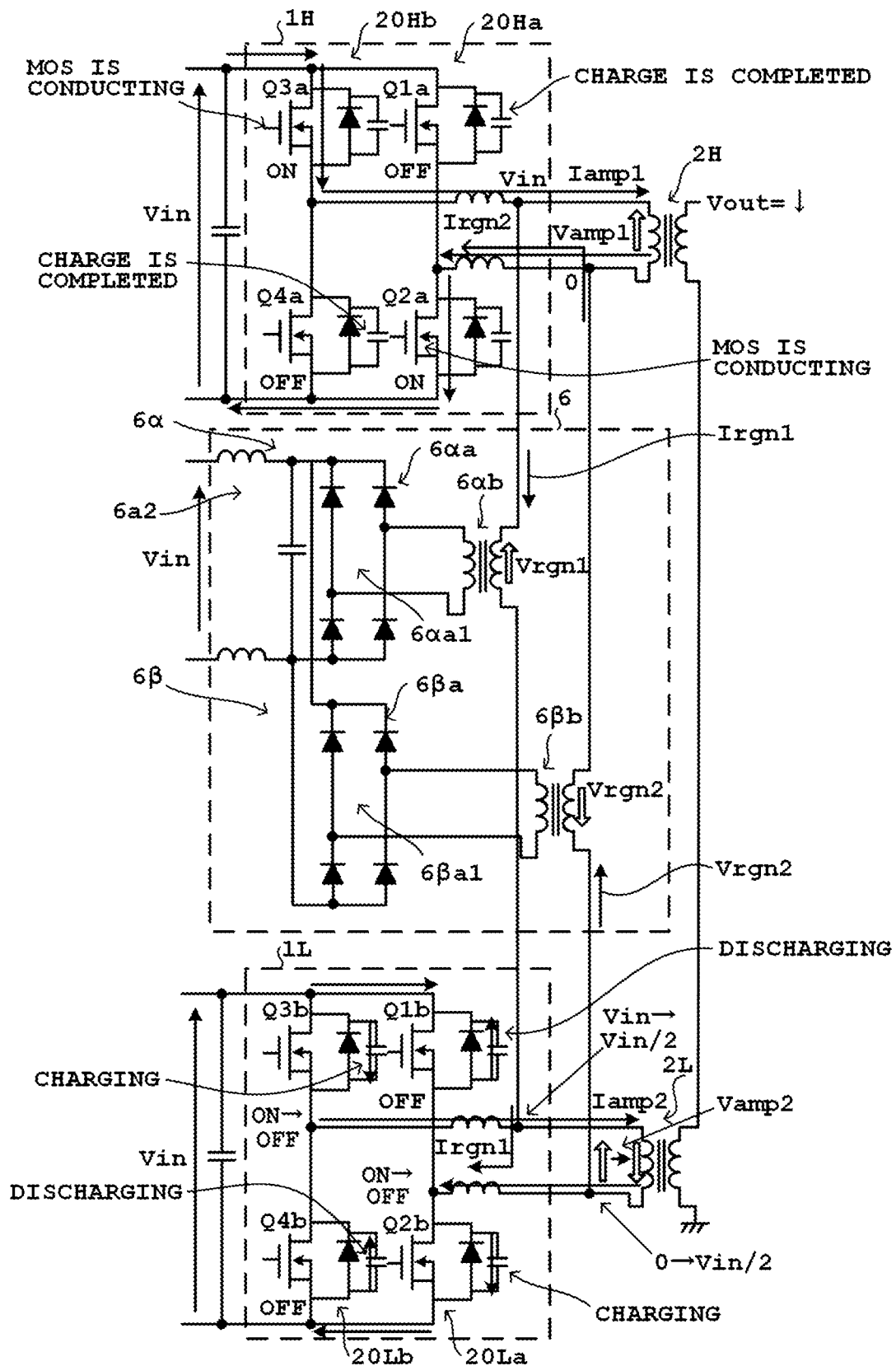
FIG. 28 illustrates an operation example (zone "D") in the second configuration example of the power conversion device according to the present invention.

FIG. 28 shows an operation state in the zone "D". In the zone "D", the switching elements Q1$a$, Q2$a$, Q3$a$ and Q4$a$ of the upper class-D amplifier 1H are OFF, ON, ON and OFF, respectively, and the switching elements Q1$b$, Q2$b$, Q3$b$ and Q4$b$ of the lower class-D amplifier 1L are OFF, OFF, OFF and OFF, respectively.

(a) Switching Element Q1$a$:

The high-side switching element Q1$a$ of the upper class-D amplifier 1H is OFF. The charge of the parasitic capacitance of the switching element Q1$a$ is completed at Vin because the switching element Q2$a$ is ON.

(b) Switching Element Q2$a$:

The low-side switching element Q2$a$ of the upper class-D amplifier 1H is ON. The current flows via the switching element Q3$a$ and the switching element Q2$a$.

(c) Switching Element Q3$a$:

The high-side switching element Q3$a$ of the upper class-D amplifier 1H is ON. The current flows via the switching element Q3$a$ and the switching element Q2$a$.

(d) Switching Element Q4$a$:

The low-side switching element Q4$a$ of the upper class-D amplifier 1H is OFF. The charge of the parasitic capacitance of the switching element Q4$a$ is completed at Vin because the switching element Q3$a$ is ON.

(e) Switching Element Q1$b$:

The high-side switching element Q1$b$ of the lower class-D amplifier 1L is OFF. Although the switching element Q2$b$ turns off, the discharge of the electric charge in the parasitic capacitance of the switching element Q1$b$ is started because energy in the inductance of a primary coil in the output transformer 2L keeps flowing. Furthermore, the current Irgn1 acts as an auxiliary current for discharging the switching element Q1$b$.

(f) Switching Element Q2$b$:

The low-side switching element Q2$b$ of the lower class-D amplifier 1L turns from on to off. The charge of the parasitic capacitance of the switching element Q2$b$ is started by the discharge current of the switching element Q1$b$ and the current Irgn1.

(g) Switching Element Q3$b$:

The high-side switching element Q3$b$ of the lower class-D amplifier 1L turns from on to off. The charge of the parasitic capacitance of the switching element Q3$b$ is started by the discharge current of the switching element Q4$b$ and the current Irgn2.

(h) Switching element Q4$b$:

The low-side switching element Q4$b$ of the lower class-D amplifier 1L is OFF. Although the switching element Q3$b$ turns off, the discharge of the electric charge in the parasitic capacitance of the switching element Q4$b$ is started because the energy in the inductance of the primary coil in the output transformer 2L keeps flowing. In addition to that, the current Irgn2 acts as an auxiliary current for discharging the switching element Q4$b$.

(i) Regeneration transformer 6α$b$:

Due to the potential difference between the voltage Vamp1 in the upper class-D amplifier 1H and the voltage Vamp2 in the lower class-D amplifier 1L, the input voltage Vrgn1 is generated on the input terminal of the regeneration transformer 6α$b$, thereby causing the current Irgn1 to flow. The potential difference between the upper class-D amplifier 1H and the lower class-D amplifier 1L changes from Vin to Vin/2.

(j) Regeneration transformer 6β$b$:

Due to the potential difference between the voltage Vamp1 in the upper class-D amplifier 1H and the voltage Vamp2 in the lower class-D amplifier 1L, the input voltage Vrgn2 is generated on the input terminal of the regeneration transformer 6β$b$, thereby causing the current Irgn2 to flow. The potential difference between the upper class-D amplifier 1H and the lower class-D amplifier 1L changes from Vin to Vin/2.

(k) Output:

The output voltage Vout drops due to the change in the output voltage Vamp2 in the lower class-D amplifier 1L.

(l) Regeneration:

The current Irgn1 flows to the regeneration transformer 6α$b$ of the regeneration circuit 6 and the current Irgn2 flows to the regeneration transformer 6β$b$, thereby implementing the regeneration operation.

(Zone "E")

Figure 29:
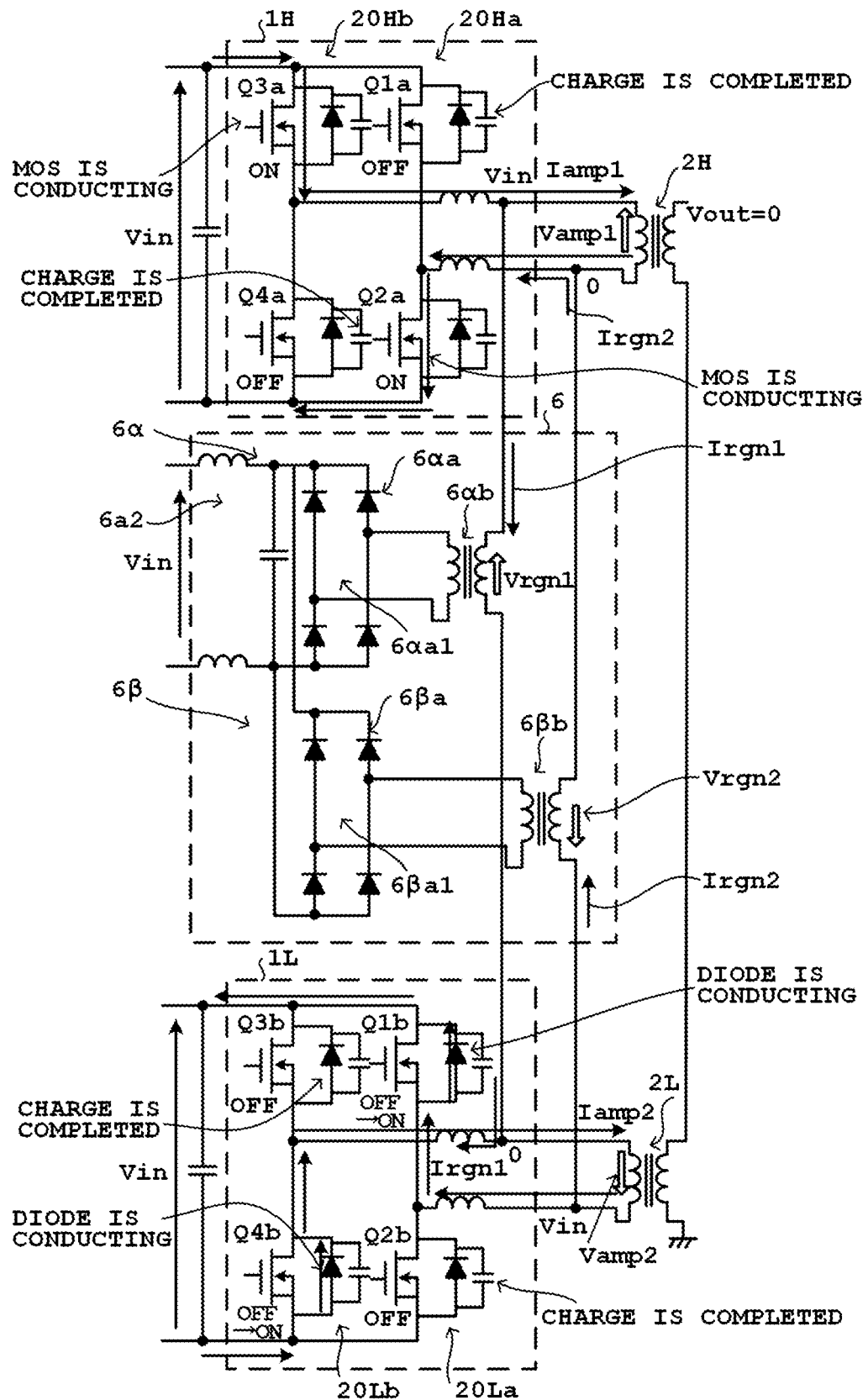
FIG. 29 illustrates an operation example (zone "E") in the second configuration example of the power conversion device according to the present invention.

FIG. 29 shows an operation state in the zone "E". In the zone "E", the switching elements Q1$a$, Q2$a$, Q3$a$ and Q4$a$ of the upper class-D amplifier 1H are OFF, ON, ON and OFF, respectively, and the switching elements Q1$b$, Q2$b$, Q3$b$ and Q4$b$ of the lower class-D amplifier 1L are ON, OFF, OFF and ON, respectively.

(a) Switching Element Q1$a$:

The high-side switching element Q1$a$ of the upper class-D amplifier 1H is OFF. The charge of the parasitic capacitance of the switching element Q1$a$ is completed at Vin because the low-side switching element Q2$a$ is conducting to thereby apply a voltage at Vin between the terminals.

(b) Switching Element Q2$a$:

The low-side switching element Q2$a$ of the upper class-D amplifier 1H is ON. The current flows via the switching element Q2$a$.

(c) Switching Element Q3$a$:

The high-side switching element Q3$a$ of the upper class-D amplifier 1H is ON. The current flows via the switching element Q3$a$.

(d) Switching Element Q4$a$:

The low-side switching element Q4$a$ of the upper class-D amplifier 1H is OFF. The charge of the parasitic capacitance of the switching element Q4$a$ is completed at Vin because the high-side switching element Q3$a$ is conducting to thereby apply the voltage at Vin.

(e) Switching element Q1$b$:

The high-side switching element Q1$b$ of the lower class-D amplifier 1L turns from off to on. Although the discharge of electric charge in the parasitic capacitance of the switching element Q1$b$ is completed, the current flows via the parasitic diode of the switching element Q1$b$ because the energy in the inductance of the primary coil in the output transformer 2L keeps flowing.

Figure 23:
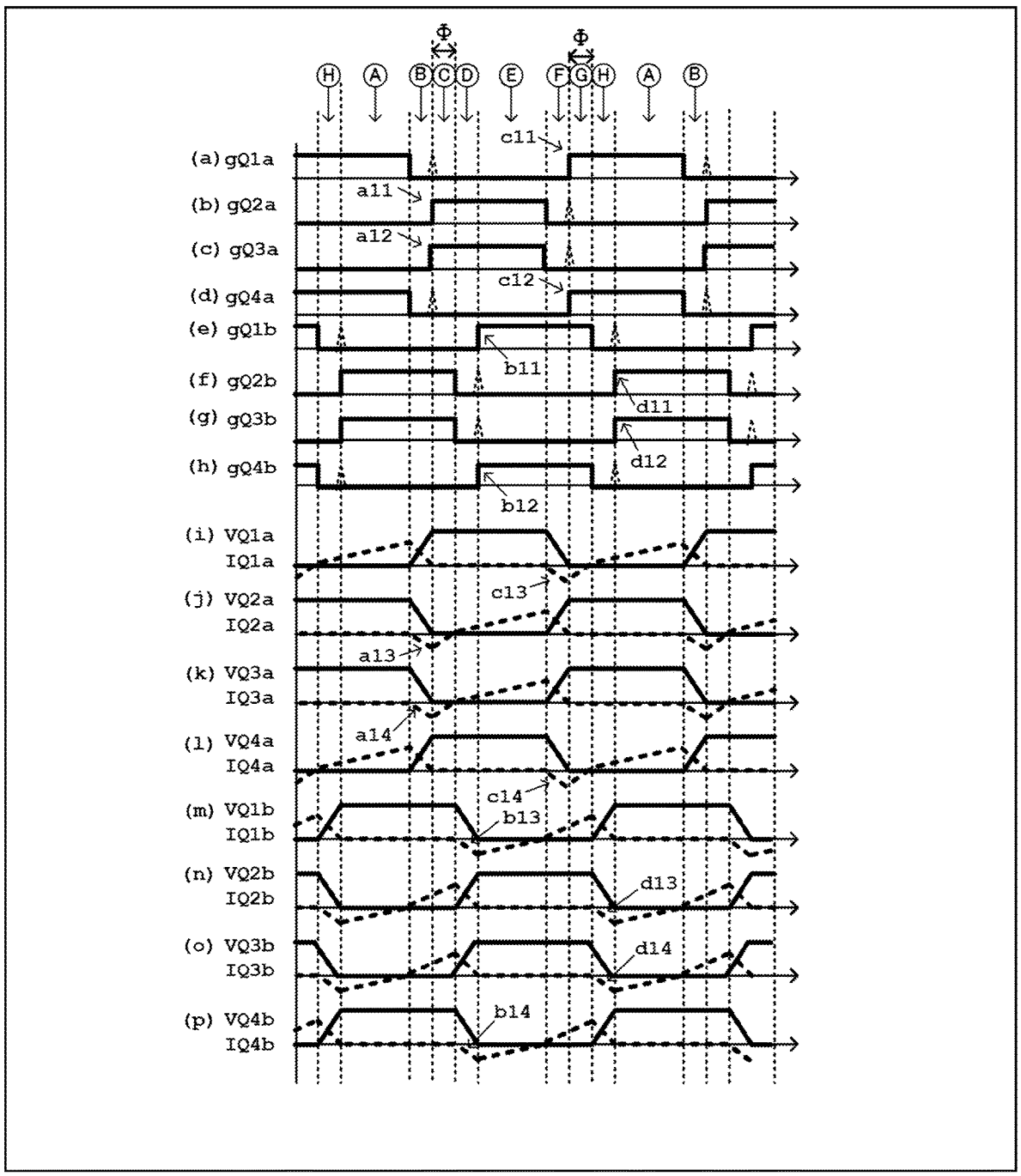
FIG. 23 illustrates a signal example in the second configuration example of the power conversion device according to the present invention.
Figure 24:
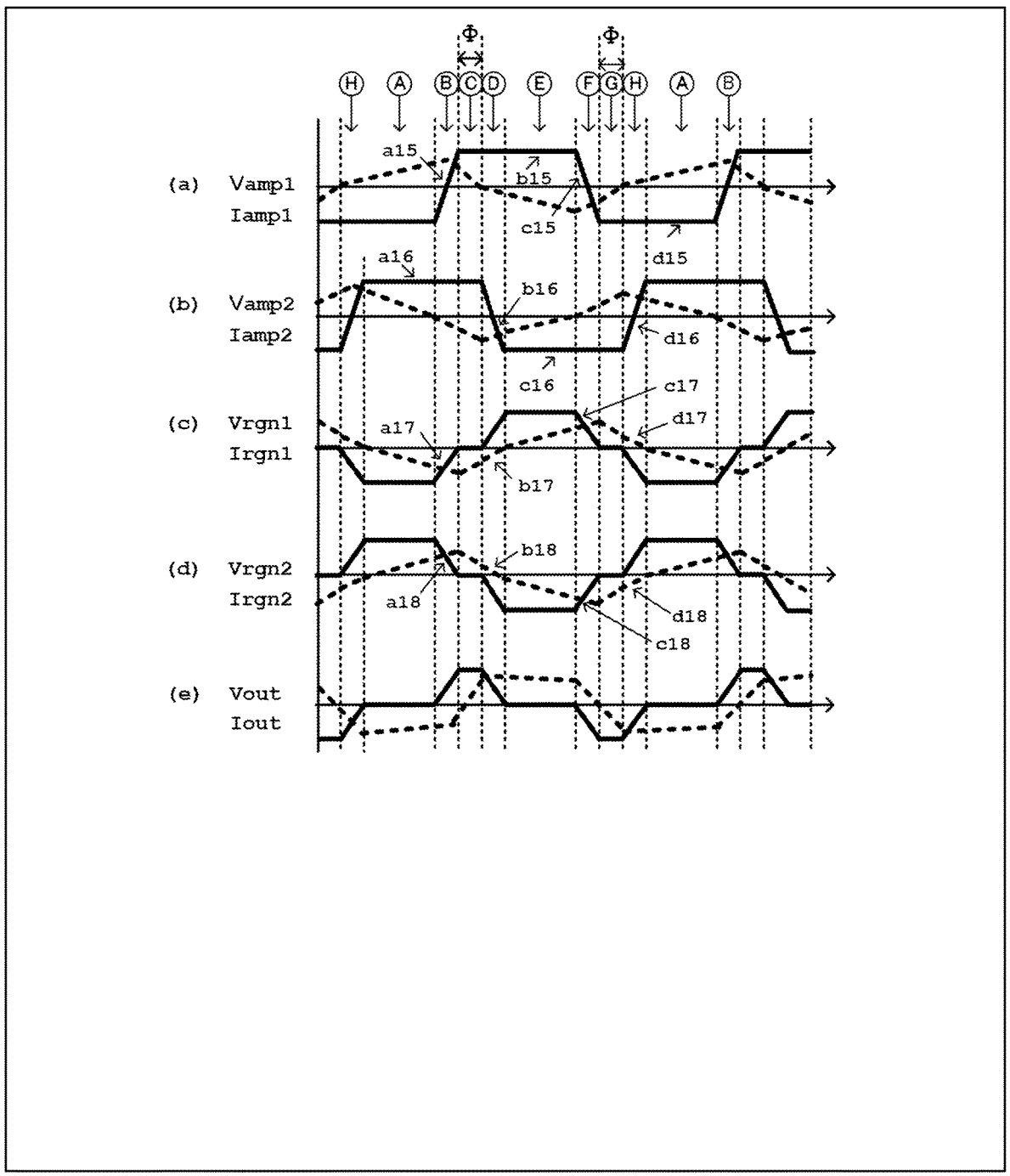
FIG. 24 illustrates a signal example in the second configuration example of the power conversion device according to the present invention.

When the switching element Q1$b$ turns from off to on, the discharge current flows in the switching element Q1$b$ in the previous zone (D) ("b13" in FIG. 23($m$)), so that the displacement voltage dv/dt is limited and thus the displacement current di/dt is limited. It prevents the increase in the gate-to-source voltage Vgs, thereby avoiding erroneous turn-on of the other switching element Q2$b$ in the same leg (pulse signal indicated by a broken line in FIG. 23($f$)).

(f) Switching Element Q2$b$:

The low-side switching element Q2$b$ of the lower class-D amplifier 1L is OFF. The charge of the parasitic capacitance of the switching element Q2$b$ is completed at Vin because the high-side switching element Q1$b$ is conducting to thereby apply the voltage at Vin.

(g) Switching Element Q3$b$:

The high-side switching element Q3$b$ of the lower class-D amplifier 1L is OFF. The charge of the parasitic capacitance of the switching element Q3$b$ is completed at Vin because the low-side switching element Q4$b$ is conducting to thereby apply the voltage at Vin.

(h) Switching Element Q4$b$:

The low-side switching element Q4$b$ of the lower class-D amplifier 1L is ON. Although the discharge of electric charge in the parasitic capacitance of the switching element Q4$b$ is completed, the current flows via the parasitic diode of the switching element Q4$b$ because the energy in the inductance of the primary coil in the output transformer 2L keeps flowing.

When the switching element Q4$b$ turns from off to on, the discharge current flows in the switching element Q4$b$ in the previous zone (D) ("b14" in FIG. 23($p$)), so that the displacement voltage dv/dt is limited and thus the displacement current di/dt is limited. It prevents the increase in the gate-to-source voltage Vgs, thereby avoiding erroneous turn-on of the other switching element Q3$b$ in the same leg (pulse signal indicated by a broken line in FIG. 23($g$)).

(i) Regeneration Transformer 6α$b$:

Due to the potential difference between the voltage Vamp1 in the upper class-D amplifier 1H and the voltage Vamp2 in the lower class-D amplifier 1L, the input voltage Vrgn1 is generated on the input terminal of the regeneration transformer 6α$b$, thereby causing the current Irgn1 to flow. There is a potential difference at Vin between the upper class-D amplifier 1H and the lower class-D amplifier 1L.

(j) Regeneration Transformer 6β$b$:

Due to the potential difference between the voltage Vamp1 in the upper class-D amplifier 1H and the voltage Vamp2 in the lower class-D amplifier 1L, the input voltage Vrgn2 is generated on the input terminal of the regeneration transformer 6β$b$, thereby causing the current Irgn2 to flow. There is a potential difference at Vin between the upper class-D amplifier 1H and the lower class-D amplifier 1L.

(k) Output:

The output voltage Vamp1 in the upper class-D amplifier 1H and the output voltage Vamp2 in the lower class-D amplifier 1L are in mutually opposite directions, so that no output voltage Vout is generated.

(l) Regeneration:

The current Irgn1 flows to the regeneration transformer 6α$b$ of the regeneration circuit 6 and the current Irgn2 flows to the regeneration transformer 6β$b$, thereby implementing the regeneration operation.

(Zone "F")

Figure 30:
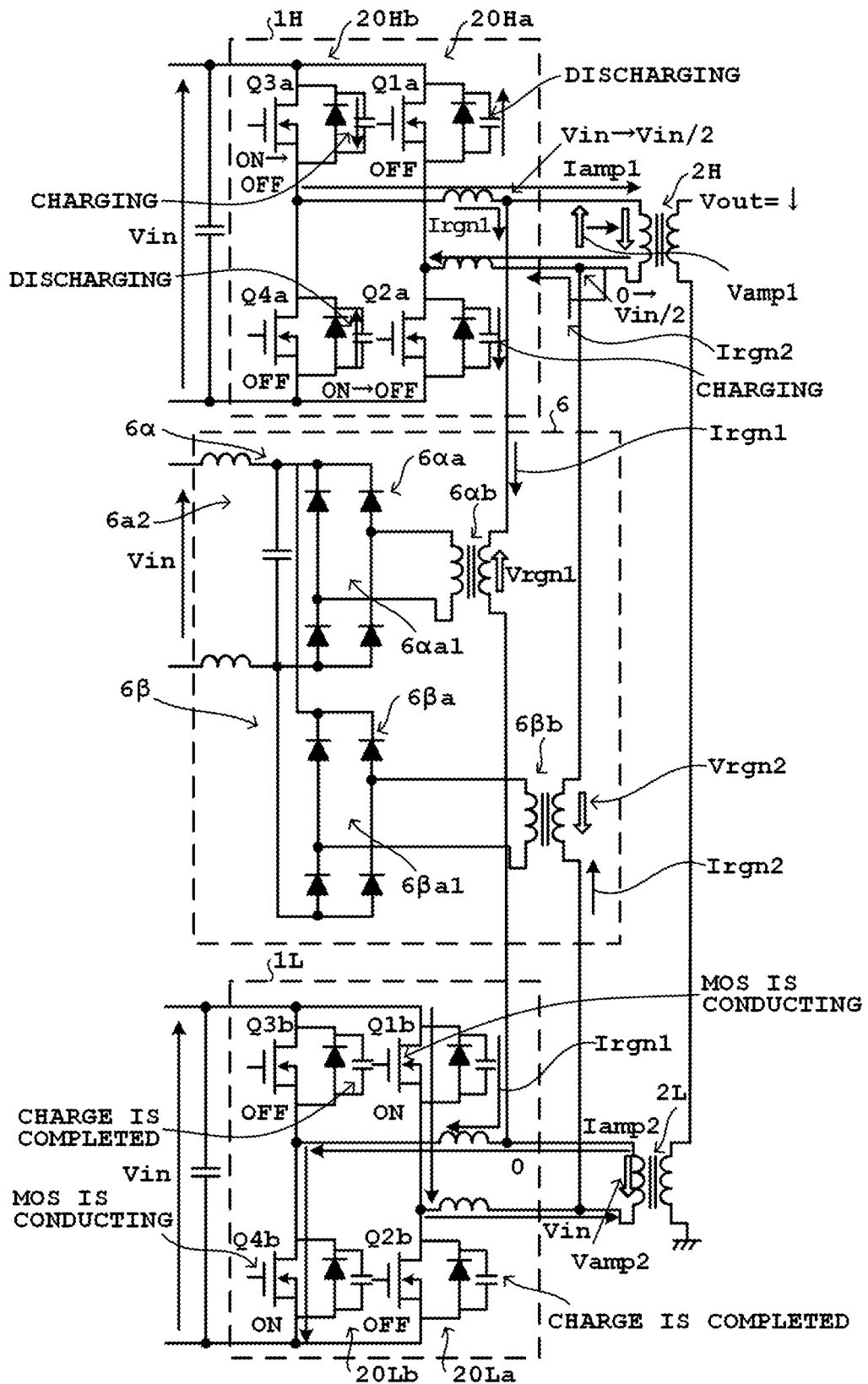
FIG. 30 illustrates an operation example (zone "F") in the second configuration example of the power conversion device according to the present invention.

FIG. 30 shows an operation state in the zone "F". In the zone "F", the switching elements Q1$a$, Q2$a$, Q3$a$ and Q4$a$ of the upper class-D amplifier 1H are OFF, OFF, OFF and OFF, respectively, and the switching elements Q1$b$, Q2$b$, Q3$b$ and Q4$b$ of the lower class-D amplifier 1L are ON, OFF, OFF and ON, respectively.

(a) Switching Element Q1$a$:

The high-side switching element Q1$a$ of the upper class-D amplifier 1H is OFF. Although the switching element Q2$a$ turns off, the discharge of the electric charge charged in the parasitic capacitance of the switching element Q1$a$ is started because the energy in the inductance of the primary coil in the output transformer 2H keeps flowing. In addition to that, the current Irgn2 acts as an auxiliary current for discharging the switching element Q2$a$.

(b) Switching Element Q2$a$:

The low-side switching element Q2$a$ of the upper class-D amplifier 1H turns from on to off. The charge of the parasitic capacitance of the switching element Q2$a$ is started by the discharge current in the switching element Q1$a$ and the current Irgn2.

(c) Switching Element Q3$a$:

The high-side switching element Q3$a$ of the upper class-D amplifier 1H turns from on to off. The charge of the parasitic capacitance of the switching element Q3$a$ is started by the discharge current in the switching element Q4$a$ and the current Irgn1.

(d) Switching Element Q4$a$:

The low-side switching element Q4$a$ of the upper class-D amplifier 1H is OFF. Although the switching element Q3$a$ turns off, the discharge of the electric charge in the parasitic capacitance of the switching element Q4$a$ is started because the energy in the inductance of the primary coil in the output transformer 2H keeps flowing. In addition to that, the current Irgn1 acts as an auxiliary current for discharging the switching element Q3$a$.

(e) Switching Element Q1$b$:

The high-side switching element Q1$b$ of the lower class-D amplifier 1L is ON. The current flows via the switching element Q1$b$ and the switching element Q4$b$.

(f) Switching Element Q2$b$:

The low-side switching element Q2$b$ of the lower class-D amplifier 1L is OFF. The charge of the parasitic capacitance of the switching element Q2$b$ is completed at Vin because the switching element Q1$b$ is ON.

(g) Switching Element Q3$b$:

The high-side switching element Q3$b$ of the lower class-D amplifier 1L is OFF. The charge of the parasitic capacitance of the switching element Q3$b$ is completed at Vin because the switching element Q4$b$ is ON.

(h) Switching Element Q4$b$:

The low-side switching element Q4$b$ of the lower class-D amplifier 1L is ON. The current flows via the switching element Q1$b$ and the switching element Q4$b$.

(i) Regeneration Transformer 6α$b$:

Due to the potential difference between the voltage Vamp1 in the upper class-D amplifier 1H and the voltage Vamp2 in the lower class-D amplifier 1L, the input voltage Vrgn1 is generated on the input terminal of the regeneration transformer 6α$b$, thereby causing the current Irgn1 to flow.

(j) Regeneration Transformer 6β$b$:

Due to the potential difference between the voltage Vamp1 in the upper class-D amplifier 1H and the voltage Vamp2 in the lower class-D amplifier 1L, the input voltage Vrgn2 is generated on the input terminal of the regeneration transformer 6β$b$, thereby causing the current Irgn2 to flow.

(k) Output:

The output voltage Vamp1 in the upper class-D amplifier and the output voltage Vamp2 in the lower class-D amplifier 1L generate the output voltage Vout.

(l) Regeneration:

The current Irgn1 flows to the regeneration transformer 6α*b* of the regeneration circuit 6 and the current Irgn2 flows to the regeneration transformer 6β*b*, thereby implementing the regeneration operation.

(Zone "G")

Figure 31:
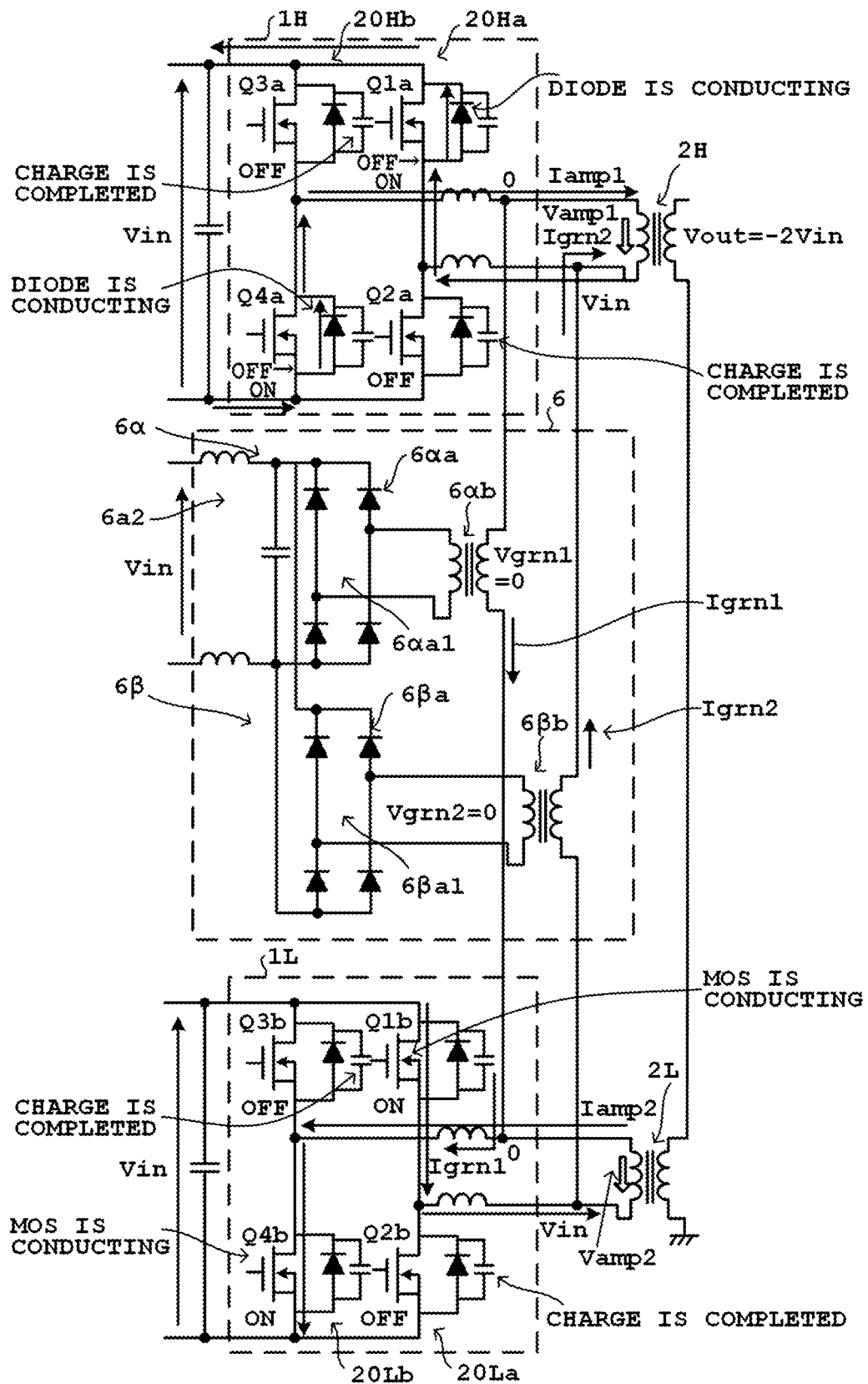
FIG. 31 illustrates an operation example (zone "G") in the second configuration example of the power conversion device according to the present invention.

FIG. 31 shows an operation state in the zone "G". In the zone "G", the switching elements Q1*a*, Q2*a*, Q3*a* and Q4*a* of the upper class-D amplifier 1H are ON, OFF, OFF and ON, respectively, and the switching elements Q1*b*, Q2*b*, Q3*b* and Q4*b* of the lower class-D amplifier 1L are ON, OFF, OFF and ON, respectively.

(a) Switching Element Q1*a*:

The high-side switching element Q1*a* of the upper class-D amplifier 1H turns from off to on. Although the discharge of the electric charge in the parasitic capacitance of the switching element Q1*a* is completed, the current flows via the parasitic diode in the switching element Q1*a* because the energy in the primary coil of the output transformer 2H keeps flowing.

(b) Switching Element Q2*a*:

The low-side switching element Q2*a* of the upper class-D amplifier 1H is OFF. The charge of the parasitic capacitance of the switching element Q2*a* is completed at Vin because the switching element Q1*a* is ON.

(c) Switching Element Q3*a*:

The high-side switching element Q3*a* of the upper class-D amplifier 1H is OFF. The charge of the parasitic capacitance of the switching element Q3*a* is completed at Vin because the switching element Q4*a* is ON.

(d) Switching Element Q4*a*:

The low-side switching element Q4*a* of the upper class-D amplifier 1H turns from off to on. Although the discharge of the electric charge in the parasitic capacitance of the switching element Q3*a* is completed, the current flows via the parasitic diode in the switching element Q4*a* because the energy in the primary coil of the output transformer 2H keeps flowing.

(e) Switching element Q1*b*:

The high-side switching element Q1*b* of the lower class-D amplifier 1L is ON. The current flows via the switching element Q1*b* and the switching element Q4*b*.

(f) Switching Element Q2*b*:

The low-side switching element Q2*b* of the lower class-D amplifier 1L is OFF. The charge of the parasitic capacitance of the switching element Q2*b* is completed at Vin because the switching element Q1*b* is ON.

(g) Switching Element Q3*b*:

The high-side switching element Q3*b* of the lower class-D amplifier 1L is OFF. The charge of the parasitic capacitance of the switching element Q3*b* is completed at Vin because the switching element Q4*b* is ON.

(h) Switching Element Q4*b*:

The low-side switching element Q4*b* of the lower class-D amplifier 1L is ON. The current flows via the switching element Q1*b* and the switching element Q4*b*.

(i) Regeneration Transformer 6α*b*:

There is no potential difference between the voltage Vamp1 in the upper class-D amplifier 1H and the voltage Vamp2 in the lower class-D amplifier 1L. However, the energy in the leakage inductance of the regeneration transformer 6α*b* causes the current Irgn1 to flow.

(j) Regeneration Transformer 6β*b*:

There is no potential difference between the voltage Vamp1 in the upper class-D amplifier 1H and the voltage Vamp2 in the lower class-D amplifier 1L. However, the energy in the leakage inductance of the regeneration transformer 6β*b* causes the current Irgn2 to flow.

(k) Output:

The output voltage Vamp1 in the upper class-D amplifier 1H and the output voltage Vamp2 in the lower class-D amplifier 1L are in the same direction, so that an output voltage Vout=−2·Vin is generated.

(l) Regeneration:

The current Irgn1 flows to the regeneration transformer 6α*b* of the regeneration circuit 6 and the current Irgn2 flows to the regeneration transformer 6β*b*, thereby implementing the regeneration operation.

(Zone "H")

Figure 32:
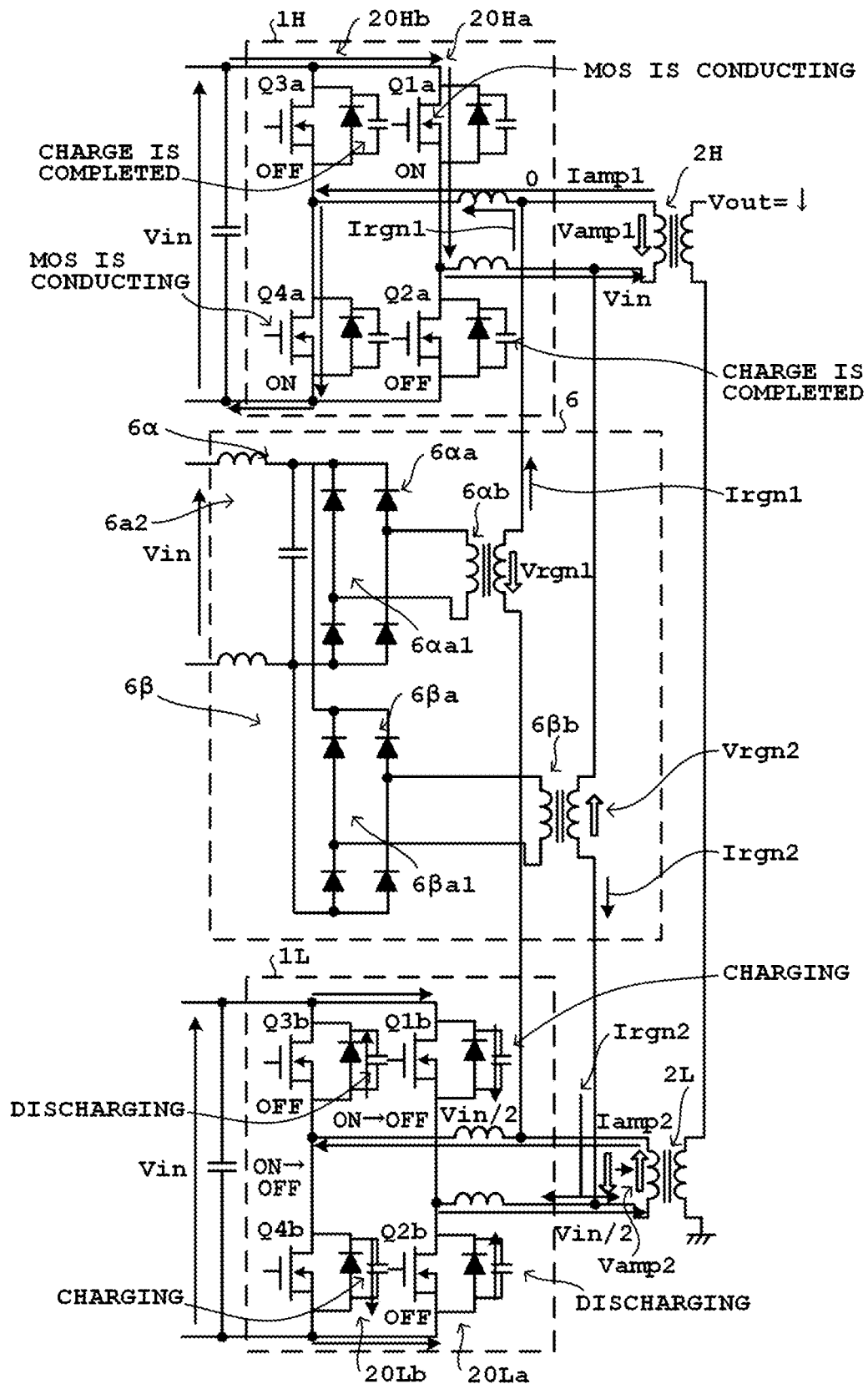
FIG. 32 illustrates an operation example (zone "H") in the second configuration example of the power conversion device according to the present invention.

FIG. 32 shows an operation state in the zone "H". In the zone "H", the switching elements Q1*a*, Q2*a*, Q3*a* and Q4*a* of the upper class-D amplifier 1H are ON, OFF, OFF and ON, respectively, and the switching elements Q1*b*, Q2*b*, Q3*b* and Q4*b* of the lower class-D amplifier 1L are OFF, OFF, OFF and OFF, respectively.

(a) Switching Element Q1*a*:

The high-side switching element Q1*a* of the upper class-D amplifier 1H is ON. The current flows via the switching element Q1*a* and the switching element Q4*a*.

(b) Switching Element Q2*a*:

The low-side switching element Q2*a* of the upper class-D amplifier 1H is OFF. The charge of the parasitic capacitance of the switching element Q2*a* is completed at Vin because the switching element Q1*a* is ON.

(c) Switching Element Q3*a*:

The high-side switching element Q3*a* of the upper class-D amplifier 1H is OFF. The charge of the parasitic capacitance of the switching element Q3*a* is completed at Vin because the switching element Q4*a* is ON.

(d) Switching Element Q4*a*:

The low-side switching element Q4*a* of the upper class-D amplifier 1H is ON. The current flows via the switching element Q1*a* and the switching element Q4*a*.

(e) Switching element Q1*b*:

The high-side switching element Q1*b* of the lower class-D amplifier 1L turns from on to off. The charge of the parasitic capacitance of the switching element Q1*b* is started by the discharge current in the switching element Q2*b* and the current Irgn1.

(f) Switching Element Q2*b*:

The low-side switching element Q2*b* of the lower class-D amplifier 1L is OFF. Although the switching element Q1*b* turns off, the discharge of the electric charge in the parasitic capacitance of the switching element Q2*b* is started because the energy in the inductance of the primary coil in the output transformer 2L keeps flowing. In addition to that, the current Irgn1 acts as an auxiliary current for discharging the switching element Q2*b*.

(g) Switching Element Q3*b*:

The high-side switching element Q3*b* of the lower class-D amplifier 1L is OFF. Although the switching element Q4*b* turns off, the discharge of the electric charge charged in the parasitic capacitance of the switching element Q3*b* is started because the energy in the inductance of the primary coil in the output transformer 2L keeps flowing. In addition to that, the current Irgn2 acts as an auxiliary current for discharging the switching element Q3*b*.

(h) Switching Element Q4*b*:

The low-side switching element Q4*b* of the lower class-D amplifier 1L turns from on to off. The charge of the parasitic capacitance of the switching element Q4*b* is started by the discharge current in the switching element Q3*b* and the current Irgn2.

(i) Regeneration Transformer 6αb:

Due to the potential difference between the voltage Vamp1 in the upper class-D amplifier 1H and the voltage Vamp2 in the lower class-D amplifier 1L, the input voltage Vrgn1 is generated on the input terminal of the regeneration transformer 6αb, thereby causing the current Irgn1 to flow. The potential difference between the upper class-D amplifier 1H and the lower class-D amplifier 1L changes from zero to −Vin/2.

(j) Regeneration Transformer 6βb:

Due to the potential difference between the voltage Vamp1 in the upper class-D amplifier 1H and the voltage Vamp2 in the lower class-D amplifier 1L, the input voltage Vrgn2 is generated on the input terminal of the regeneration transformer 6βb, thereby causing the current Irgn2 to flow. The potential difference between the upper class-D amplifier 1H and the lower class-D amplifier 1L changes from zero to Vin/2.

(k) Output:

The output voltage Vout increases toward a voltage zero due to the change in the output voltage Vamp2 in the lower class-D amplifier 1L.

(l) Regeneration:

The current Irgn1 flows to the regeneration transformer 6αb of the regeneration circuit 6 and the current Irgn2 flows to the regeneration transformer 6βb, thereby implementing the regeneration operation.

Third Configuration Example of Invention

Circuit Example of Third Configuration Example

A third configuration example of the present invention will be described by referring to FIG. 33. In the third configuration example, an upper class-D amplifier and a lower class-D amplifier have full bridge configurations, and two regeneration circuits are provided as current-auxiliary circuits. The third configuration example is similar to the second configuration example in that the upper class-D amplifier and the lower class-D amplifier have the bridge configurations and that the current-auxiliary circuits consist of two regeneration circuits. On the other hand, the third configuration example differs from the second configuration example in terms of the relation of connection between the lower class-D amplifier and an output transformer, the relation of connection between the upper class-D amplifier and the lower class-D amplifier, and the characteristics of the output transformer.

Figure 33:
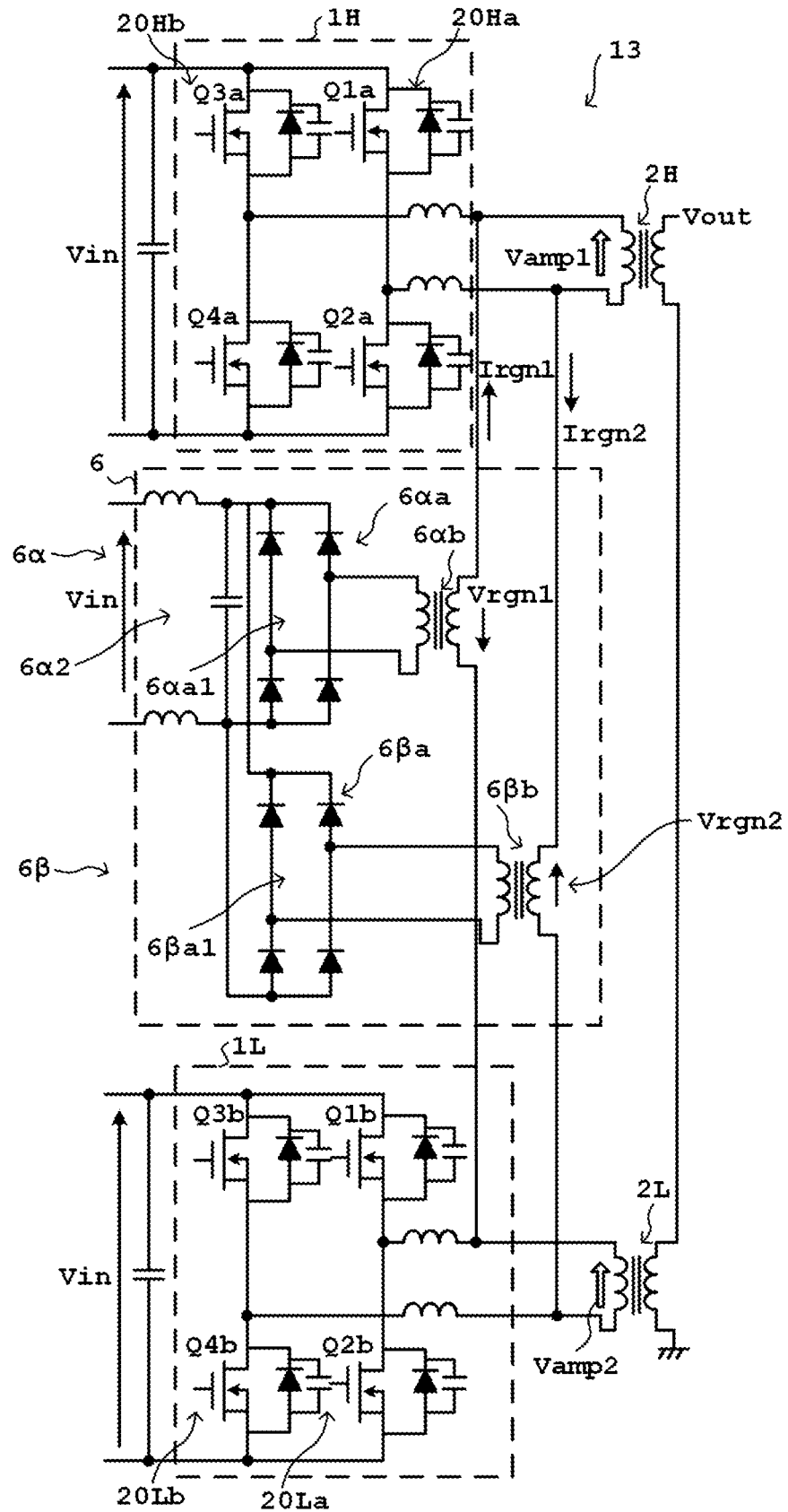
FIG. 33 illustrates a circuit example in a third configuration example of the power conversion device according to the present invention.
Figure 34:
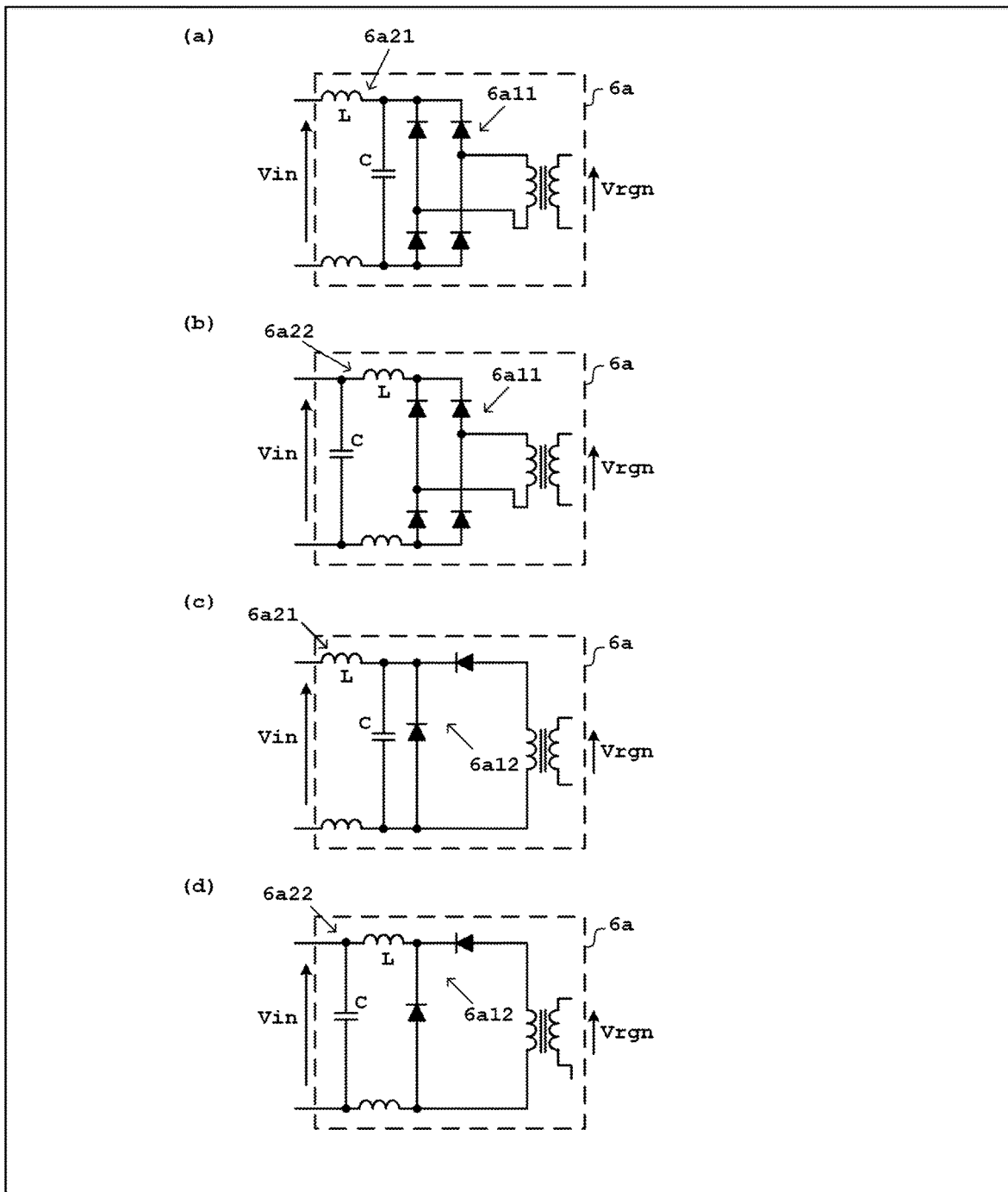
FIG. 34 illustrates another configuration example of a regeneration circuit of the power conversion device according to the present invention.

FIG. 33 shows a circuit example of the third configuration example of the invention. In this figure, only the configurations of the upper class-D amplifier, the lower class-D amplifier and the regeneration circuit are shown.

In a power conversion device 13 of the third configuration example, an upper class-D amplifier 1H, a lower class-D amplifier 1L and a regeneration circuit 6 have the same configuration as the circuitry of the second configuration example shown in FIG. 19, and the relation of connection between the lower class-D amplifier 1L and the output transformer, the relation of connection between the upper class-D amplifier and the lower class-D amplifier, and the characteristics of the output transformer are different from those in the second configuration example. Thus, the configurations of the upper class-D amplifier 1H and the regeneration circuit 6 will not be described below, and only the lower class-D amplifier 1L having a different configuration will be described.

(Configuration of Lower Class-D Amplifier 1L)

The lower class-D amplifier 1L has a full bridge circuit formed by a leading leg 20La consisting of a high-side switching element Q1b and a low-side switching element Q2b, which are connected in series, and a lagging leg 20Lb consisting of a high-side switching element Q3b and a low-side switching element Q4b, which are connected in series. The high-side switching element Q1b and the low-side switching element Q2b, which form the leading leg 20La, have their one ends connected respectively on a high-voltage side and a low-voltage side of a DC power supply, not shown. The other ends of the high-side switching element Q1b and the low-side switching element Q2b are connected to each other, and a connection point between these ends is one of output terminals of the lower class-D amplifier 1L and is connected to one end of an output transformer 2L on its primary side.

The high-side switching element Q3b and the low-side switching element Q4b, which form the lagging leg 20Lb, have their one ends connected respectively on the high-voltage side and the low-voltage side of the DC power supply, not shown. The switching element Q3b and the switching element Q4b have a connection point between them that is one of output terminals of the lower class-D amplifier 1L and connected to one end of the output transformer 2L on its primary side.

In the lower class-D amplifier 1L in the second configuration example, the midpoint of the leading leg 20La is connected to the low-voltage part on the primary side of the output transformer 2L, and the midpoint of the lagging leg 20Lb is connected to the high-voltage part on the primary side of the output transformer 2L. By contrast, in the lower class-D amplifier 1L in the third configuration example, a midpoint of the leading leg 20La is connected to a high-voltage part on the primary side of the output transformer 2L, and a midpoint of the lagging leg 20Lb is connected to a low-voltage part on the primary side of the output transformer 2L. Furthermore, the directions of voltages on the primary side and a secondary side of the output transformer 2L in the third configuration example are opposite to those on the primary side and the secondary side of the output transformer 2L in the second configuration example.

In the third configuration example, the relation of connection between the lower class-D amplifier 1L and the output transformer 2L is changed, and thus the direction of an output voltage Vamp2 in this configuration is opposite to the direction in the second configuration example. The direction of the output characteristics of the output transformer 2L in the third configuration example is made to be opposite to the direction of the output characteristics of the output transformer 2L in the second configuration example, so as to make the direction of the output voltage in the output transformer 2L to be the same as that in the second configuration example.

A midpoint of the lagging leg 20Lb and the output transformer 2L as well as both of the other ends in the leading leg 20La are connected to one another, and between their connection points and the output transformer 2L, there are leakage inductances of the output transformer 2L.

In the third configuration example, as with the case of the second configuration example, a current flows on the primary sides of a regeneration transformer 6αb and a regeneration transformer 6βb based on a voltage difference between the upper class-D amplifier 1H and the lower class-D amplifier 1L. The regeneration transformer 6αb and the regeneration transformer 6βb send AC voltages on their secondary sides to a regeneration/rectification circuit 6αa and a regeneration/rectification circuit 6βa, respectively.

The regeneration transformers 6αb, 6βb have their turns ratio designed such that an equivalent circuit satisfies a condition of zero-voltage switching (ZVS) when a gate phase difference θ is zero degree.

Operation Example of Third Configuration Example

The upper class-D amplifier 1H in the third configuration example has the same operation aspect as that of the upper class-D amplifier 1H in the second configuration example. As to the relation of connection with the output transformer 2L, the lower class-D amplifier 1L in the third configuration example has the relation between a leading leg and a lagging leg opposite to that in the lower class-D amplifier 1L in the second configuration example. Due to the difference in the relations of connection, the operation aspect in the third configuration example and the operation aspect in the second configuration example have the opposite potential relations at each point in each zone.

In the third configuration example, the relation of connection between the lower class-D amplifier 1L and the regeneration transformers 6αb, 6βb is reversed to reverse the relation of connection between the upper class-D amplifier and the lower class-D amplifier and to reverse the voltage characteristics between primary coil and a secondary coil in the output transformer 2L. This can produce the same output as that in the operation example of the second configuration example.

<Another Configuration of Regeneration Circuit>

Another configuration of the regeneration circuit will be described by referring to FIG. 34. This figure shows a variation of the regeneration/rectification circuit 6a included in the regeneration circuit 6. FIGS. 34(a) and 34(b) show configuration examples in which diode bridge circuits 6a11 are full-wave rectifying circuits, and FIGS. 34(c) and 34(d) show configuration examples in which diode bridge circuits 6a12 are half-wave rectifying circuits.

In the configuration example shown in FIG. 34(a), a regeneration/rectification circuit 6a includes a diode bridge circuit 6α11 and an LC smoothing circuit 6a21. The diode bridge circuit 6α11 is a full-wave rectifying circuit having four diodes in the form of a full bridge. The LC smoothing circuit 6a21 includes a capacitor C that is connected in parallel to an inductance L that is connected to a DC power supply in series.

In the configuration example shown in FIG. 34(b), the regeneration/rectification circuit 6a includes the diode bridge circuit 6α11 and an LC smoothing circuit 6a22. The diode bridge circuit 6a11 is a full-wave rectifying circuit having four diodes in the form of a full bridge, as with the configuration example in FIG. 34(a). The LC smoothing circuit 6a22 includes an inductance L that is connected in series to a capacitor C that is connected to the DC power supply in parallel.

In the configuration example shown in FIG. 34(c), the regeneration/rectification circuit 6a includes a diode bridge circuit 6a12 and the LC smoothing circuit 6a21. The diode bridge circuit 6a12 is a half-wave rectifying circuit having two diodes. The LC smoothing circuit 6a21 has the same configuration as that in the configuration example shown in FIG. 34(a) and thus includes the capacitor C that is connected in parallel to the inductance L that is connected to the DC power supply in series.

In the configuration example shown in FIG. 34(d), the regeneration/rectification circuit 6a includes the diode bridge circuit 6a12 and the LC smoothing circuit 6a22. The diode bridge circuit 6a12 is a half-wave rectifying circuit having two diodes. The LC smoothing circuit 6a22 has the same configuration as that in the configuration example shown in FIG. 34(b) and thus includes the inductance L that is connected in series to the capacitor C that is connected to the DC power supply in parallel.

<Another Configuration of Current-Auxiliary Circuit>

Another configuration of the current-auxiliary circuit will be described by referring to FIG. 35.

(Configuration with Resistance Circuit)

Figure 35:
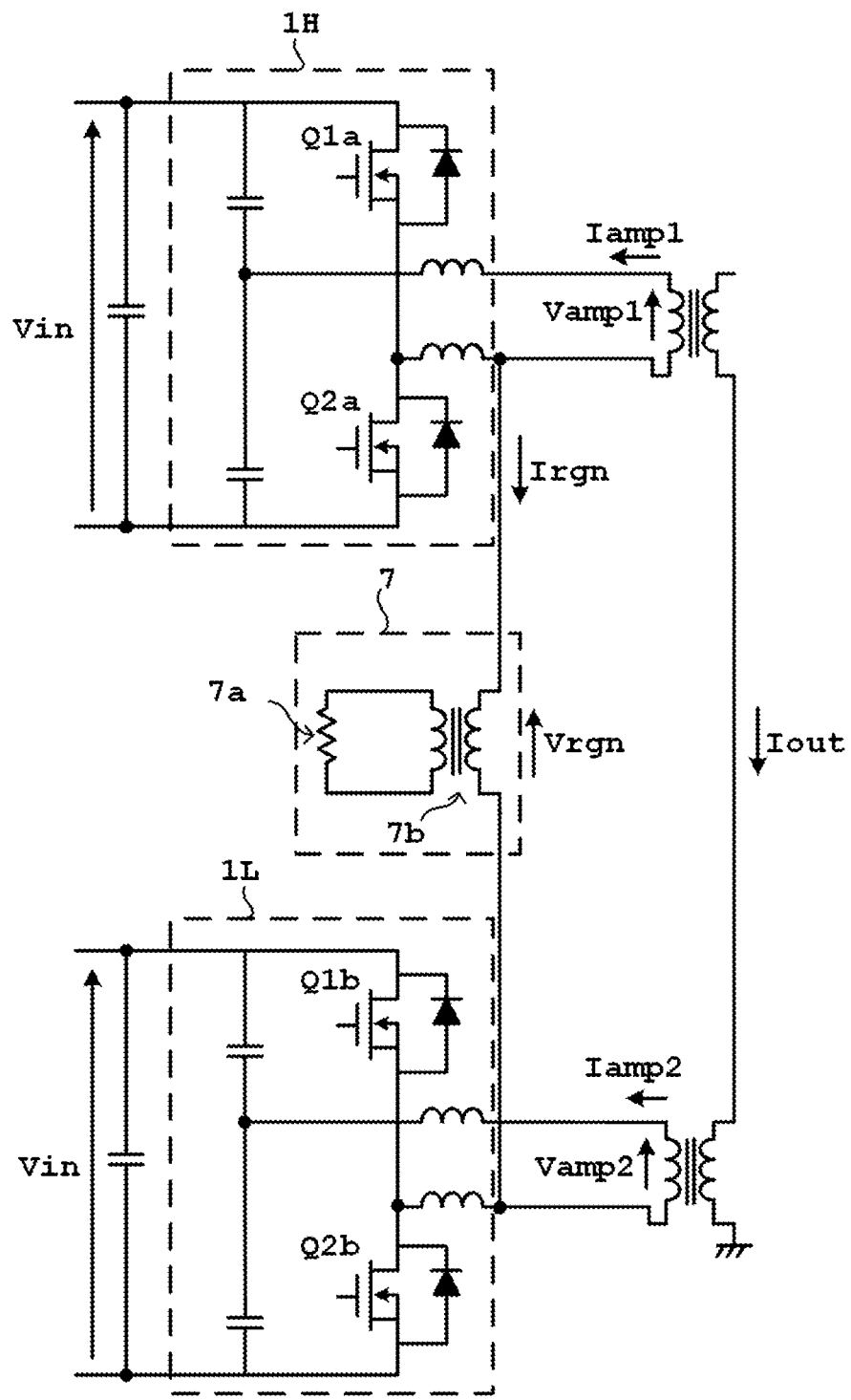
FIG. 35 illustrates another configuration example of the current-auxiliary circuit of the power conversion device according to the present invention.
Figure 36:
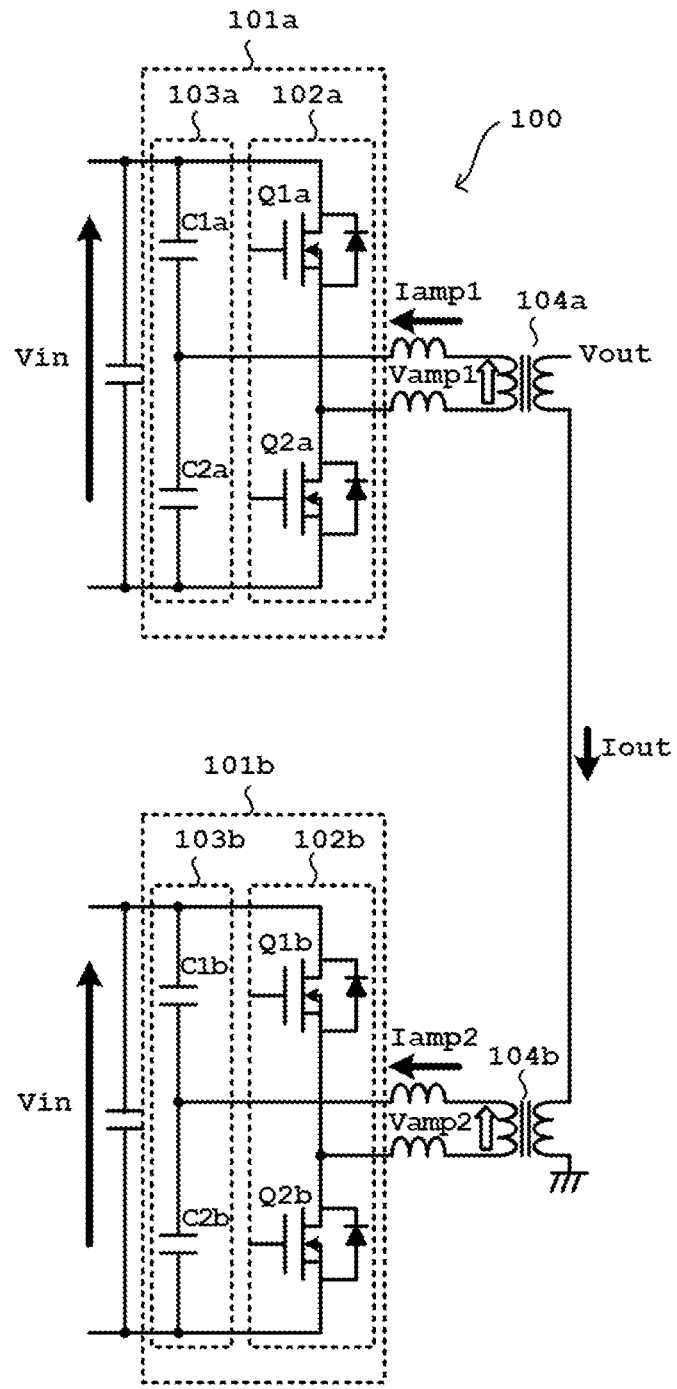
FIG. 36 illustrates an example of a circuit configuration that consists of a half bridge circuit of a power conversion device.
Figure 37:
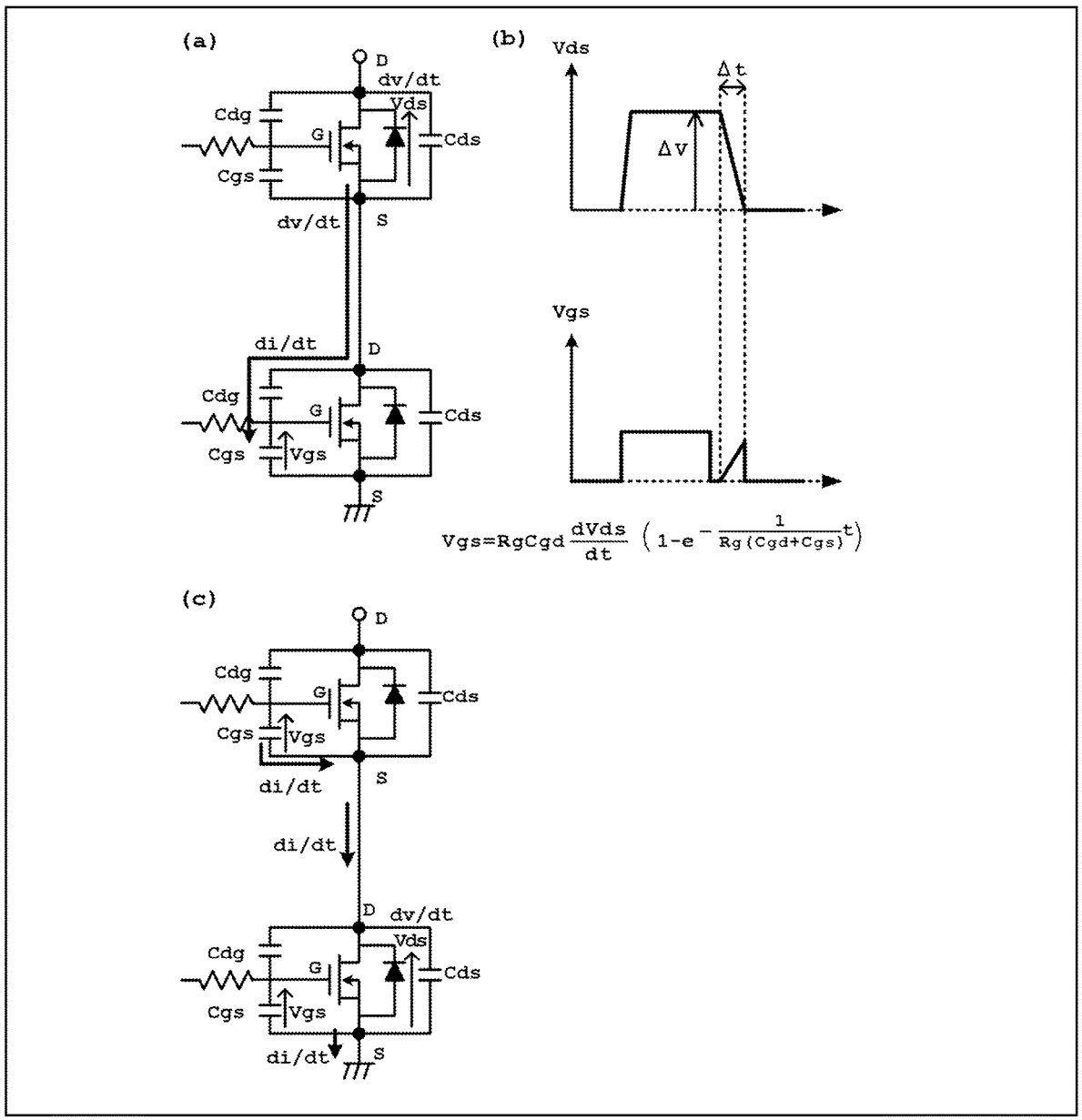
Figure 38:
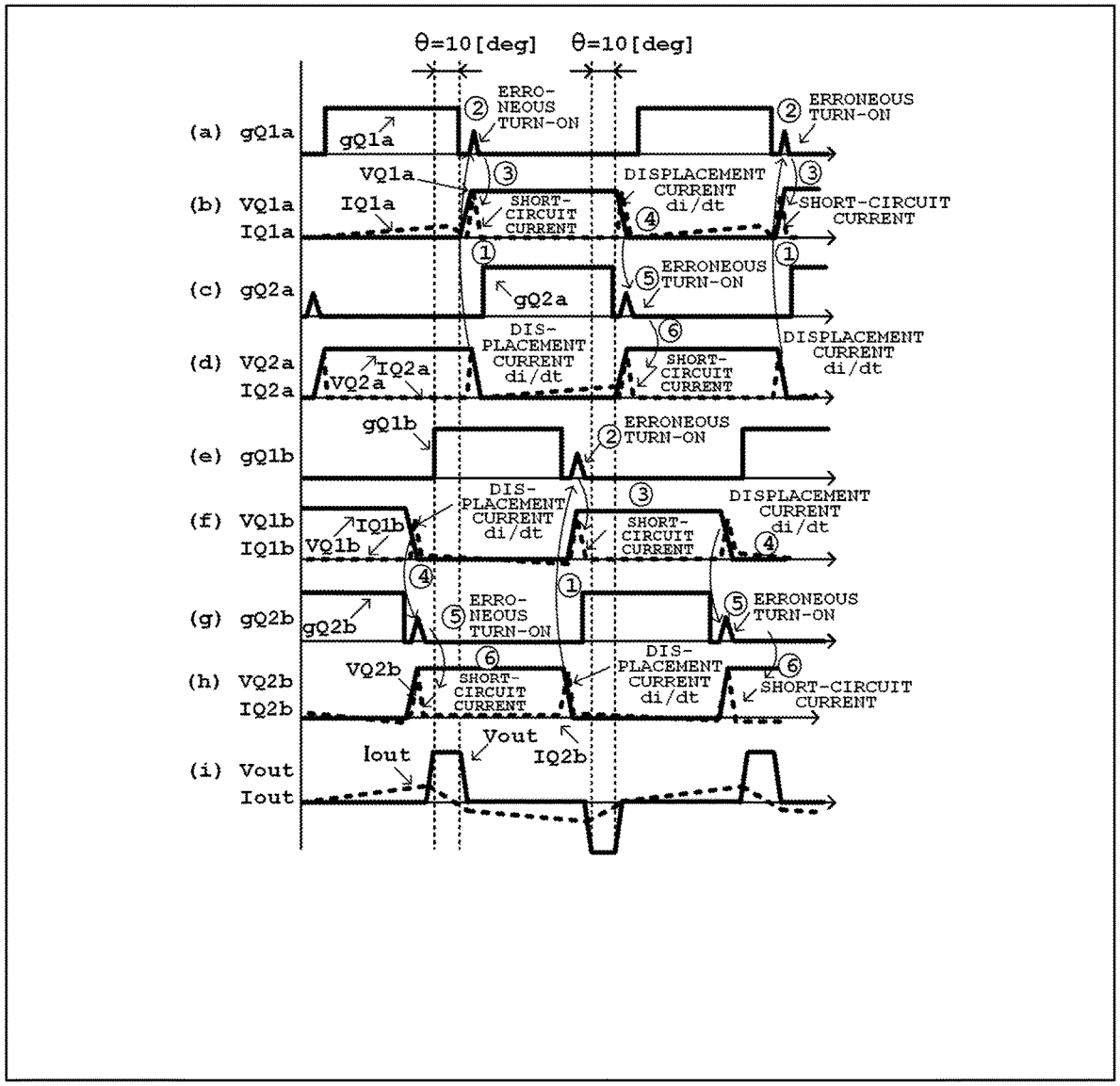
FIG. 38 is a waveform chart showing a waveform of a power conversion device 100 according to the circuit configuration in FIG. 36.

FIG. 35 shows a configuration example having a resistance circuit 7 as a current-auxiliary circuit. The resistance circuit 7 consists of a resistive element 7a and a distribution transformer 7b. The distribution transformer 7b is connected between the upper class-D amplifier 1H and the lower class-D amplifier 1L. When an input voltage Vrgn is generated on a primary side of the distribution transformer 7b due to a voltage difference between the upper class-D amplifier 1H and the lower class-D amplifier 1L, a voltage is generated on a secondary side of the distribution transformer 7b. The voltage on the secondary side of the distribution transformer 7b causes a current to flow to the resistive element 7a. The resistive element 7a discharges the current thus flowed in as heat.

The above embodiments are a few examples of the power conversion device of the present invention, and thus the present invention is not limited to these embodiments. Accordingly, the present invention can be modified in various ways based on the gist of the invention, which modifications are not excluded from the scope of the present invention.

INDUSTRIAL APPLICABILITY

The power conversion device of the present invention can be applied to a high-frequency power supply (RF generator) to be used for semiconductor manufacturing equipment, liquid crystal panel manufacturing equipment and others.

REFERENCE SIGNS LIST

1H Upper Class-D Amplifier
1L Lower Class-D Amplifier
2H, 2L Output Transformer
3 Control Circuit
4 Current-Auxiliary Circuit
5 DC Power Supply
6 Regeneration Circuit
6a Regeneration/Rectification Circuit
6a1 Diode Bridge Circuit
6a2 LC Smoothing Circuit
6b Regeneration Transformer
7 Resistance Circuit
7a Resistive Element
7b Distribution Transformer
10, 11, 12, 13 Power Conversion Device
10A, 10B, 10C, 10D Power Conversion Device
20, 20a, 20b Leg
20H, 20Ha, 20La Leading Leg
20L, 20Hb, 20Lb Lagging Leg
21H, 21L Capacitor Voltage Divider

The invention claimed is:

1. A power conversion device, comprising:
an upper class-D amplifier and a lower class-D amplifier;
a control circuit that performs phase shift control controlling a gate phase difference between gate signals for driving switching elements included in the upper class-D amplifier and the lower class-D amplifier; and
a current-auxiliary circuit that supplies auxiliary currents to the upper class-D amplifier and the lower class-D amplifier,
wherein the upper class-D amplifier and the lower class-D amplifier have their input terminals connected to a DC power supply in parallel,
the upper class-D amplifier and the lower class-D amplifier have their output terminals connected to each other respectively via output transformers, and
the current-auxiliary circuit is connected between the output terminal of the upper class-D amplifier and the output terminal of the lower class-D amplifier, so as to supply to the upper class-D amplifier and the lower class-D amplifier with currents based on a voltage difference between the output terminals of the class-D amplifiers as auxiliar currents; and
wherein the current-auxiliary circuit is a regeneration circuit for regenerating power of the auxiliary current as regeneration power,
the regeneration circuit comprising a regeneration transformer having its primary side connected between the upper class-D amplifier and the lower class-D amplifier, and a regeneration/rectification circuit connected to a secondary side of the regeneration transformer for rectifying an AC voltage on the secondary side to generate a regeneration voltage.

2. The power conversion device according to claim 1, wherein the regeneration/rectification circuit of the regeneration circuit comprises a diode bridge circuit connected to an output terminal of the regeneration transformer, and an LC smoothing circuit connected to a DC power supply part.

3. The power conversion device according to claim 1, wherein each of the upper class-D amplifier and the lower class-D amplifier comprises a bridge circuit having a half bridge formed by one leg formed by connecting a switching element on a high-voltage side and a switching element on a low-voltage side in series and a capacitor voltage divider consisting of two series-connected capacitors.

4. The power conversion device according to claim 1, wherein each of the upper class-D amplifier and the lower class-D amplifier comprises a bridge circuit having a full bridge formed by two legs, each of which consists of a switching element on a high-voltage side and a switching element on a low-voltage side connected in series to each other.

5. The power conversion device according to claim 1, wherein each of the upper class-D amplifier and the lower class-D amplifier comprises a bridge circuit having a half bridge formed by one leg formed by connecting a switching element on a high-voltage side and a switching element on a low-voltage side in series and a capacitor voltage divider consisting of two series-connected capacitors,
one of the legs of the bridge circuit of the upper class-D amplifier and the bridge circuit of the lower class-D amplifier is used as a leading leg, and the other leg is used as a lagging leg,
the regeneration circuit comprises one circuit configuration formed by the regeneration transformer and the regeneration/rectification circuit, and
with respect to the connection of the upper class-D amplifier and the lower class-D amplifier,
one end of the regeneration transformer is connected to a midpoint of the leg in the half bridge of the upper class-D amplifier, and
the other end of the regeneration transformer is connected to a midpoint of the leg in the half bridge of the lower class-D amplifier.

6. The power conversion device according to claim 1, wherein each of the upper class-D amplifier and the lower class-D amplifier comprises a bridge circuit having a half bridge formed by one leg formed by connecting a switching element on a high-voltage side and a switching element on a low-voltage side in series and a capacitor voltage divider consisting of two series-connected capacitors,
one of the legs of the bridge circuit of the upper class-D amplifier and the bridge circuit of the lower class-D amplifier is used as a leading leg, and the other leg is used as a lagging leg,
the regeneration circuit comprises two circuit configurations, formed by regeneration transformers and regeneration/rectification circuits, and
with respect to the connection of the upper class-D amplifier and the lower class-D amplifier,
one end of one of the regeneration transformers is connected to a midpoint of the capacitor voltage divider of the upper class-D amplifier, and the other end is connected to a midpoint of the capacitor voltage divider or a midpoint of the leg in the half bridge of the lower class-D amplifier, and
one end of the other of the regeneration transformers is connected to a midpoint of the leg in the half bridge of the upper class-D amplifier, and the other end is connected to a midpoint of the leg in the half bridge or a midpoint of the capacitor voltage divider of the lower class-D amplifier.

7. The power conversion device according to claim 1, wherein each of the upper class-D amplifier and the lower class-D amplifier comprises a bridge circuit having a full bridge formed by two legs, two legs being a leading leg and a lagging leg formed by series-connecting a switching element of an upper arm connected to a high-voltage side and a switching element of a lower arm connected to a low-voltage side,
the regeneration circuit comprises two circuit configurations of regeneration transformers and regeneration/ rectification circuits,
with respect to the connection of the upper class-D amplifier and the lower class-D amplifier,
one end of one of the regeneration transformers is connected to a midpoint of the leading leg in the full bridge circuit of the upper class-D amplifier, and the other end is connected to a midpoint of the lagging leg in the full bridge circuit of the lower class-D amplifier, and
one end of the other of the regeneration transformers is connected to a midpoint of the lagging leg in the full bridge circuit of the upper class-D amplifier, and the other end is connected to a midpoint of the leading leg in the full bridge circuit of the lower class-D amplifier.

8. A power conversion device, comprising:
an upper class-D amplifier and a lower class-D amplifier;
a control circuit that performs phase shift control controlling a gate phase difference between gate signals for driving switching elements included in the upper class-D amplifier and the lower class-D amplifier; and
a current-auxiliary circuit that supplies auxiliary currents to the upper class-D amplifier and the lower class-D amplifier, wherein the upper class-D amplifier and the lower class-D amplifier have their input terminals connected to a DC power supply in parallel, the upper class-D amplifier and the lower class-D amplifier have their output terminals connected to each other respectively via output transformers, and the current-auxiliary circuit is connected between the output terminal of the upper class-D amplifier and the output terminal of the lower class-D amplifier, so as to supply to the upper class-D amplifier and the lower class-D amplifier with currents based on a voltage difference between the output terminals of the class-D amplifiers as auxiliar currents;

wherein the power conversion device further comprises:

even numbers of class-D amplifiers and thus has multiple sets of modules of pairs of class-D amplifiers, each pair consisting of one upper class-D amplifier and one lower class-D amplifier; and multiple current-auxiliary circuits of the same number as the number of the class-D amplifier modules, wherein to each module of each pair of the class-D amplifiers, one current-auxiliary circuit is connected between the upper class-D amplifier and the lower class-D amplifier, and multiple circuit configurations consisting of one module of a pair of class-D amplifiers and one current-auxiliary circuit are provided, the multiple circuit configurations having their output terminals connected in series or in parallel.

9. The power conversion device according to claim 8, comprising multiple sets of power conversion devices connected in series or in parallel, wherein the multiple sets of the power conversion devices are connected in parallel.

10. A power conversion device, comprising:

an upper class-D amplifier and a lower class-D amplifier;

a control circuit that performs phase shift control controlling a gate phase difference between gate signals for driving switching elements included in the upper class-D amplifier and the lower class-D amplifier; and a current-auxiliary circuit that supplies auxiliary currents to the upper class-D amplifier and the lower class-D amplifier, wherein the upper class-D amplifier and the lower class-D amplifier have their input terminals connected to a DC power supply in parallel, the upper class-D amplifier and the lower class-D amplifier have their output terminals connected to each other respectively via output transformers, and the current-auxiliary circuit is connected between the output terminal of the upper class-D amplifier and the output terminal of the lower class-D amplifier, so as to supply to the upper class-D amplifier and the lower class-D amplifier with currents based on a voltage difference between the output terminals of the class-D amplifiers as auxiliar currents;

wherein the power conversion device further comprises:

even numbers of class-D amplifiers and thus has multiple sets of modules of pairs of class-D amplifiers, each pair consisting of one upper class-D amplifier and one lower class-D amplifier; and a single current-auxiliary circuit, wherein to each module of each pair of class-D amplifiers, the single current-auxiliary circuit is connected between the upper class-D amplifier and the lower class-D amplifier, the sets of the modules of the pairs of the class-D amplifiers have their output terminals connected in series or in parallel.

\* \* \* \* \*